(12) United States Patent
Umemoto et al.

(10) Patent No.: US 7,045,877 B2
(45) Date of Patent: May 16, 2006

(54) SEMICONDUCTOR PROTECTION DEVICE

(75) Inventors: Yasunari Umemoto, Sayama (JP); Hideyuki Ono, Kokubunji (JP); Tomonori Tanoue, Machida (JP); Yasuo Ohsone, Chiyoda (JP); Isao Ohbu, Sagamihara (JP); Chushiro Kusano, Niiza (JP); Atsushi Kurokawa, Takasaki (JP); Masao Yamane, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 212 days.

(21) Appl. No.: 10/420,740

(22) Filed: Apr. 23, 2003

(65) Prior Publication Data

US 2004/0065900 A1 Apr. 8, 2004

(30) Foreign Application Priority Data

May 31, 2002 (JP) ............................. 2002-160432

(51) Int. Cl.
*H01L 31/072* (2006.01)

(52) U.S. Cl. ...................... 257/567; 257/567; 257/568; 257/200

(58) Field of Classification Search ................ 257/567, 257/568, 569, 570, 571, 356, 200; 361/103
See application file for complete search history.

(56) References Cited

U.S. PATENT DOCUMENTS 4,236,120 A * 11/1980 White .................... 330/296
4,501,979 A * 2/1985 Null et al. ............... 330/200
4,860,154 A * 8/1989 Fazlollahi ................ 361/101
5,708,549 A * 1/1998 Croft ....................... 361/56
6,426,855 B1 * 7/2002 Lee et al. .................. 361/56
6,469,353 B1 * 10/2002 Amerasekera et al. ...... 257/356
2005/0122644 A1 * 6/2005 Ma et al. ................... 361/56

FOREIGN PATENT DOCUMENTS

| JP | 2000-315693 | 11/2000 |
|----|-------------|---------|
| JP | 2001-44214 | 2/2001 |
| WO | WO 01/18865 | 3/2001 |

OTHER PUBLICATIONS

K. Joshin et al., "Harmonic Feedback Circuit Effects on Intermodulation Products and Adjacent Channel Leakage Power in HBT Power Amplifier for 1.95 GHz Wide-Band CDMA Cellular Phones", IEICE Trans. Electron., vol. E82-C, No. 5, May 1999, pp. 725-729.

* cited by examiner

*Primary Examiner*—David Nelms
*Assistant Examiner*—Thinh T Nguyen
(74) *Attorney, Agent, or Firm*—Miles & Stockbridge PC

(57) ABSTRACT

The invention is directed to improve resistance to destruction of a semiconductor device. A protection circuit having a plurality of bipolar transistors which are Darlington connected between outputs (collector and emitter) of an amplification circuit of a high output is electrically connected in parallel with the amplification circuit. The amplification circuit has a plurality of unit HBTs (Heterojunction Bipolar Transistors) which are connected in parallel with each other. The protection circuit has a two-stage configuration including a first group of a protection circuit having a plurality of bipolar transistors Q1 to Q5 and a second group of a protection circuit having a plurality of bipolar transistors.

18 Claims, 32 Drawing Sheets

1b, 1b1, 1b2: PROTECTION CIRCUITS
3: AMPLIFICATION CIRCUIT (SEMICONDUCTOR CIRCUIT)
Q1 TO Q10: BIPOLAR TRANSISTORS
QH1 TO QHn: UNIT HETEROJUNCTION BIPOLAR TRANSISTORS 1b, 1b1, 1b2: PROTECTION CIRCUITS
3: AMPLIFICATION CIRCUIT (SEMICONDUCTOR CIRCUIT)
Q1 TO Q10: BIPOLAR TRANSISTORS
QH1 TO QHn: UNIT HETEROJUNCTION BIPOLAR TRANSISTORS

SEMICONDUCTOR PROTECTION DEVICE

BACKGROUND OF THE INVENTION

The present invention relates to a semiconductor device and a technique for manufacturing the same and, more particularly, to a technique effectively applied to a semiconductor device having a heterojunction bipolar transistor (HBT) and a method of manufacturing the same.

An HBT has excellent characteristics such that, for example, it can operates with a single power source and at high efficiency as a high output device used for a high output amplifier. The HBT is therefore being actively developed and formed as a product for a wireless communication device such as a portable telephone. For example, PCT/International Publication No. WO 01/18865 by the inventors herein and the others discloses an HBT having a structure in which a protection circuit constructed by a plurality of diodes is electrically connected to an output of the HBT. Japanese Unexamined Patent Publication No. 2001-44214 discloses a structure in which all of HBT cell lines neighboring each other are disposed so as to be deviated from each other in order to make heat dissipation of a plurality of HBTs uniform. Japanese Unexamined Patent Publication No. 2000-315693 discloses a structure in which the interval between HBT cell lines in the center of a layout and that in the periphery are made different from each other to make heat dissipation of HBTs uniform. For example, an HBT amplifier for a wide-band CDMA (W-CDMA) mobile communication device is disclosed by K. Joshin et al., "Harmonic Feedback Circuit Effects on Intermodulation Products and Adjacent Channel Leakage Power in HBT Power Amplifier for 1.95 GHz Wide-Band CDMA Cellular Phones", IEICE TRANS. ELECTRON., VOL. E82-C, No. 5, pp 725–729, 1999.

SUMMARY OF THE INVENTION

The inventors herein found that, although it is effective to electrically connect a protection circuit for clamping voltage to an output (that is, the collector side) of an amplifier constructed by HBTs to avoid deterioration and destruction of an HBT due to load fluctuation, when the protection circuit is simply attached, problems occur such that the chip area is enlarged, the cost of a semiconductor device increases, and a sufficient effect of the protection circuit cannot be obtained. For example, in the technique in which a protection circuit is constructed by a plurality of diodes, the areas of the plurality of diodes have to be almost equalized so that a current of almost the same amount can be flow to the diodes. The proportion of the area occupied by the protection circuit in the whole semiconductor chip increases and a problem arise such that the cost of the semiconductor device increases. Since parasitic resistance of each diode is added up by the number of the diodes which are connected in series, the series parasitic resistance of the whole protection circuit increases, and current which can flow to the protection circuit is regulated by the parasitic resistance. As a result, it causes a problem such that the effect of the protection circuit is lost.

In the case of using a compound semiconductor such as gallium arsenide as a material of a substrate of an HBT, since heat conductivity of gallium arsenide of the substrate is about ⅓ of that of silicon (Si) or the like and power density is high, it is a very important subject how to decrease heat resistance. Generally, the thickness of a substrate is reduced or a pitch of neighboring HBTs is decreased. However, when the substrate is thinned, mechanical strength cannot be maintained and a problem of breakage of the substrate arises. When the pitch of neighboring HBTs is decreased, a problem of increase in the chip size occurs.

An object of the invention is to provide a technique capable of improving destruction tolerance of a semiconductor device.

Another object of the invention is to provide a technique capable of reducing heat resistance of a semiconductor device.

The above and other objects and novel features of the invention will become apparent from the description of the specification and appended drawings.

An outline of representative inventions in the inventions disclosed in the application will be briefly described as follows.

According to an invention, a plurality of transistors which are Darlington connected are connected to an output terminal of a semiconductor circuit.

According to another invention, a center position of a transistor cell line as a part of a plurality of transistor cell lines is deviated from a center position of another transistor cell line in the plurality of transistor cell lines.

There is provided a semiconductor device, wherein a semiconductor chip includes a device region in which a plurality of first regions each having a plurality of transistors disposed in a first direction are arranged in a second direction crossing the first direction, a center position of a predetermined first region in the first regions is deviated from a center position of another first region along the first direction, and a protection circuit is disposed in a free region formed in the device region created by the deviation.

In the semiconductor device, the protection circuit is disposed on an outer peripheral end of the semiconductor chip.

In the semiconductor device, the protection circuit has a plurality of diodes which are connected in series.

In the semiconductor device, the protection circuit has a plurality of bipolar transistors which are Darlington connected.

There is provided a semiconductor device, wherein a plurality of first regions each having a plurality of transistors disposed in a first direction are arranged in a second direction crossing the first direction, an amplification circuit constructed by connecting the plurality of bipolar transistors in parallel is provided in a device region of a semiconductor chip, a center position of a predetermined first region in the first regions is deviated from a center position of another first region along the first direction, and a protection circuit is disposed in a free region formed by the deviation.

In the semiconductor device, the protection circuit is electrically connected between a collector and an emitter of the amplification circuit.

In the semiconductor device, the protection circuit is disposed close to an external terminal for a collector of the amplification circuit.

In the semiconductor device, the protection circuit is disposed on the outer periphery side of the semiconductor chip.

In the semiconductor device, a plurality of protection circuits are disposed and connected in parallel with one amplification circuit.

In the semiconductor device, a plurality of bonding wires are connected to an external terminal for the collector of the amplification circuit.

In the semiconductor device, a hole for connecting an emitter line of the amplification circuit with an electrode on the back face of the semiconductor chip is formed in each of the first regions so that holes are not disposed in a line in the second direction.

In the semiconductor device, holes for connecting an emitter line of the amplification circuit with an electrode on the back face of the semiconductor chip are formed at both ends in the first direction of each of the first regions.

In the semiconductor device, the protection circuit has a plurality of diodes which are connected in series.

In the semiconductor device, the protection circuit has a plurality of bipolar transistors which are Darlington connected.

In the semiconductor device, the protection circuit has at least one of a protection circuit connected in the forward direction and a protection circuit connected in the reverse direction.

In the semiconductor device, the bipolar transistor in the amplification circuit is a heterojunction bipolar transistor.

There is provided a semiconductor device, wherein a semiconductor chip includes a device region in which a plurality of first regions each having a plurality of bipolar transistors disposed in a first direction are arranged in a second direction crossing the first direction, and a hole connecting a main face with a back face of the semiconductor chip is formed in each of the first regions so that holes in the first regions adjacent to each other in the second direction are deviated from each other along the first direction.

In the semiconductor device, the holes are formed so as to be staggered in the second direction.

There is provided a semiconductor device, wherein a semiconductor chip includes a device region in which a plurality of first regions each having a plurality of bipolar transistors disposed along a first direction are arranged along a second direction crossing the first direction, two first regions disposed at both ends in the second direction are disposed so as to be deviated from a plurality of other first regions between the two first regions in the first direction, and the plurality of other first regions are disposed so that their center positions in the first direction coincide with each other in the second direction.

There is provided a semiconductor device, wherein a semiconductor chip includes a device region in which a plurality of first regions each having a plurality of bipolar transistors disposed in a first direction are arranged along a second direction crossing the first direction, and a center position of a predetermined first region out of the first regions is disposed so as to be deviated from a center position of another first region by an amount of at least one bipolar transistor in the first direction.

There is provided a semiconductor device, wherein a plurality of first regions each having a plurality of bipolar transistors disposed in a first direction are arranged in a second direction crossing the first direction, an amplification circuit constructed by connecting the plurality of bipolar transistors in parallel is provided in a device region of a semiconductor chip, a center position of a predetermined first region out of the first regions is disposed so as to be deviated from a center position of another first region along the first direction, a protection circuit having a plurality of bipolar transistors which are Darlington connected is disposed in a free region formed by the deviation, and the protection circuit is connected between a collector and an emitter of the amplification circuit.

There is provided a method of manufacturing a semiconductor device, comprising the steps of:

(a) sequentially depositing first, second, third, fourth, fifth, and sixth semiconductor layers on a semiconductor substrate;

(b) depositing a conductive film over the sixth semiconductor layer and patterning the resultant, thereby forming an emitter electrode;

(c) forming an emitter layer by etching the sixth and fifth semiconductor layers exposed from the emitter electrode;

(d) etching the fourth and third semiconductor layers while using the second semiconductor layer as an etching stopper, thereby forming a base layer and a collector layer;

(e) forming a base electrode over the base layer; and (f) forming a collector electrode connected to the first semiconductor layer.

In the method of manufacturing a semiconductor device, in the step (d), an anode layer of a diode for a protection circuit formed by the base layer is formed, and a cathode layer of a diode for a protection circuit formed by the collector layer is formed.

DETAILED DESCRIPTION OF THE PREFERRED EMBODIMENTS

Figure 1:
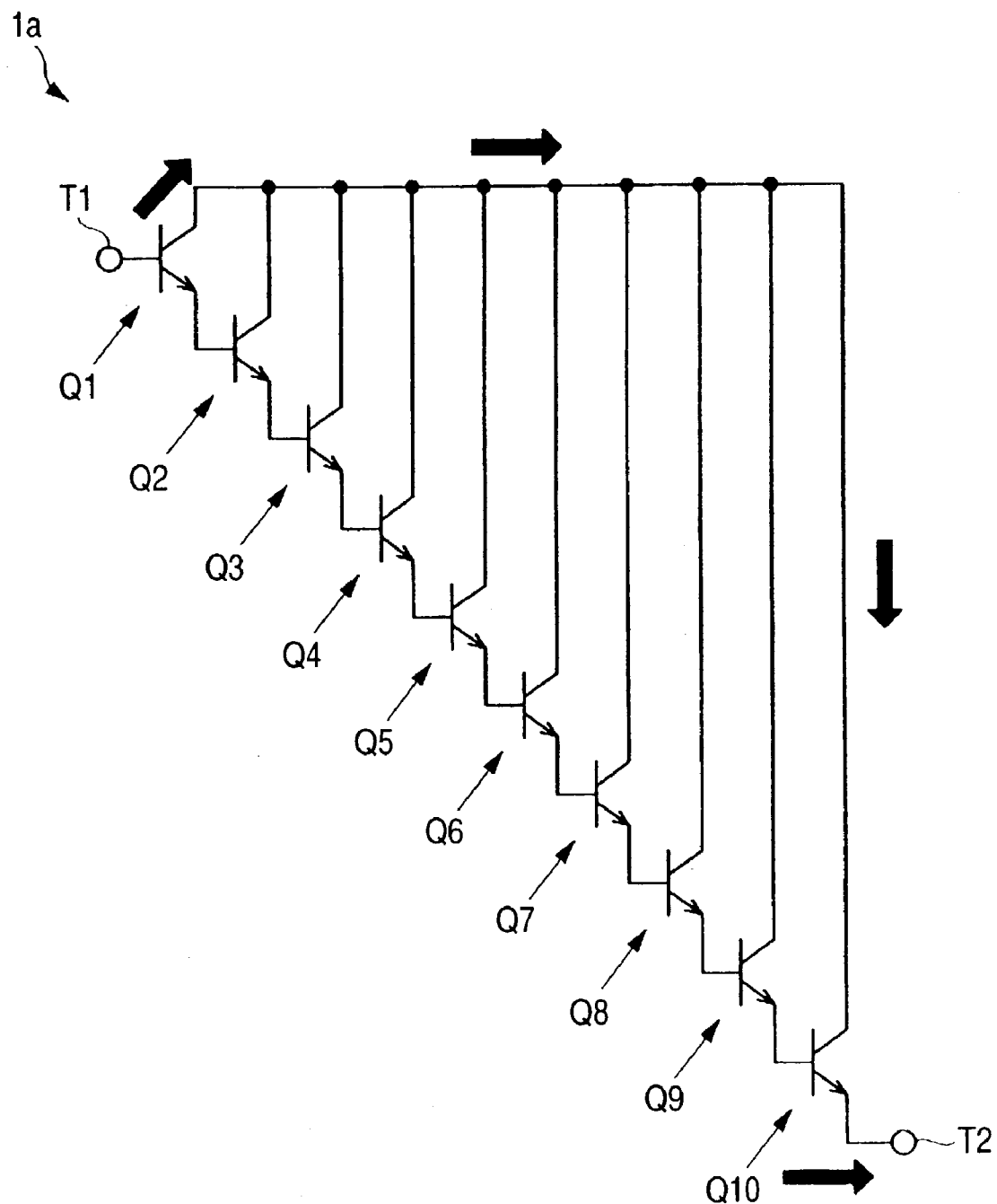
FIG. 1 is a circuit diagram showing an example of a circuit for protecting a semiconductor device as an embodiment of the invention.

In the following embodiments, a device will be divided into a plurality of sections for convenience and each of the sections will be described as necessary. Unless explicitly described otherwise, the sections are not unrelated to each other, one is related in description of a modification, the details, supplemental remarks and the like of a part or all of the other. In the following embodiments, in the case of referring to the number of components (including the number of pieces, numerical value, quantity, range, and the like), unless otherwise explicitly described or clearly limited to a specific number in theory, the invention is not limited to the specific number but a number larger than or smaller than the specified number may be also used. Further, in the following embodiments, obviously, the elements (including steps) are not always indispensable except for the case where it is explicitly described or the elements are clearly considered to be indispensable in theory. Similarly, in the following embodiments, in the case of referring to the shape, positional relation, and the like of an element, unless otherwise explicitly mentioned or clearly wrong in theory, the invention includes a shape, positional relation, and the like substantially approximate or similar to them. This rule will be similarly applied to the numerical value and range. In all of the drawings, components having the same function are designated by the same reference numeral and repetitive description will not be made.

First Embodiment

The inventors herein studied and, during development of a high-output amplifier for a radio communication device such as a vehicle telephone or portable telephone, found a phenomenon such that when a load impedance fluctuation test is conducted, an HBT (Heterojunction Bipolar Transistor) as a component of the high-output amplifier deteriorates or is destroyed. The phenomenon was analyzed and a result of the analysis that the HBT deteriorates or is destroyed since a high voltage is applied to the HBT temporarily. The load impedance fluctuation test is a test of measuring an influence on an internal circuit, which is exerted when the load of the amplifier is fluctuated.

In the first embodiment, therefore, by electrically connecting a protection circuit (protection device) for clamping voltage in a forward direction, a reverse direction, or in both of the forward and reverse directions to an output of the amplifier constructed by HBTs, that is, between the collector and emitter, an overvoltage is prevented from being applied to the collectors of the HBTs. With the configuration, deterioration and destruction of the HBT can be avoided. However, the inventors herein found another problem such that when the protection circuit is simply attached, the chip area is enlarged, the cost of a semiconductor device increases, and the protection circuit cannot produce an sufficient effect. In the first embodiment, therefore, the protection circuit (device) is further provided with Darlington-connected bipolar transistors. As compared with the case of constructing the protection circuit by a plurality of diodes, parasitic series resistance of the whole protection circuit can be largely decreased and a current which can flow to the protection circuit can be increased, so that the effect of the protection circuit can be improved. In the case of constructing the protection circuit by a plurality of bipolar transistors, the areas of all of the bipolar transistors do not have to be the same. Consequently, as compared with the case where the protection circuit is constructed by a plurality of diodes, the occupation area of the protection circuit can be reduced. Further, the collectors of the plurality of bipolar transistors constructing the protection circuit are electrically connected via the same semiconductor layer, that is, the collectors are commonly connected by the same semiconductor layer. In bipolar transistors constructing a general circuit, the bipolar transistors are insulated from each other via a device isolation region and are connected to each other via a line of an upper layer of a semiconductor substrate. However, the device isolation region and wires occupy a predetermined area. In contract, by commonly connecting the collectors of the plurality of bipolar transistors constructing the protection circuit via the same semiconductor layer, the device isolation region and the wiring region in the protection circuit region can be made unnecessary. As compared with the case of constructing the protection circuit by a plurality of diodes, the occupation area of the protection circuit can be further reduced. Therefore, according to the first embodiment, destruction tolerance of the amplifier in the load impedance fluctuation test can be improved. Since it does not cause increase in the chip size, the cost of the semiconductor device can be reduced.

Figure 2:
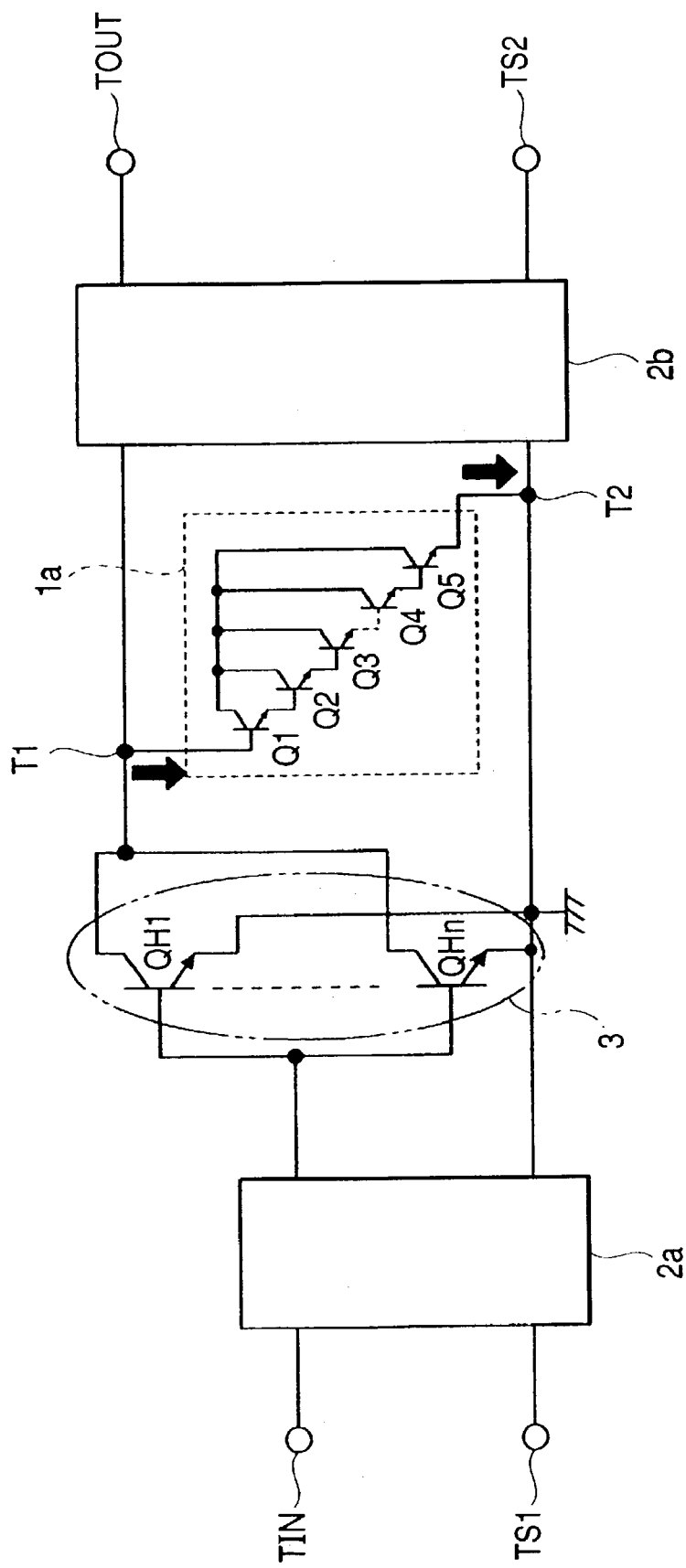
FIG. 2 is a circuit diagram showing an example of a connection state of the circuit illustrated in FIG. 1.

FIG. 1 shows an example of the protection circuit in the first embodiment. FIG. 2 shows an example of a connection state of a protection circuit 1a illustrated in FIG. 1.

The protection circuit 1a has, for example, ten npn type bipolar transistors Q1 to Q10 between terminals T1 and T2. The ten bipolar transistors Q1 to Q10 whose collectors are electrically connected to each other are Darlington connected. With such a configuration, current in the protection circuit 1a at the time of a load impedance fluctuation test flows from the base to the collector of the bipolar transistor Q1 in the first stage and flows, via the common wiring of the collectors, from the collector to the emitter of the bipolar transistor in the tenth stage. The number of the bipolar transistors Q1 to Q10 between the terminals T1 and T2 of the protection circuit 1a (between an output terminal (collector) of an amplification circuit 3 in FIG. 2 and a reference potential (emitter)), that is, the number of bipolar transistors which are Darlington connected is basically set in accordance with a voltage which is allowed to be applied (allowable voltage, that is, breakdown voltage of the protection circuit 3) across the output terminal (collector) of the amplification circuit 3 in FIG. 2 and the reference potential (emitter). More specifically, the number of bipolar transistors which are Darlington connected in the protection circuit 1a is determined according to an operation voltage Vpr of the protection circuit. The operation voltage Vpr of the protection circuit 1a satisfies the relation of V1<Vpr<V2. V1 denotes the maximum voltage value in normal operation of the amplification circuit 3, and V2 denotes the collector-emitter allowable voltage value. Specifically, the number of bipolar transistors which are Darlington connected is set so that when a voltage applied across the collector and emitter of the amplification circuit 3 is smaller than the maximum voltage value in the normal operation of the amplification circuit 3, no operation is performed. When the voltage is higher than the maximum voltage in the normal operation of the amplification circuit 3, an operation is performed to clamp the voltage across the collector and emitter of the amplification circuit 3 to a value smaller than the allowable voltage. However, there is a case such that by increasing the number of bipolar transistors which are Darlington connected, a high voltage is applied across the collector and emitter of the bipolar transistor in the final stage (in this case, the bipolar transistor Q10) of the plurality of bipolar transistors of the protection circuit 1a, and the bipolar transistor in the final stage may be broken down. The number of bipolar transistors is therefore set so as not to cause such a breakdown. In the first embodiment, the ten bipolar transistors Q1 to Q10 are illustrated as an example. When the allowable voltage of the amplification circuit 3 is lower, it is sufficient to set the number of bipolar transistors of the protection circuit 1a to an arbitrary smaller number such as seven stages or five stages. The base and collector of the bipolar transistor Q1 in the first stage to which the terminal T1 is connected is open in a normal state (state where there is no surge voltage and no load fluctuation). The terminal T1 is an input terminal of the protection circuit and the terminal T2 is an output terminal of the protection circuit.

As shown in FIG. 2, an input terminal TIN is electrically connected to an input (that is, the base terminal) of the amplification circuit (semiconductor circuit) 3 of high output via a matching circuit 2a for impedance matching. The amplification circuit 3 has a plurality of npn type unit HBTs QH1 to QHn which are connected in parallel. The collectors, bases, and emitters of the plurality of HBTs QH1 to QHn are electrically connected to one or a plurality of collector terminals, base terminals, and emitter terminals, respectively. An output (that is, collector terminal) of the amplification circuit 3 is electrically connected to an output terminal TOUT via a matching circuit 2b for impedance matching. The emitter terminal of the amplification circuit 3 is electrically connected to a reference potential (for example, 0V of the ground potential). The protection circuit 1a is connected in parallel between the collector terminal and the emitter terminal of the amplification circuit 3. Specifically, the terminal T1 of the protection circuit 1a is electrically connected to the collector terminal of the amplification circuit 3, and the terminal T2 of the protection circuit 1a is electrically connected to the emitter terminal of the amplification circuit 3. By connecting the protection circuit 1a as described above, in the load impedance test or the like, when a positive overvoltage (voltage higher than the maximum voltage in the normal operation of the amplification circuit 3) is applied to the collector (that is, across the output and reference potential) of the amplification circuit 3, a current flows to the protection circuit 1a, thereby enabling the voltage between the collector terminal and the emitter terminal of the amplification circuit 3 to be clamped to an almost constant value smaller than the allowable voltage. It enables deterioration or destruction of the amplification circuit 3 to be avoided. Therefore, the yield and reliability of a semiconductor device having the amplification circuit 3 can be improved. The terminals TS1 and TS2 are terminals for applying a reference potential (for example, 0V of the ground potential).

Figure 3:
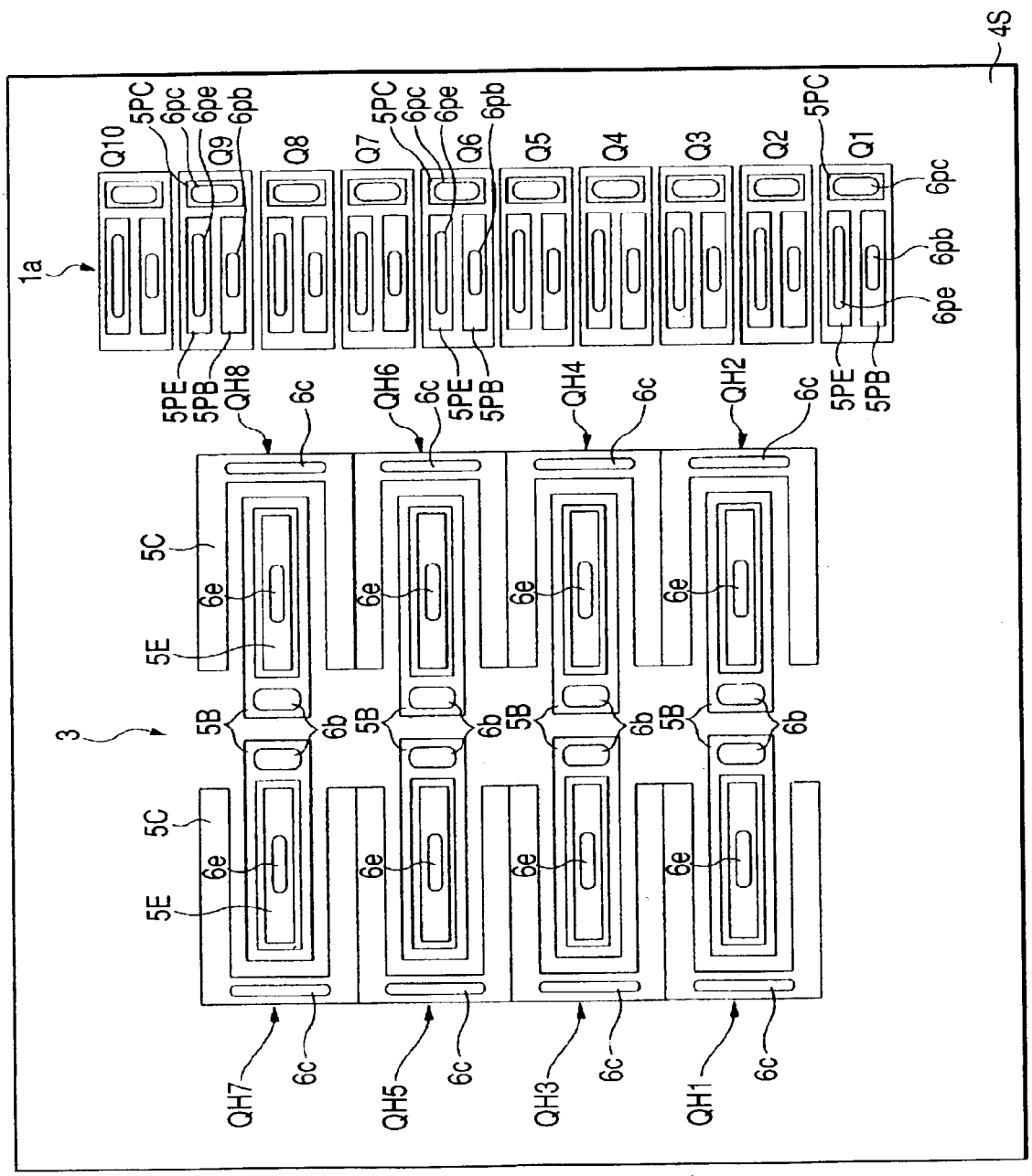
FIG. 3 is a plan view of a main part of a semiconductor substrate as an example of layout of a device including the semiconductor circuit of FIG. 2 and a circuit for protecting the semiconductor circuit.

FIG. 3 is a plan view of a main part of a semiconductor substrate (hereinbelow, simply called substrate) 4S showing an example of device layout of the amplification circuit 3 and the protection circuit 1a of FIG. 2. The substrate 4S is made of, as a main material, a compound semiconductor such as gallium arsenide (GaAs). The diagram shows the case where a group of, for example, eight unit HBTs QH1 to QH8 for the amplification circuit 3 (the left part of FIG. 3) and a group of, for example, ten bipolar transistors Q1 to Q10 (the right part of FIG. 3) for the protection circuit 1a are disposed so as to be adjacent to each other on the substrate 4S. The unit HBTs QH1 to QH8 for the amplification circuit 3 are regularly disposed with wide portions of their base electrodes 5B facing each other so that four unit HBTs are arranged in the vertical direction (Y direction) of FIG. 3, two unit HBTs are arranged in the lateral direction (X direction) of FIG. 3, the unit HBTs QH1 to QH8 adjacent to each other in the lateral direction of FIG. 3 are symmetrical in the lateral direction and the unit HBTs QH1 to QH8 adjacent to each other in the vertical direction of FIG. 3 are symmetrical in the vertical direction. Two each of the unit HBTs QH1 to QH8 disposed in the X direction of FIG. 3 are aligned without being deviated from each other and four each of the unit HBTs QH1 to QH8 disposed in the Y direction of FIG. 3 are aligned without being deviated from each other. The areas of the plurality of unit HBTs QH1 to QH8 (particularly, the areas of the emitter regions) are almost the same to make electric characteristics the same. Each of the unit HBTs QH1 to QH8 has an emitter electrode 5E, the base electrode 5B, and a collector electrode 5C. The emitter electrode 5E in the center is formed in an elongated rectangular shape in plan view extending in the X direction of FIG. 3. A round-cornered rectangle extending in the X direction of FIG. 3 in the center of the emitter electrode 5E denotes a contact hole 6e for connecting the emitter electrode 5E and an emitter line in an upper layer. The base electrode 5B is formed in a frame shape in plan view so as to surround the emitter electrode 5E. In the base electrode 5B, the center side of the group of unit HBTs QH1 to QH8 is formed wider than the other portion. A corner-rounded rectangle extending in the Y direction of FIG. 3 denotes a contact hole 6b for connecting the base electrode 5B and a base line in the upper layer. Further, the collector electrode 5C is formed in a U-letter shape so as to surround a part of the periphery of the base electrode 5B. In the collector electrode 5C, the corner-rounded rectangle disposed on the outer side of the group of unit HBTs QH1 to QH8 and extending in the Y direction of FIG. 3 denotes a contact hole 6c for connecting the collector electrode 5C and the base line in the upper layer. The emitter electrode 5E, base electrode 5B and collector electrode 5C are disposed so as to be insulated from each other.

On the other hand, the group of the bipolar transistors Q1 to Q10 for the protection circuit 1a are disposed in a state in which they are regularly arranged in the same orientation in a line in the Y direction of FIG. 3 without being deviated from each other so as to be adjacent to the group of the HBTs QH1 to QH8 for the amplification circuit 3. The bipolar transistors Q1 to Q10 for the protection circuit 1a are also constructed by HBTs similar to the HBTs QH1 to QH8 for the amplification circuit 3. However, the areas (particularly, the areas of the emitters) of the bipolar transistors Q1 to Q10 for the protection circuit 1a are smaller than those of the HBTs QH1 to QH8 for the amplification circuit 3. The case where the areas (particularly, the areas of the emitters) of the bipolar transistors Q1 to Q10 for the protection circuit 1a are almost the same to equalize the electric characteristics is illustrated. However, all of the areas of the bipolar transistors Q1 to Q10 are not necessarily the same. In this case, it is also possible to set the areas of the bipolar transistors Q1 and Q10 in the first and tenth stages to be the same in order to equalize the capacities of the bipolar transistors Q1 and Q10 and set the area of each of the other bipolar transistors Q2 to Q9 to be smaller than the area of each of the bipolar transistors Q1 and Q10. With the configuration, the occupation area of the whole protection circuit 1a can be reduced, so that reduction in the cost of a semiconductor device can be promoted. The case in which a collector layer and a sub collector layer of each of the bipolar transistors Q1 to Q10 are insulated from each other is illustrated. Each of the bipolar transistors Q1 to Q10 has an emitter electrode 5PE, a base electrode 5PB, and a collector electrode 5PC. The emitter electrode 5PE in the center is formed in an elongated rectangular shape in plan view extending in the X direction of FIG. 3. A round-cornered rectangle extending in the X direction of FIG. 3 in the center of the emitter electrode 5PE denotes a contact hole 6pe for connecting the emitter electrode 5PE and a line in the upper layer. The base electrode 5PB is formed in an elongated rectangle shape in plan view extending in the X direction of FIG. 3 and a long side of the base electrode 5PB is disposed so as to face a long side of the emitter electrode 5PE almost in parallel to each other. A corner-rounded rectangle extending in the X direction of FIG. 3 in the center of the base electrode 5PE denotes a contact hole 6pb for connecting the base electrode 5PB and a line in the upper layer. Further, the collector electrode 5PC is formed in a rectangular shape in plane view extending in the Y direction of FIG. 3 and is disposed so that a long side of the collector electrode 5PC faces short sides of the base electrode 5PB and emitter electrode 5PE in almost parallel to each other. A corner-rounded rectangle extending in the Y direction of FIG. 3 in the center of the collector electrode 5C denotes a contact hole 6pc for connecting the collector electrode 5PC and a line in the upper layer. The emitter electrode 5PE, base electrode 5PB, and collector electrode 5PC are disposed so as to be insulated from each other.

Figure 4:
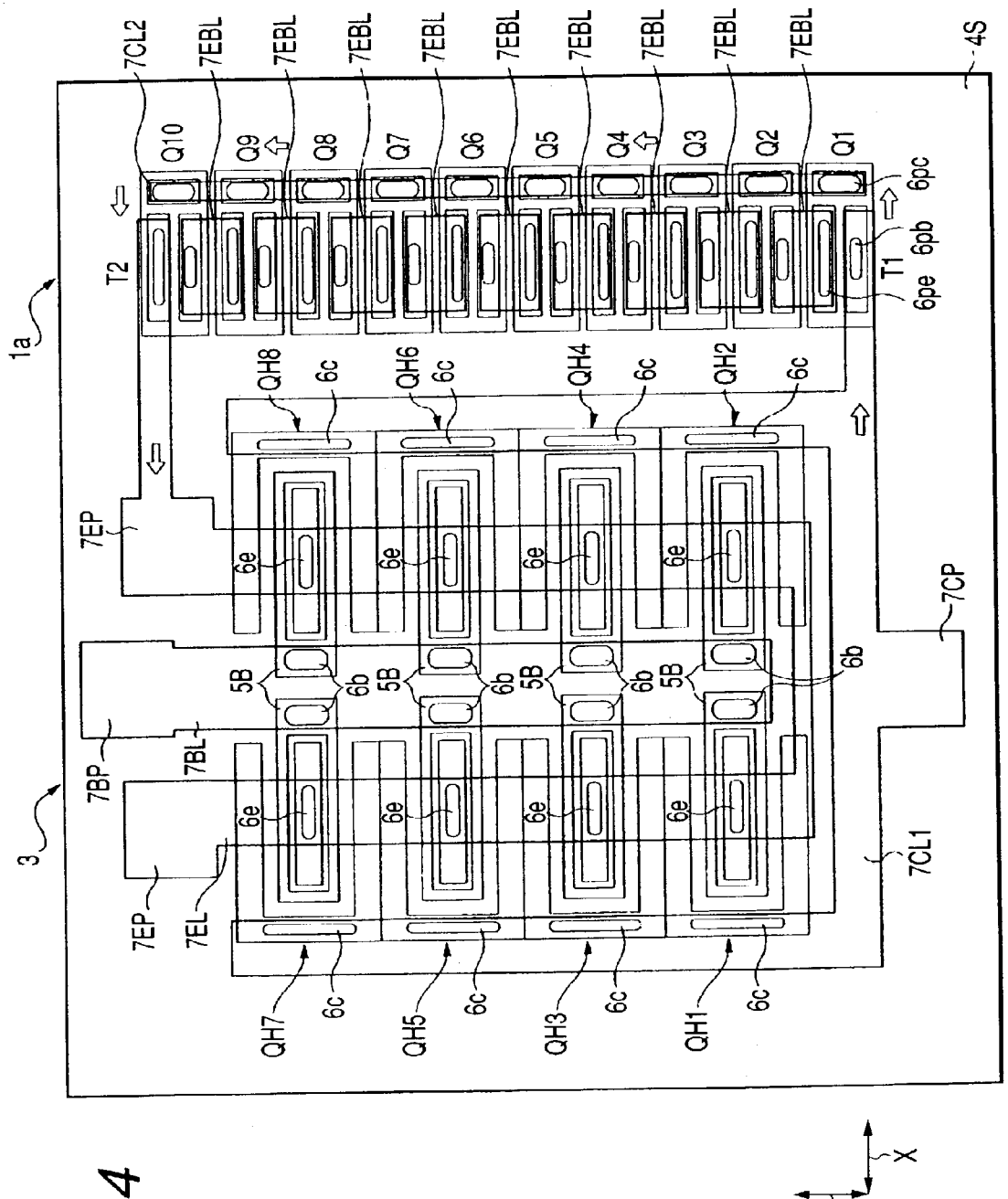
FIG. 4 is a plan view of a main part of a semiconductor substrate, showing as an example of wiring layout for constructing the semiconductor circuit of FIG. 2 and the circuit for protecting the semiconductor circuit so as to be superimposed on the layout of the device of FIG. 3.

FIG. 4 is a plan view showing a main part of the substrate 4S in which an example of a wiring layout for constructing the amplification circuit 3 and the protection circuit 1a in FIG. 2 is superimposed on the device layout of FIG. 3. All of the base electrodes 5B of the eight unit HBTs QH1 to QH8 constructing the amplification circuit 3 are electrically connected to a strip-shaped base line 7BL extending in the Y direction of FIG. 4 via the contact holes 6b. A base pad 7BP which is wider than the other part is formed at one end of the base line 7BL. All of the collector electrodes 5C of the eight unit HBTs QH1 to QH8 constructing the amplification circuit 3 are electrically connected to a collector line 7CL1 formed in an almost U-letter shape in plan view via the contact holes 6c. In an intermediate position in the collector line 7CL1, a collector pad (external terminal for collector) 7CP extending downward in FIG. 4 is formed. A part of the collector line 7CL1 extends to a position in which it is overlapped with the base electrode 5PB of the bipolar transistor Q1 for the protection circuit 1 positioned at the lowest end of FIG. 4 and is electrically connected to the base electrode 5PB via the contact hole 6pb. All of the emitter electrodes 5E of the eight unit HBTs QH1 to QH8 constructing the amplification circuit 3 are electrically connected to an emitter line 7EL formed in an almost U-letter shape in plan view via the contact holes 6e. Emitter pads (external terminals) 7EP wider than the other part are formed at both ends of the emitter line 7EL. A part of the emitter pad 7EP extends to a position in which it is overlapped with the emitter electrode 5PE of the bipolar transistor Q10 for the protection circuit 1 positioned at the uppermost end of FIG. 4 and is electrically connected with the emitter electrode 5PE via the contact hole 6pe.

On the other hand, in the bipolar transistors Q1 to Q10 for the protection circuit 1a, the emitter electrode 5PE and the base electrode 5PB which are adjacent to each other in the Y direction of FIG. 4 are electrically connected to a line 7EBL via the contact holes 6pe and 6pb. All of the collector electrodes 5PC of the bipolar transistors Q1 to Q10 for the protection circuit 1a are electrically connected to a collector line 7CL2 having a strip shape in plan view extending in the Y direction of FIG. 4 via the contact hole 6pc. That is, in the first embodiment, the collectors of the plurality of bipolar transistors Q1 to Q10 for the protection circuit 1a are electrically connected via the common collector line 7CL2. The collector line 7CL2 is made of a metal similar to that in each of the base line 7BL, base pad (external terminal) 7BP, emitter line 7EL, emitter pad 7EP, collector line 7CL1, collector pad 7CP, and line 7EBL, so that resistance between the collectors of the bipolar transistors Q1 and Q10 of both ends of the plurality of the bipolar transistors Q1 to Q10 for the protection circuit 1a can be decreased. The parasitic series resistance of the whole protection circuit 1a can be accordingly further decreased and a current which can flow to the protection circuit 1a can be increased, so that the effect of the protection circuit 1a can be further improved.

The arrows in FIG. 4 indicate the directions of currents flowing in the protection circuit 1a at the time of a load impedance fluctuation. The sectional structure of the unit HBT for the amplification circuit 3 and that of the bipolar transistor for the protection circuit 1 will be described in the following embodiments.

Second Embodiment

In a second embodiment, the protection circuit is divided into a plurality of blocks, and a group of a plurality of bipolar transistors which are Darlington connected is provided for each block.

Figure 5:
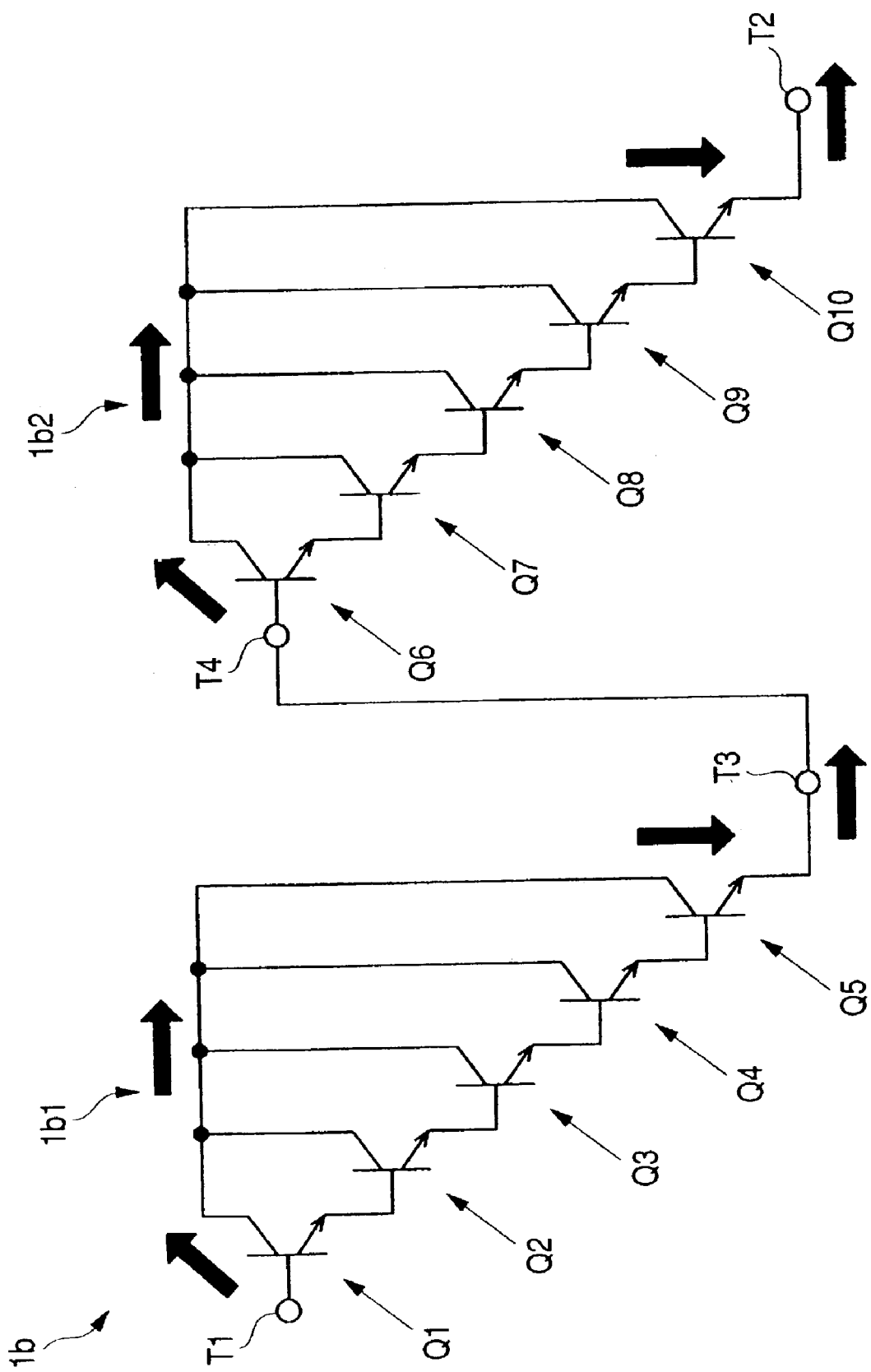
FIG. 5 is a circuit diagram showing an example of a circuit for protecting a semiconductor device as another embodiment of the invention.

FIG. 5 shows an example of a protection circuit 1b of the second embodiment. In the second embodiment as well, the protection circuit 1b has the ten bipolar transistors Q1 to Q10. In the second embodiment, the protection circuit 1b is divided into, for example, first and second blocks of two protection circuits 1b1 and 1b2. The two protection circuits 1b1 and 1b2 have the same number of bipolar transistors Q1 to Q10. The protection circuit 1b1 in the front stage has the five bipolar transistors Q1 to Q5 whose collectors are electrically connected to each other and which are Darlington connected. The emitter of the lowest bipolar transistor Q5 of the protection circuit 1b1 is electrically connected to a terminal T3. The terminal T3 is electrically connected to a terminal T4 via a line and is further electrically connected to the base of the highest bipolar transistor Q6 of the protection circuit 1b2 in the rear stage. The protection circuit 1b2 in the post stage also has the five bipolar transistors Q6 to Q10 whose collectors are electrically connected to each other and which are Darlington connected. The emitter of the lowest bipolar transistor Q10 of the protection circuit 1b2 is electrically connected to the terminal T2. With such a configuration, a current flowing in the protection circuit 1b at the time of the load impedance fluctuation test flows from the bases to the collectors of the bipolar transistors Q1 and Q6 in the first stages of the protection circuits 1b1 and 1b2 and flows via the collector common line from the collectors to the emitters of the bipolar transistors Q5 and Q10 in the fifth and tenth stages. The number of blocks between the terminals T1 and T2 and the number of bipolar transistors in each block (that is, the number of bipolar transistors which are Darlington connected) are set according to a voltage (allowable voltage) allowed to be applied across the output terminal of the amplification circuit and the reference potential (for example, 0V of the ground potential). Although the structure of the protection circuit 1b having the ten bipolar transistors Q1 to Q10 has been described above, the configuration of the protection circuit 1b is not limited to the above but can be variously changed. For example, the protection circuit 1b may have 8 or 12 bipolar transistors. Although the protection circuit 1b is divided into the two blocks each having a group of five bipolar transistors, the configuration of the protection circuit 1b is not limited to the above but can be variously modified. For example, two blocks each having a group of four bipolar transistors may be combined, two blocks consisting of a block having a group of six bipolar transistors and a block having a group of four bipolar transistors may be combined, or three blocks consisting of a block having a group of three bipolar transistors, a block having a group of three bipolar transistors, and a block having a group of four bipolar transistors may be combined.

Figure 6:
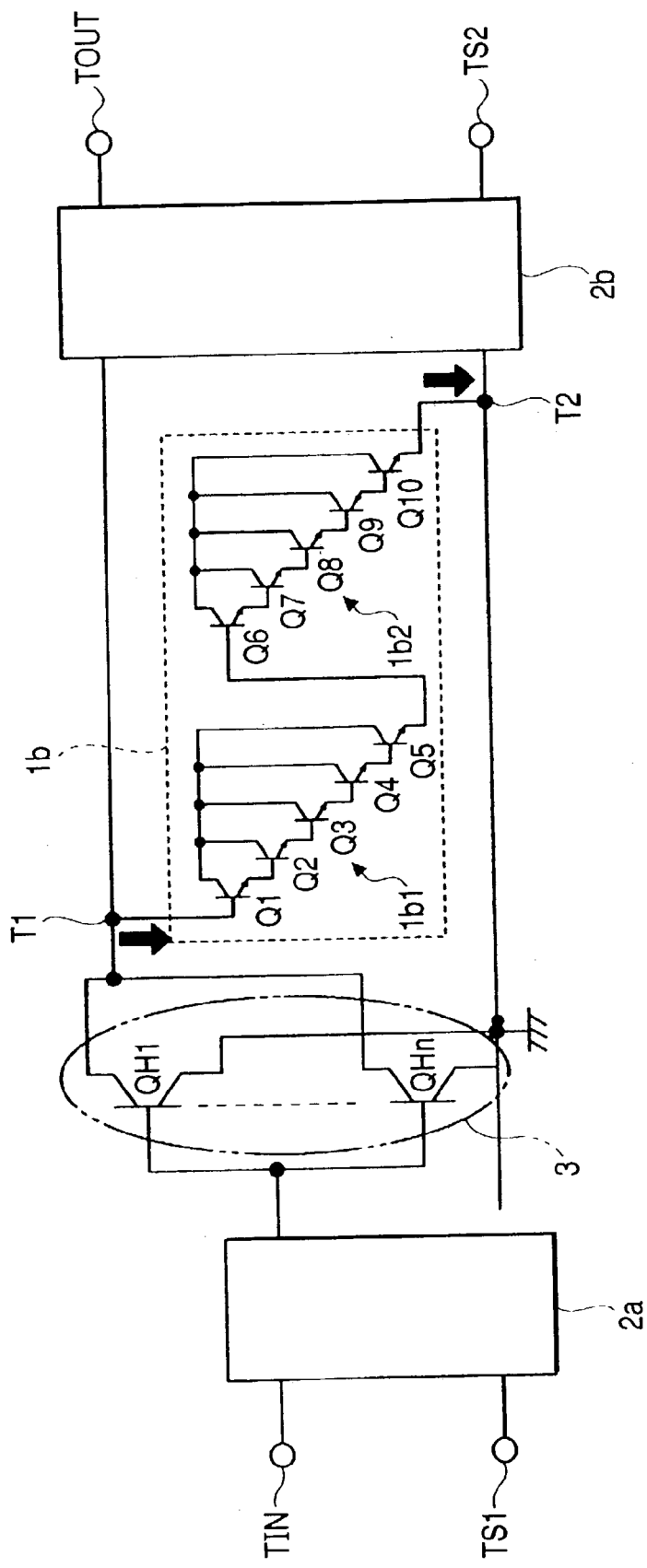
FIG. 6 is a circuit diagram showing an example of a connection state of the circuit illustrated in FIG. 5.

FIG. 6 shows an example of a connection state of the protection circuit 1b illustrated in FIG. 5. The protection circuit 1b is connected in parallel between the collector terminal and the emitter terminal of the amplification circuit 3. Specifically, the terminal T1 of the protection circuit 1b is electrically connected to the collector terminal of the amplification circuit 3, and the terminal T2 of the protection circuit 1b is electrically connected to the emitter terminal of the amplification circuit 3. In the second embodiment as well, in a manner similar to the first embodiment, when a positive overvoltage is applied to the collector of the amplification circuit 3 (between the output and the reference potential) in a load impedance test or the like, a current is made to flow to the protection circuit 1b, thereby enabling the voltage between the collector terminal and the emitter terminal of the amplification circuit 3 to be clamped to an almost constant value smaller than the allowable voltage. It enables deterioration or destruction of the amplification circuit 3 to be avoided. Therefore, the yield and reliability of a semiconductor device having the amplification circuit 3 can be improved.

According to the second embodiment, for example, when the invention is applied to a high-output amplification circuit of a portable telephone, the following effect different from the effect obtained by the first embodiment can be obtained. A voltage applied across the collector and, emitter of each of the bipolar transistors Q5 and Q10 in the final stages of the blocks can be decreased more than that in the first embodiment. Consequently, as the bipolar transistors Q5 and Q10 in the final stages, bipolar transistors of a lower collector-emitter allowable voltage (breakdown voltage) can be employed. Although higher-performance bipolar transistors (corresponding to the HBTs QH1 to QHn here) are used in the power stage of a high-output amplification circuit of a portable telephone or the like, to achieve higher performance, the dimensions have to be reduced, so that a lower breakdown voltage of the bipolar transistors is used. However, in the case of forming a bipolar transistor in the power stage and a bipolar transistor for a protection circuit on the same substrate, from the viewpoints of reduction in the manufacturing process, ease of manufacture, and the like, the bipolar transistor in the power stage and the bipolar transistor for the protection circuit have the same structure. Consequently, in the case of using a bipolar transistor of a high breakdown voltage as the bipolar transistor for the protection circuit, a bipolar transistor of a high breakdown voltage has to be used as the bipolar transistor in the power stage, so that designing of the breakdown voltage of the bipolar transistor in the power stage has to be largely changed. In contrast, according to the second embodiment, bipolar transistors of a low breakdown voltage can be used as the bipolar transistors Q5 and Q10 in the final stages of the protection circuit 1b. Therefore, without accompanying a large designing change in the breakdown voltage of the bipolar transistor in the power stage in the high-output amplification circuit of a portable telephone or the like and without deteriorating the performance of the bipolar transistor in the power stage, the bipolar transistor in the power stage and the bipolar transistor for the protection circuit having the same structure can be formed on the same substrate. Moreover, the clamp voltage between the collector and emitter of the amplification circuit 3 can be maintained to a proper value by the protection circuit 1b. In the protection circuit 1a of FIG. 1, when an ON-state voltage of each bipolar transistor is set as Vbe1, a voltage Vce1 applied across the collector and emitter of a bipolar transistor at the m-th stage is expressed as Vce1(m)=(m−1) Vbe1. The reason why the coefficient (m−1) is used is that there is a voltage drop of an amount of Vbe1 between the base and collector of the bipolar transistor in the protection circuit. Therefore, the maximum voltage Vce1max(10)=9Vbe is applied across the collector and emitter of the bipolar transistor in the tenth stage in FIG. 1. In the case of a gallium-arsenide-based HBT, Vbe1 is about 1.2V, so that Vce1max(10)=10.8V. In a portable telephone, when a collector current of the HBT in the high-output amplification circuit flows by a predetermined amount or larger, a phenomenon occurs such that the HBT is destroyed (what is called a snap back (snap back characteristic)). The phenomenon occurs when the voltage Vce between the collector and emitter of the HBT of the high-output amplification circuit becomes, for example, about 5 to 7V or larger. When the maximum voltage Vce1max(10) of the protection circuit exceeds the allowable voltage of, for example, about 5 to 7V, the HBT is destroyed. It is therefore necessary to design so that the voltage Vce1max(10) becomes lower than the allowable voltage. There may be a case that the amplification circuit 3 and the protection circuit 1a have to be formed on different substrates. In contrast, in the protection circuit 1b shown in FIGS. 5 and 6 of the second embodiment, the protection circuit 1b is divided into two blocks (protection circuits 1b1 and 1b2), so that the maximum voltage Vce2max(5) of each block can be suppressed to 4 Vbe=about 4.8V. The value is within 7V of the allowable voltage of the HBT which is normally used in a portable telephone. Therefore, according to the second embodiment, without changing the design of the HBT in the amplification circuit 3, deterioration and destruction in the HBT in the amplification circuit 3 can be avoided. The amplification circuit 3 and the protection circuit 1b can be easily formed on the same substrate 4S.

Figure 7:
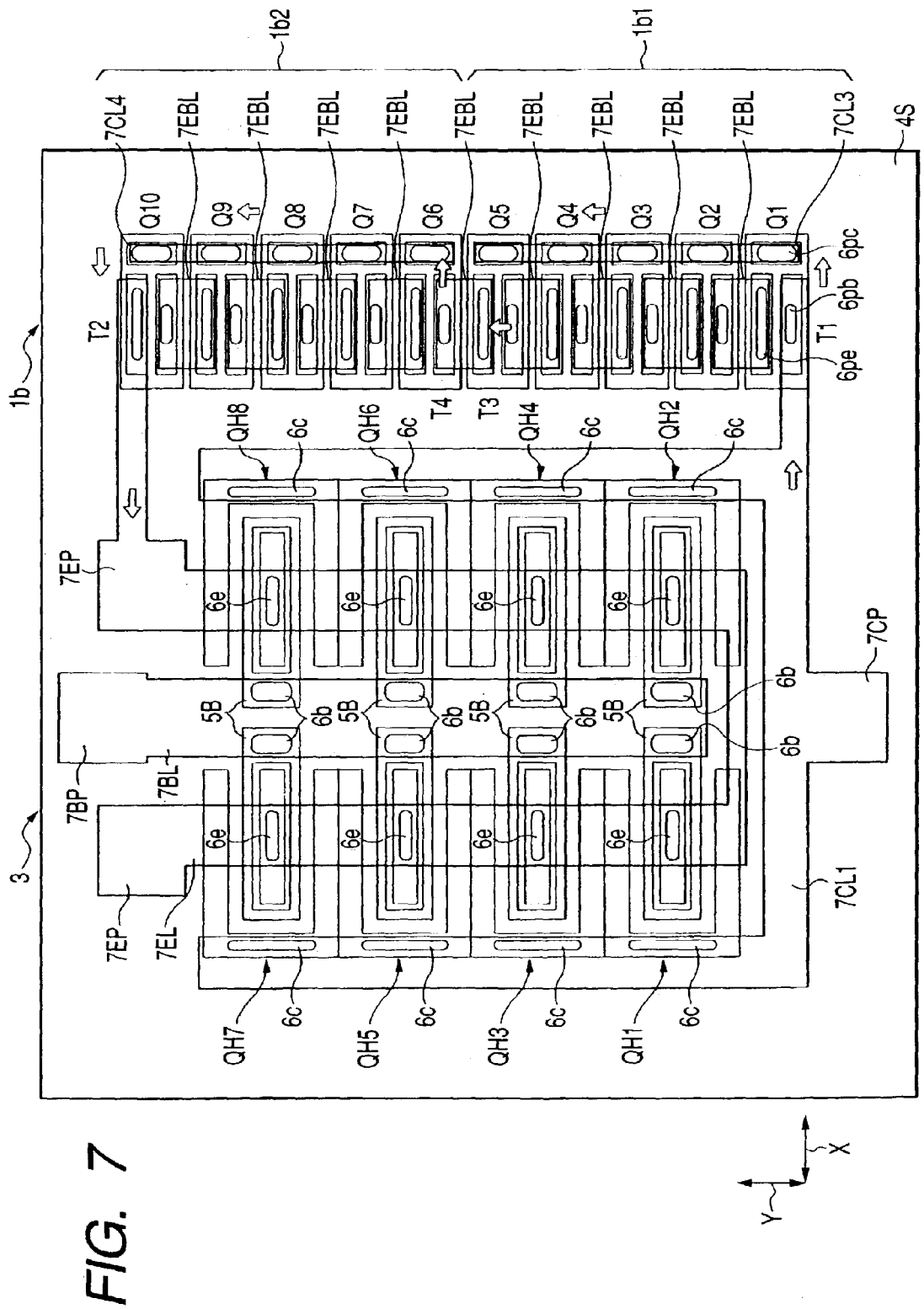
FIG. 7 is a plan view of a main part of a semiconductor substrate, showing as an example of wiring layout for constructing the semiconductor circuit of FIG. 6 and the circuit for protecting the semiconductor circuit so as to be superimposed on the device layout.

FIG. 7 is a plan view of a main part of the substrate 4S showing an example of wiring and device layout for constructing the amplification circuit 3 and protection circuit 1b of FIG. 6. The arrangement of the unit HBTs QH1 to QH8, base line 7BL, base pad 7BP, collector line 7CL1, collector pad 7CP, emitter line 7EL, and emitter pad 7EP of the amplification circuit 3 is similar to that described in FIGS. 3 and 4. The arrangement of the bipolar transistors Q1 to Q10 and the lines 7EBL of the protection circuit 1b is the same as that described in FIGS. 3 and 4. The difference is that a line for connecting the collectors of the bipolar transistors Q1 to Q10 for the protection circuit 1b is divided into the first and second blocks of the protection circuits 1b1 and 1b2. Specifically, the collector electrodes 5PC of the bipolar transistors Q1 to Q5 of the protection circuit 1b1 are electrically connected to each other via a collector line 7CL3 via the contact holes 6pc. The collector electrodes 5PC of the bipolar transistors Q6 to Q10 of the protection circuit 1b2 are electrically connected to each other via a collector line 7CL4 via the contact holes 6pc. Each of the collector lines 7CL3 and 7CL4 is made of a metal similar to that of the base line 7BL, base pad 7BP, emitter line 7EL, emitter pad 7EP, collector line 7CL1, collector pad 7CP, and line 7EBL and is formed in a strip pattern extending in the Y direction of FIG. 7. As described above, according to the second embodiment, the amplification circuit 3 and the protection circuit 1b can be formed on the same substrate 4S.

Although the case in which all of the areas (particularly, emitter areas) of the bipolar transistors Q1 to Q10 are almost equalized has been described, the invention is not limited to the case. In the case, the areas of the bipolar transistors Q1 and Q5 in the first and fifth stages are equalized in order to equalize the capacities of the bipolar transistors Q1 and Q5. The areas of the bipolar transistors Q6 and Q10 in the sixth and tenth stages are equalized so that the areas of the bipolar transistors Q6 and Q10 are equal to each other. The area of each of the other bipolar transistors Q2 to Q4 and Q7 to Q9 may be smaller than that of each of the bipolar transistors Q1, Q5, Q6, and Q10. With the configuration, the occupation area of the protection circuit 1 can be reduced, so that reduction in the cost of a semiconductor device can be promoted.

The arrows in FIG. 7 indicate the directions of currents flowing in the protection circuits 1b, 1b1, and 1b2 at the time of the load impedance fluctuation. The sectional structures of the unit HBTs for the amplification circuit 3 and the bipolar transistors for the protection circuit 1b in this case will be described in an embodiment which will be explained later.

Third Embodiment

Figure 8:
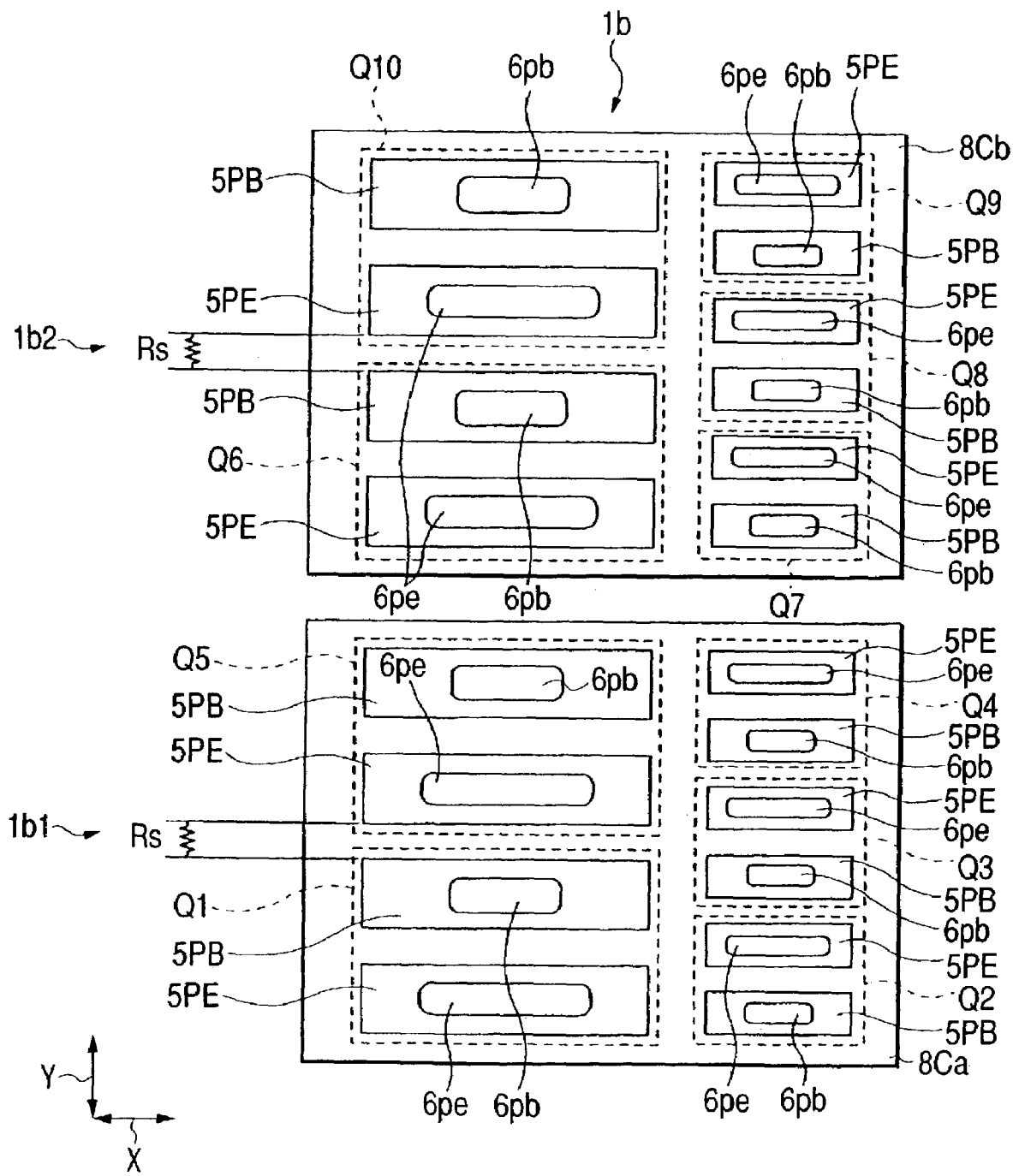
FIG. 8 is a plan view of a main part of a semiconductor substrate showing a modification of a circuit for protecting a semiconductor device as another embodiment of the invention.

In a third embodiment, a collector area of a plurality of bipolar transistors for the protection circuit is shared. FIG. 8 is a plan view of a main portion of the substrate 4S showing an example of the device layout of the protection circuit of the third embodiment. The device layout of the protection circuit 1b shown in FIGS. 5 and 6 of the second embodiment is illustrated here. The plurality of bipolar transistors Q1 to Q5 constructing the protection circuit 1b1 of the protection circuit 1b are formed in a common collector region (a collector layer and a sub collector layer) 8Ca. The plurality of bipolar transistors Q6 to Q10 constructing the protection circuit 1b2 of the second block in the protection circuit 1b are formed in a common collector region (a collector layer and a sub collector layer) 8Cb. The collector regions 8Ca and 8Cb are insulated from each other. With the layout, common connection of the collectors shown in FIGS. 5 and 6 is realized. Specifically, the collectors of the plurality of bipolar transistors Q1 to Q5 constructing the protection circuit 1b1 are not isolated from each other but are electrically connected to each other via the collector region 8Ca. The collectors of the plurality of bipolar transistors Q6 to Q10 constructing the protection circuit 1b2 are not isolated from each other but are electrically connected to each other via the collector region 8Cb. In such a manner, the bipolar transistors Q1 to Q10 are isolated from each other. As compared with the case of connecting the bipolar transistors Q1 to Q10 via metal lines in the first and second embodiments (refer to FIGS. 4 and 7), the whole occupation area of the protection circuit 1b can be reduced. Therefore, the cost of the semiconductor device can be reduced.

In the third embodiment, the area of the bipolar transistor in the intermediate stage out of the plurality of bipolar transistors for the protection circuit is made smaller than that of each of the bipolar transistors at the first and final stages. In this case, as shown in FIG. 8, the bipolar transistors Q2 to Q4 and the bipolar transistors Q7 to Q9 in the intermediate stages of the blocks constructing the protection circuit 1b are formed so that the area of each of the transistors becomes smaller than that of each of the bipolar transistors Q1, Q5, Q6, and Q10 at the first and final stages. The current flowing in the bipolar transistors Q2 to Q4 and Q7 to Q9 in the intermediate stages at the time of load impedance fluctuations is only $1/\beta$ at the maximum ($\beta$ denotes the current amplification factor of a transistor) in the currents flowing in the bipolar transistors Q1, Q5, Q6, and Q10 at the first and final stages. In theory, the areas of the emitter electrode 5PE and the base electrode 5PB in each of the bipolar transistors Q2 to Q4 and Q7 to Q9 in the intermediate stage can be set to $1/\beta$ of the areas of the emitter electrode 5PE and the base electrode 5PB, respectively, of each of the bipolar transistors Q1, Q5, Q6, and Q10 at the first and final stages. In reality, however, β is about 20 to 500 and microfabrication of the electrode pattern area is limited, so that it is impossible to set the current to 1/β. However, there is no problem to set at least the area of each of the bipolar transistors Q2 to Q4 and Q7 to Q9 in the intermediate stage to be smaller than that of each of the bipolar transistors Q1, Q5, Q6, and Q10 at the first and final stages. With such a configuration, the whole occupation area of the protection circuit 1b can be further reduced. Therefore, the cost of the semiconductor device can be further reduced. From another aspect, it is sufficient that at least the area (particularly, emitter area) of each of the bipolar transistors Q5 and Q10 in the final stage is larger than the area (particularly, emitter area) of each of the bipolar transistors Q1 to Q4 and Q6 to Q9 in the first stage connected to the bases of the bipolar transistors Q5 and Q10 in the final stage. With the configuration, a breakdown in the bipolar transistors Q5 and Q10 in the final stage can be prevented.

Further, in the third embodiment, among the plurality of bipolar transistors for the protection circuit, the bipolar transistors in the first and final stages are adjacent to each other. As shown in FIG. 8, the bipolar transistors Q1 and Q5 in the first and final stages in the protection circuit 1b1 of the first block are disposed so that the long sides of the emitter electrode 5PE of the bipolar transistor Q1 and those of the base electrode 5PB of the bipolar transistor Q5 face each other. The bipolar transistors Q6 and Q10 in the first and final stages of the protection circuit 1b2 of the second block are disposed adjacent to each other so that the long sides of the base electrode 5PB of the bipolar transistor Q6 and the long sides of the emitter electrode 5PE of the bipolar transistor Q10 face each other. Reference characters Rs denote parasitic resistance generated by the protection circuits 1b1 and 1b2 in the case of such a device layout. The parasitic resistance Rs of the protection circuit 1b can be expressed by 2×Rs. That is, in the third embodiment, the parasitic resistance (=2×Rs) connected in series to the current path in the protection circuit 1b can be reduced more than the case of the device layouts of the foregoing first and second embodiments, so that a larger current can flow to the protection circuit 1b with a lower voltage. Therefore, the effect of voltage clamping can be further enhanced and resistance to destruction of the protection circuit 1b at the time of load impedance fluctuation can be increased. The size of the base of each of the bipolar transistors Q1 and Q6 is, for example, about 15 μm×47 μm. The size of the emitter of each of the bipolar transistors Q5 and Q10 is, for example, about 26 μm×47 μm.

The bipolar transistors Q1 to Q10 are disposed so that the long sides of the base electrode 5PB and the emitter electrode 5PE of each of the bipolar transistors Q1 to Q10 extend in the lateral direction (X direction) of FIG. 8 and the short sides of the base electrode 5PB and the emitter electrode 5PE extend in the vertical direction (Y direction) of FIG. 8. The bipolar transistors Q1, Q5, Q6, and Q10 are arranged in a line in the vertical direction (Y direction) of FIG. 8 so that the long sides of the base electrode 5PB and the emitter electrode 5PE are almost parallel to each other. The bipolar transistors Q2 to Q4 and Q7 to Q9 in the intermediate stage of the protection circuits 1b1 and 1b2 are arranged in a line in the vertical direction (Y direction) of FIG. 8 so that the long sides of the base electrode 5PB and emitter electrode 5PE of each of the bipolar transistors are almost parallel with each other next to the line of the bipolar transistors Q1, Q5, Q6, and Q10 in the first and final stages in the X direction. Particularly, in the protection circuit 1b1, the overall length in the Y direction of the two relatively large bipolar transistors Q1 and Q5 in the first and final stages is almost equal to that in the Y direction of the three relatively small bipolar transistors Q2 to Q4 in the intermediate stage. In the protection circuit 1b2 as well, the overall length in the Y direction of the two relatively large bipolar transistors Q6 and Q10 in the first and final stages is almost equal to that in the Y direction of the three relatively small bipolar transistors Q7 to Q9 in the intermediate stage. Consequently, despite of the fact that the bipolar transistors Q1 to Q10 of the protection circuits 1b1 and 1b2, having different sizes mixedly exist, they are arranged well. Thus, the overall occupation area of the protection circuit 1b can be reduced. The layout of the bipolar transistors Q1 to Q10 of the protection circuit 1b can be facilitated.

Figure 9:
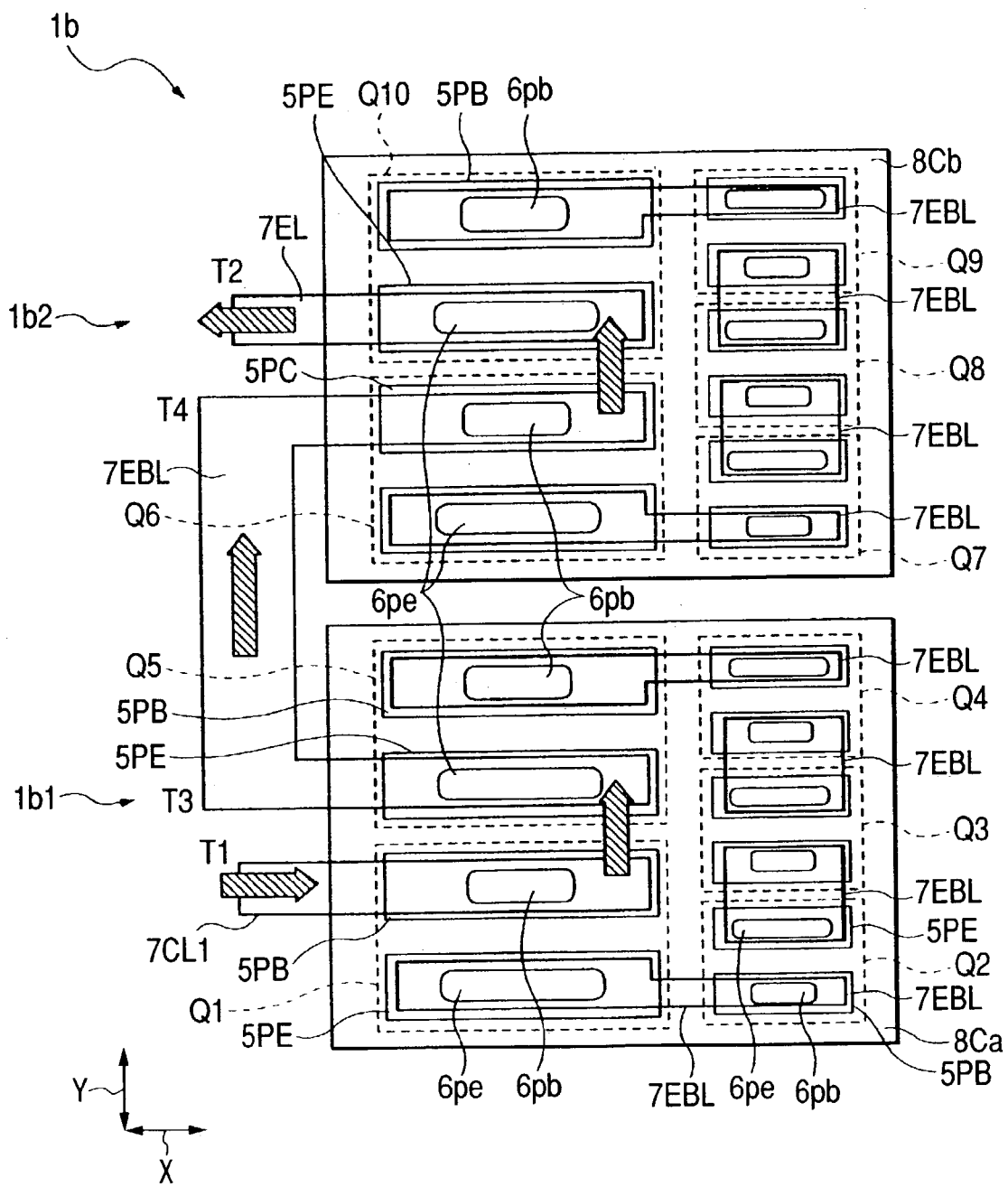
FIG. 9 is a plan view of a main part of a semiconductor substrate, showing a wiring layout for constructing the semiconductor circuit so as to be superimposed on the layout of the device of FIG. 8.

FIG. 9 is a plan view of a main portion of the substrate 4S showing an example of a wiring layout for constructing the protection circuit 1b of FIG. 5. Since the size and arrangement of the bipolar transistors Q1 to Q10 are changed so as to be different from those of the first and second embodiments, the shapes of the line 7EBL connecting the emitter and base of each of the bipolar transistors Q1 and Q2, the emitter and base of each of the bipolar transistors Q4 and Q5, the emitter and base of each of the bipolar transistors Q5 and Q6, the emitter and base of each of the bipolar transistors Q6 and Q7, and the emitter and base of each of the bipolar transistors Q9 and Q10 are different from those of the foregoing first and second embodiments, but the functions are the same. The arrows in FIG. 9 indicate directions of currents flowing in the protection circuits 1b, 1b1, and 1b2 at the time of load impedance fluctuations.

Figure 10:
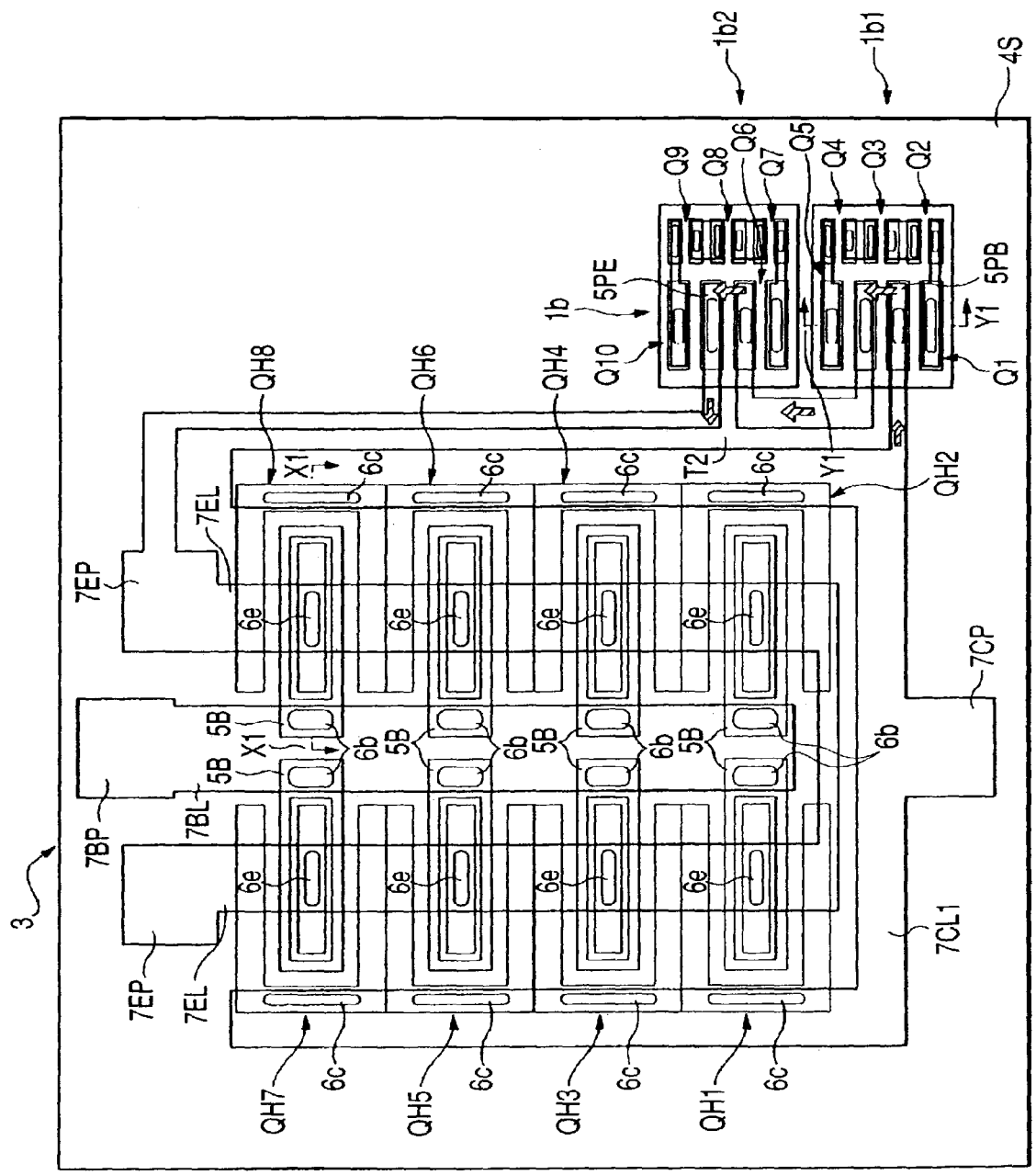
FIG. 10 is a plan view showing an example of a case where the protection circuit of FIG. 8 is attached to a semiconductor circuit as a component of a semiconductor device.

FIG. 10 shows an example of the layout in the case where the protection circuit 1b of FIG. 9 is added to the amplification circuit 3. The layout of the HBTs QH1 to QH8 of the amplification circuit 3 is the same as that in the first and second embodiments. The protection circuit 1b relatively smaller than the amplification circuit 3 is disposed close to and adjacent to the amplification circuit 3. The collector electrode 5C of the amplification circuit 3 is electrically connected to the base electrode 5PB of the bipolar transistor Q1 of the protection circuit 1b via the collector line 7CL1. The emitter electrode 5E of the amplification circuit 3 is electrically connected to the emitter electrode 5PE of the bipolar transistor Q10 of the protection circuit 1b via the emitter line 7EL. The arrows of FIG. 10 also indicate the directions of currents flowing in the protection circuits 1b, 1b1, and 1b2 at the time of load impedance fluctuation.

An example of a method of manufacturing a semiconductor device as described above will now be described by referring to FIGS. 11 to 16. FIGS. 11 to 16 are cross sections of the main portion taken along lines X1—X1 and Y1—Y1 of FIG. 10.

Figure 11:
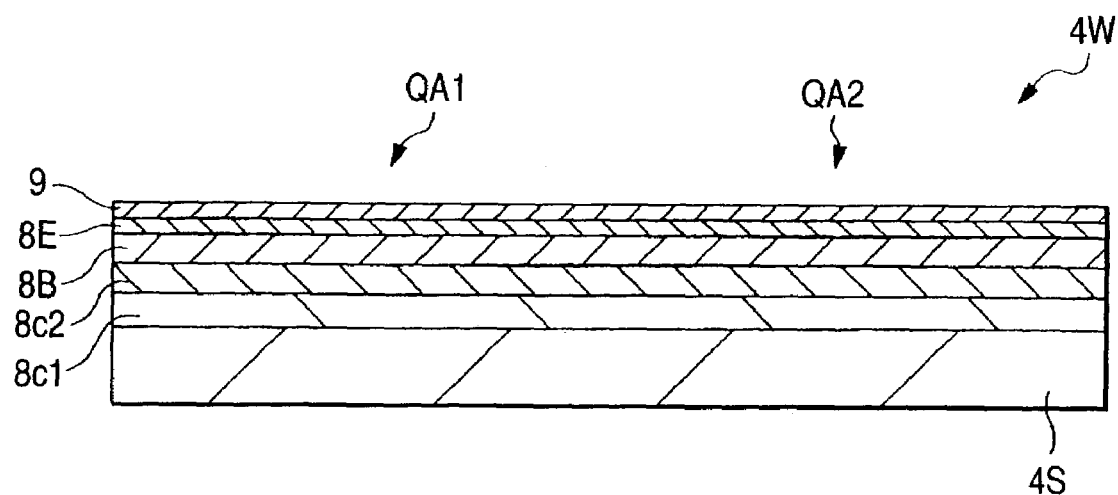
FIG. 11 is a cross section of a main part in a process of manufacturing the semiconductor device of FIG. 10.
Figure 12:
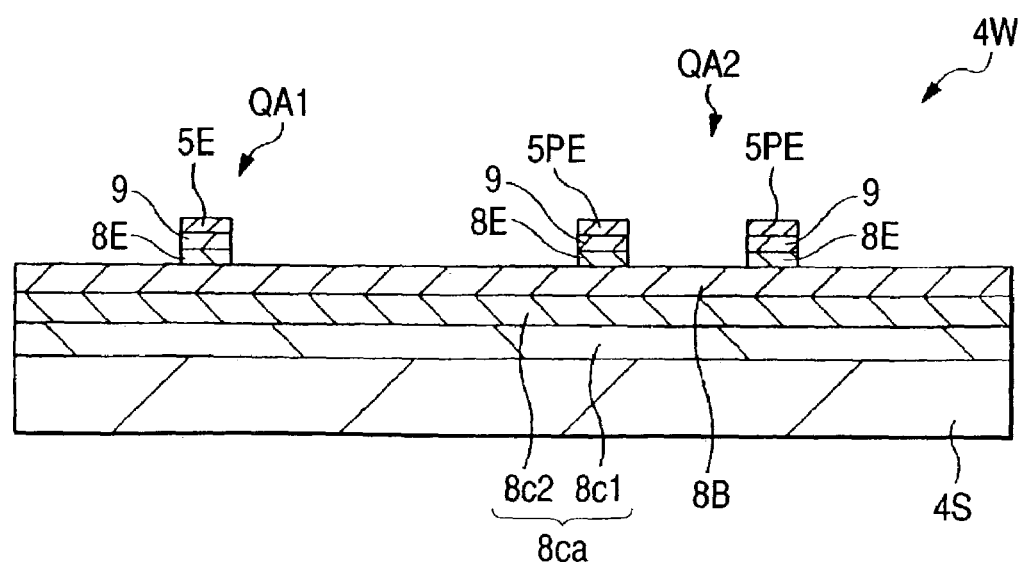
FIG. 12 is a cross section of the main part in the process of manufacturing the semiconductor device subsequent to FIG. 11.

FIG. 11 is a cross section of a main part of a region QA1 (taken along line X1—X1) for forming an HBT for the amplification circuit and a region QA2 (taken along line Y1—Y1) for forming a bipolar transistor for the protection circuit in the substrate 4S of a semiconductor wafer (hereinbelow, simply called a wafer) 4W having, for example, an almost circular shape in plan view. The substrate 4S is a semi-insulating compound substrate made of, for example, gallium arsenide (GaAs) or the like and has a thickness of, for example, about 80 μm. First, on the main surface (device formation face) of the wafer 4W, for example, by MOCVD (Metal Organic Chemical Vapor Deposition), gas source MBE (Molecular Beam Epitaxy), or the like, a heterojunction bipolar transistor crystal having an n-type sub collector layer (first semiconductor layer) 8C1, an n-type collector layer (third semiconductor layer) 8C2, an p-type base layer (fourth semiconductor layer) 8B, an n-type emitter layer (fifth semiconductor layer) 8E, and a cap layer (sixth semiconductor layer) 9 is formed in order from the lower layer. The sub collector layer 8C1 is made of a compound semiconductor such as gallium arsenide containing about $5\times10^{18}$/cm$^3$ of an impurity such as silicon and has a thickness of about 600 nm. The collector layer 8C2 is made of a compound semiconductor such as gallium arsenide containing about $1\times10^{19}$ to $1\times10^{20}$/cm$^3$ of an impurity such as carbon and has a thickness of about 50 nm. The emitter layer 8E is made of a stacked crystal layer made of indium gallium phosphide (InGaP) and a gallium arsenide formed on the indium gallium phosphide containing about $3\times10^{17}$/cm$^3$ of an impurity such as silicon (Si). The total thickness of the emitter layer 8E is about 230 nm. The cap layer 9 is made of a compound semiconductor such as indium gallium arsenide (InGaAs) and has a thickness of about 300 nm.

Subsequently, a silicide layer made of tungsten silicide (WSi$_x$) or the like is deposited on the main surface of the wafer 4W so as to be in contact with the cap layer 9 by CVD (Chemical Vapor Deposition), sputtering, or the like and is patterned by photolithography or dry etching, thereby forming the emitter electrode 5E for the amplification circuit and the emitter electrode 5PE for the protection circuit in the same process. In this case, a non-alloy ohmic contact is formed, so that heat treatment is unnecessary. After that, while the emitter electrodes 5E and 5PE are used as a mask, the emitter layer 8E is etched by chemical etching, thereby generating the base layers 8E for the amplification circuit and the protection circuit in the same process and forming a base mesa structure.

Figure 13:
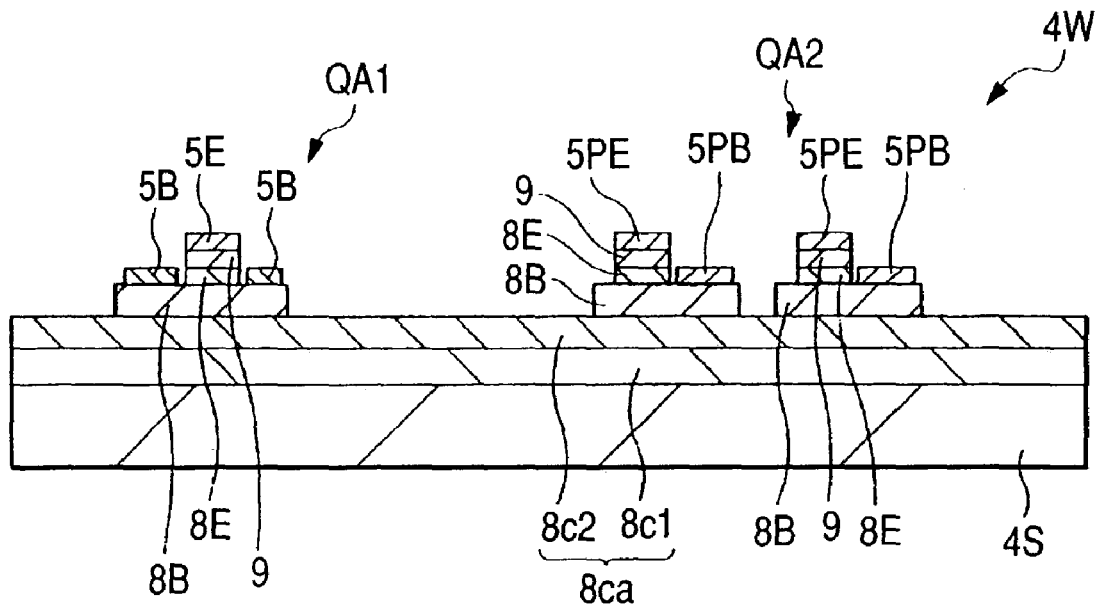
FIG. 13 is a cross section of the main part in the process of manufacturing the semiconductor device subsequent to FIG. 12.
Figure 14:
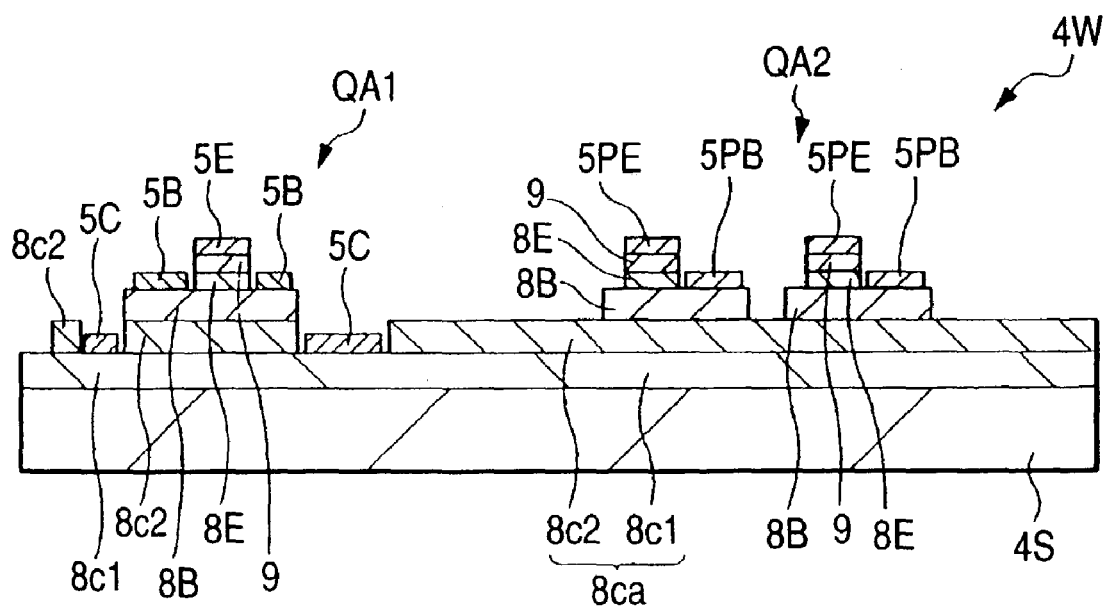
FIG. 14 is a cross section of the main part in the process of manufacturing the semiconductor device subsequent to FIG. 13.
Figure 15:
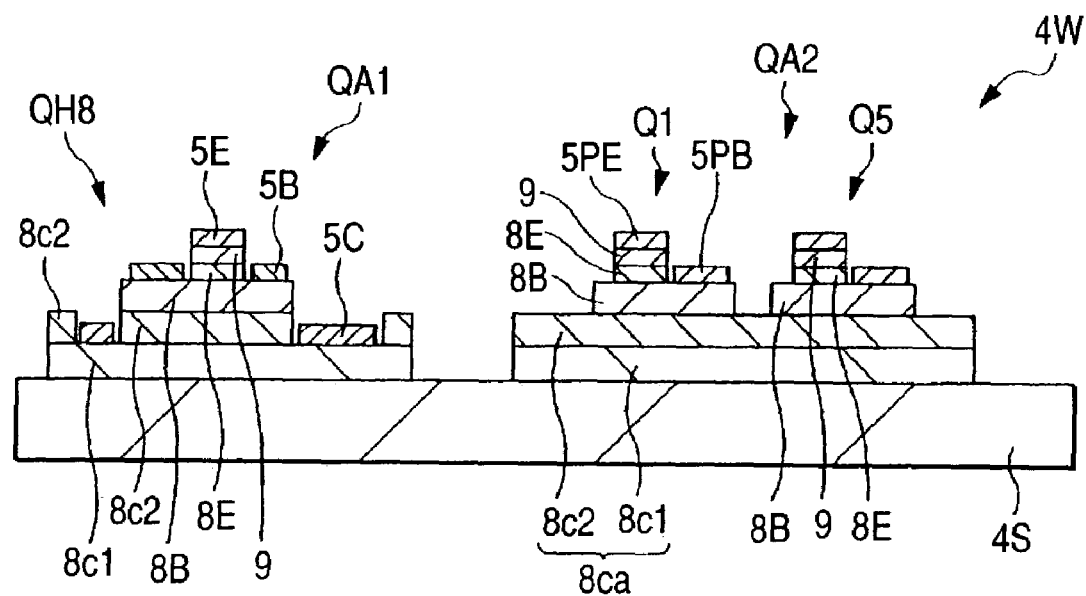
FIG. 15 is a cross section of the main part in the process of manufacturing the semiconductor device subsequent to FIG. 14.

Subsequently, as shown in FIG. 13, the base electrode 5B for the amplification circuit and the base electrode 5PB for the protection circuit are formed on the main surface of the wafer 4W so as to be in contact with the base layer 8B by a lift-off method in the same process and ohmic contact of the base electrodes 5B and 5PB to the base layer 8B is made by heat treatment. The base electrodes 5B and 5PB are made by, for example, a platinum (Pt)/titanium (Ti)/gold (Au) alloy layer. Subsequently, as shown in FIG. 14, a part of the collector layer 8C2 is etched to expose a part of the sub collector layer 8C2. After that, the collector electrode 5B for the amplification circuit is formed so as to be in contact with the exposed sub collector layer 8C2 by the lift-off method or the like. The collector electrode 5B is made by, for example, a gold germanium (AuGe)/nickel (Ni)/gold (Au) alloy layer. After that, as shown in FIG. 15, a part of the sub collector layer 8C1 and the collector layer 8C2 is etched by photolithography and chemical etching, thereby forming a collector mesa structure. In such a manner, the region QA1 for forming the HBT for the amplification circuit and the region QA2 for forming the bipolar transistor for the protection circuit are isolated from each other. The region QA2 for forming the bipolar transistor for the protection circuit is also isolated on the block unit basis. In the region QA2 for forming the bipolar transistor for the protection circuit, the sub collector layer 8C1 and collector layer 8C2 are left so that the collector region is shared on the block unit basis, that is, the collectors of the bipolar transistors Q1 to Q5 and Q6 to Q10 in the block are electrically connected to each other. In such a manner, the unit HBTs for the amplification circuit and the bipolar transistors for the protection circuit area formed on the main face of the wafer 4W. In the third embodiment, the unit HBT for the amplification circuit and the bipolar transistor for the protection circuit can be formed simultaneously in the same process. Thus, the process can be simplified, the manufacture time of the semiconductor device can be shortened, and the manufacturing cost can be reduced.

Figure 16:
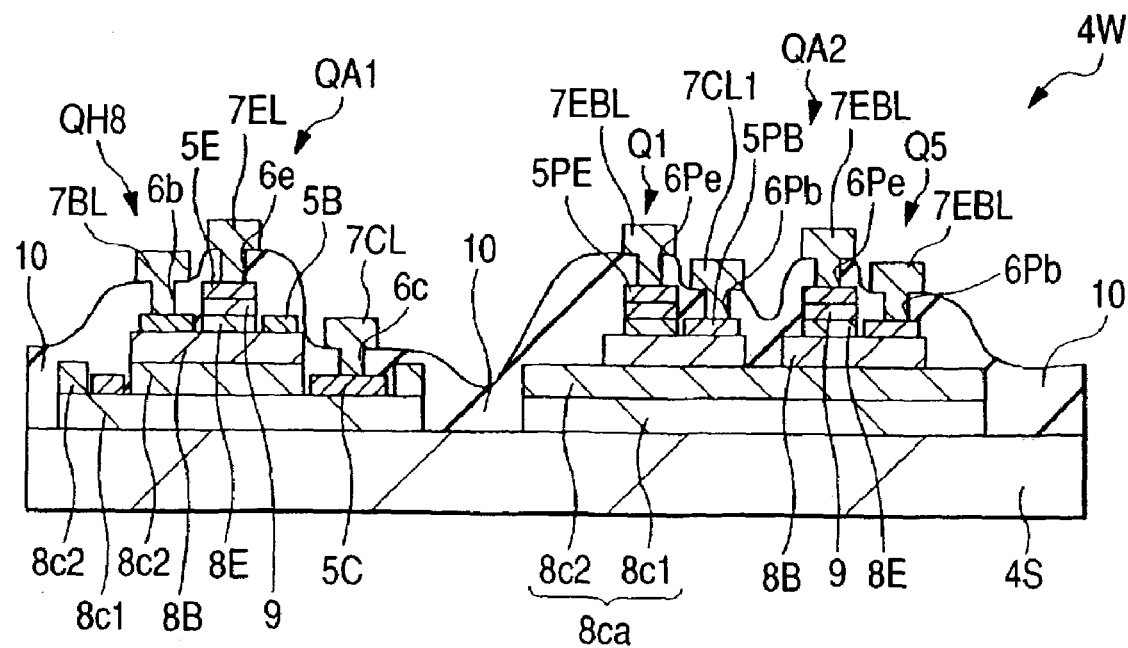
FIG. 16 is a cross section of the main part in the process of manufacturing the semiconductor device subsequent to FIG. 15.

Next, as shown in FIG. 16, the insulating film 10 made of silicon oxide (SiOx) or the like is deposited on the main face of the wafer 4W by CVD and, after that, the contact holes 6e, 6pe, 6b, 6pb, and 6c reaching the emitter electrodes 5E and 5PE, base electrodes 5B and 5PB, and collector electrode 5C are formed in the insulating film 10 by a photoresist process, a dry etching process, and a chemical etching process. Subsequently, on the main face of the wafer 4W, for example, molybdenum (Mo), gold (Au), and molybdenum are deposited sequentially from the lower layer by evaporation, sputtering, or the like and are patterned in the photoresist process and the dry etching process, thereby forming the collector line 7CL1, emitter line 7EL, base line 7BL, and line 7EBL, and the base pad 7BP, collector pad 7CP, and emitter pad 7EP shown in FIG. 10 and the like. Although a single wiring layer is illustrated here, a multi-wiring layer structure can be also used by stacking an insulating layer and a wiring layer. A necessary circuit pattern can be formed by a similar process. In the third embodiment, the InGaP/GaAs HBT using gallium arsenide for the base layer 8B and indium gallium phosphide (InGaP) for the emitter layer 8E is shown. The invention is not limited to the HBT but can be variously changed. The protection circuit can be applied to the cases of an AlGaAs/GaAs HBT using gallium arsenide for the base layer 8B and aluminum gallium arsenide (AlGaAs) for the emitter layer 8E, an InAlAs/InGaAs HBT using indium gallium arsenide for the base layer 8B and indium aluminum arsenide (InAlAs) for the emitter layer 8E, and an SiGe/Si HBT using silicon germanium (SiGe) for the base layer 8B and silicon for the emitter layer 8E.

Fourth Embodiment

In a fourth embodiment, an example of a structure in which the base and collector of a bipolar transistor at the first stage which is Darlington connected in the protection circuit will be described.

Figure 17:
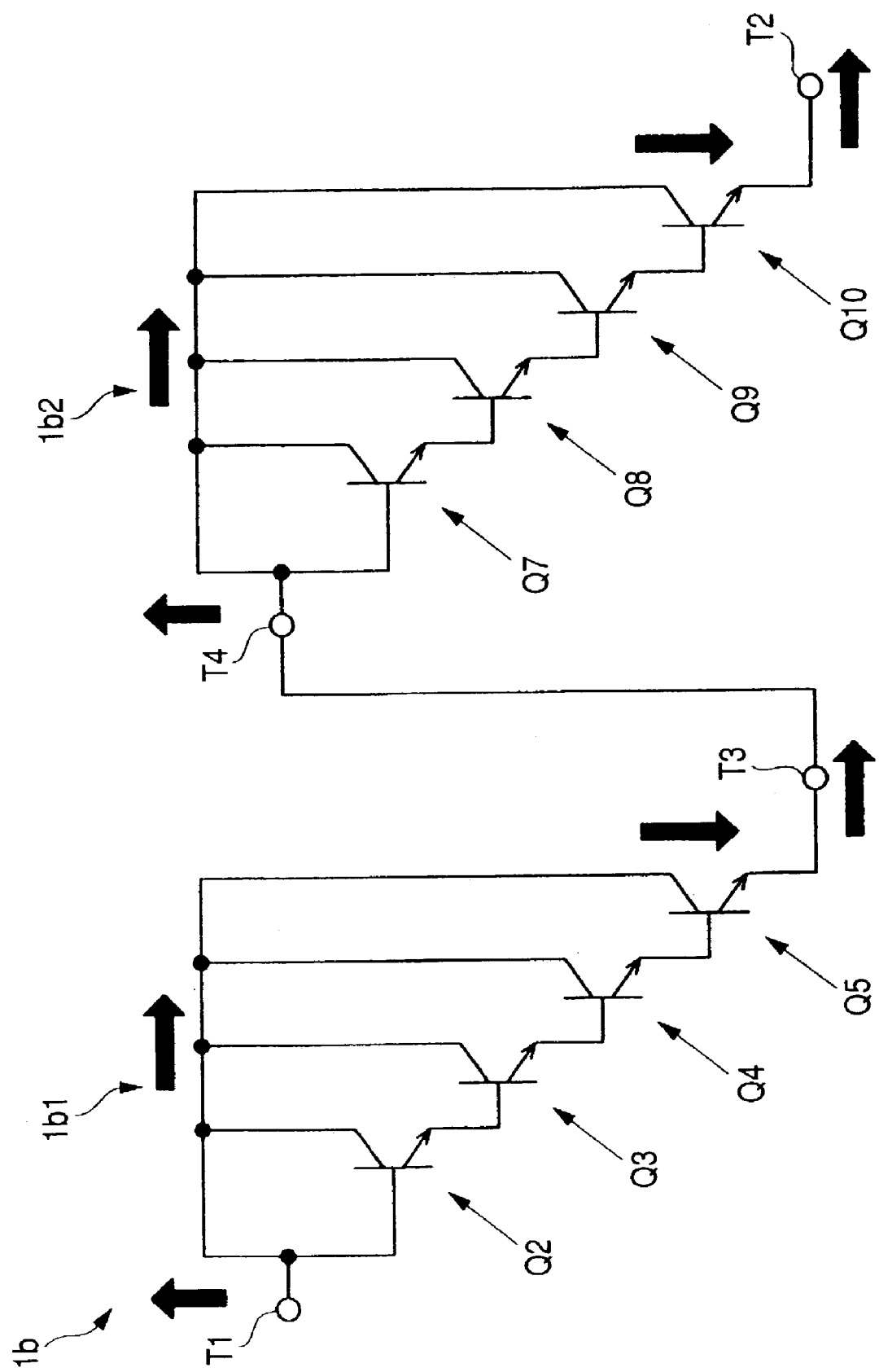
FIG. 17 is a circuit diagram showing an example of a protection circuit as another embodiment of the invention.

FIG. 17 shows an example of the protection circuit 1b of the fourth embodiment. The protection circuit 1b of FIG. 17 has a structure obtained by having bipolar transistors in eight stages by eliminating the bipolar transistors Q1 and Q6 at the first stages of the blocks of the protection circuit 1b shown in FIG. 5 and electrically connecting the bases and collectors of the bipolar transistors Q2 and Q7 in the first stages. The terminal T1 is electrically connected to the base and collector of the bipolar transistor Q2, and the terminal T3 is electrically connected to the base and collector of the bipolar transistor Q7. In this case, when the ON-state voltage of the bipolar transistors Q2 to Q5 and Q7 to Q10 is set as Vbe, the voltage Vce applied across the collector and emitter of the bipolar transistor in the m-th stage is Vce(m)=mVbe. In the protection circuit 1b in FIG. 5, Vce(n)=(n−1)Vbe for the following reason. In the protection circuit 1b of FIG. 1, a voltage drop of Vbe occurs between the base and the collector. In contrast, no voltage drop occurs since the base and collector are short-circuited in the protection circuit 1b in FIG. 17. Therefore, in the fourth embodiment, to realize the same collector-emitter voltage as that in the second and third embodiments, the bipolar transistor of one stage can be reduced.

Figure 18:
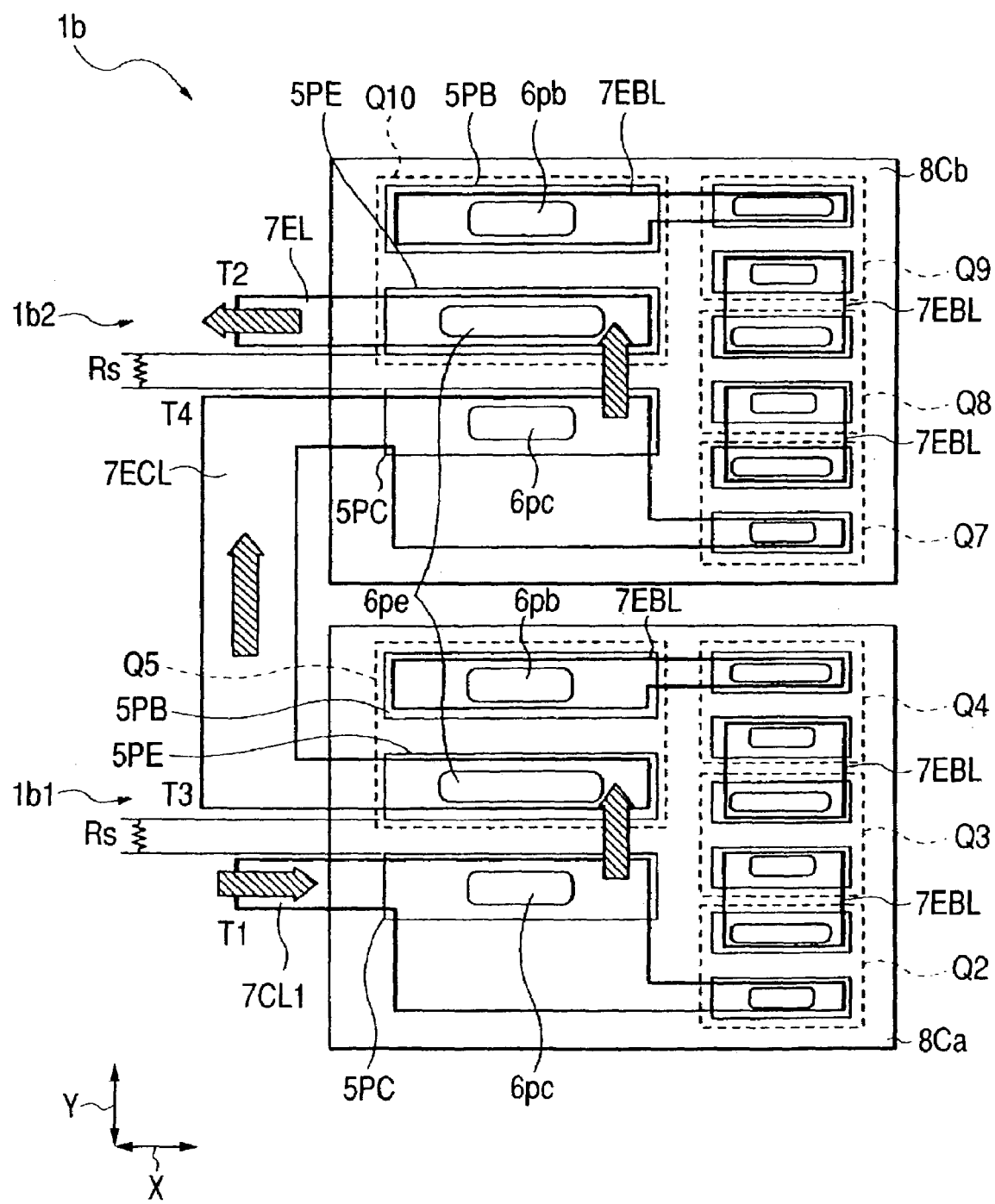
FIG. 18 is a plan view of a main part of a semiconductor substrate showing an example of device layout and wiring layout of the protection circuit of FIG. 17.

FIG. 18 is a plan view of a main portion of the substrate 4S showing an example of the device and wiring layout of the protection circuit 1b of FIG. 17. The collector line 7CL1 is electrically connected to the collector electrode 5PC and the base electrode 5PB of the bipolar transistor Q2. The emitter electrode 5PE of the bipolar transistor Q5 and the collector electrode 5PC on the collector region 8Cb side are electrically connected to the line 7ECL via the contact holes 6pe and 6pc.

In the fourth embodiment as well, the plurality of bipolar transistors Q2 to Q5 constructing the protection circuit 1b1 of the first block of the protection circuit 1b are formed in the common collector region (collector layer and sub collector layer) 8Ca, and the plurality of bipolar transistors Q7 to Q10 constructing the protection circuit 1b2 of the second block of the protection circuit 1b are formed in the common collector region (collector layer and sub collector layer) 8Cb. The connection using the common collector shown in FIG. 17 is realized by the layout in a manner similar to FIGS. 8 and 9 of the third embodiment.

In the fourth embodiment, the collector electrode 5PC is electrically connected to each of the collector regions 8Ca and 8Cb via a contact hole. The common collector electrode 5PC on the protection circuit 1b1 side is disposed adjacent to the emitter electrode 5PE of the bipolar transistor Q5 so that the long side of the common collector electrode 5PC faces a long side of the emitter electrode 5PE of the bipolar transistor Q5 in the final stage in the block of the protection circuit 1b1. The common collector electrode 5PC on the protection circuit 1b2 side is disposed adjacent to the emitter electrode 5PE of the bipolar transistor Q10 so that the long side of the collector electrode 5PC faces a long side of the emitter electrode 5PE of the bipolar transistor Q10 in the final stage. With the configuration, in a manner similar to the third embodiment, parasitic resistance (=2×Rs) connected in series to the current path of the protection circuit 1 can be reduced more than the case of the device layout of the first and second embodiments, so that a larger current can flow to the protection circuit 1 with a lower voltage. Therefore, the voltage clamping effect can be increased, so that resistance to destruction of the protection circuit 1 at the time of load impedance fluctuation can be improved.

In the fourth embodiment as well, the areas of the emitter electrode 5PE and the base electrode 5PB of the bipolar transistors Q2 to Q4 and Q7 to Q9 are smaller than those of the emitter electrode 5PE and the collector electrode 5PC of the bipolar transistors Q5 and Q10. Thus, the occupation area of the whole protection circuit 1 can be reduced, so that the cost of the semiconductor device can be reduced.

Fifth Embodiment

Figure 19:
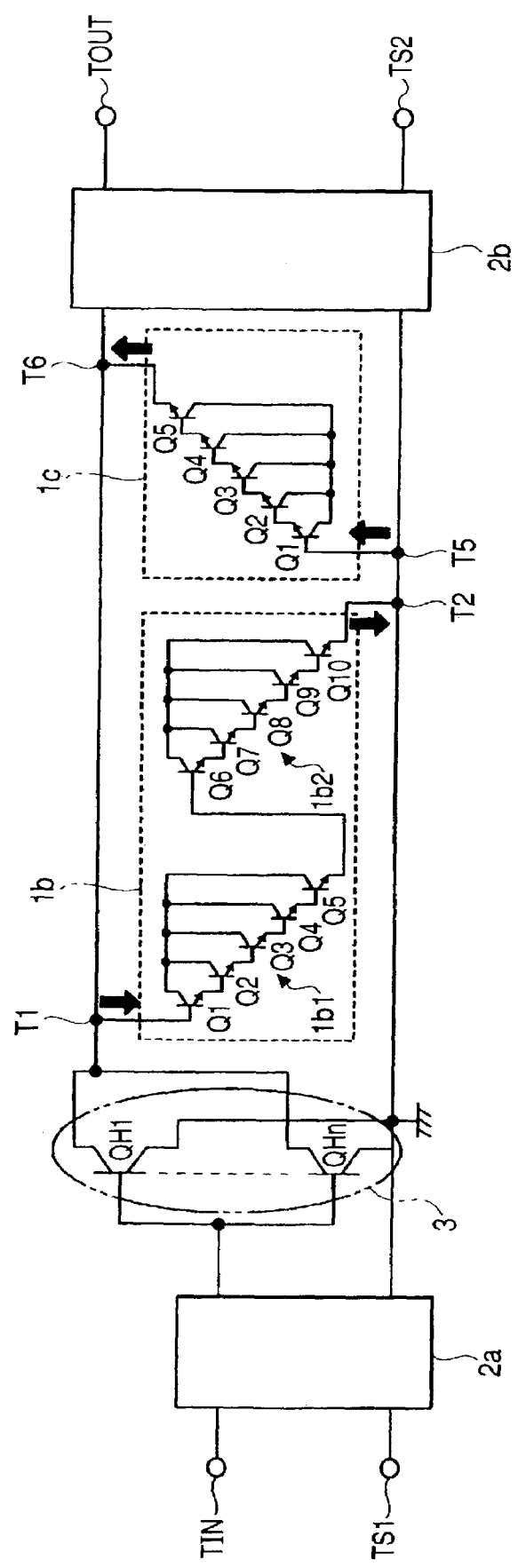
FIG. 19 is a circuit diagram showing an example of a semiconductor device as another embodiment of the invention.

In a fifth embodiment, an example of a structure in which protection circuits disposed in opposite directions are connected to an output of an amplification circuit. FIG. 19 shows an example of a circuit diagram of a semiconductor device in the fifth embodiment. Between the collector terminal and the emitter terminal of the amplification circuit 3, the protection circuit 1b is connected in parallel in a manner similar to the second and third embodiments and, in addition, a protection circuit 1c is connected in an opposite direction in parallel in the post stage of the protection circuit 1b. The protection circuit 1c has, for example, five bipolar transistors Q1 to Q5 which are Darlington connected. A terminal T5 electrically connected to the base of the bipolar transistor Q1 in the first stage of the protection circuit 1c is electrically connected to the emitter side of the amplification circuit 3, and a terminal T6 electrically connected to the emitter of the bipolar transistor Q5 in the final stage is electrically connected to the collector side of the amplification circuit 3. When a positive overvoltage is applied to the collector of the amplification circuit 3, the protection circuit 1b passes a current, thereby clamping the collector-emitter voltage of the amplification circuit 3 to an allowable voltage or less. When a negative overvoltage is applied to the collector of the amplification circuit 3, the protection circuit 1c passes a current, thereby clamping the collector-emitter voltage of the protection circuit 3 to the allowable voltage or less. Therefore, according to the fifth embodiment of the invention, even when a positive or negative overvoltage is applied to the collector of the amplification circuit 3, deterioration and destruction of the HBT of the amplification circuit 3 can be avoided. For example, in the case of the HBT in the high-output amplification circuit for a portable telephone, a clamp voltage required when a negative overvoltage is applied to the collector is lower than a clamp voltage required when a positive overvoltage is applied. Therefore, bipolar transistors of which number is about 2 to 5 of the protection circuit 1c connected in the opposite direction acts validly. Further, the protection circuits 1b and 1c function as circuits for protecting the amplification circuit 3 also from a surge voltage other than the load impedance fluctuation. Thus, the yield and reliability of the semiconductor device can be improved.

Sixth Embodiment

Figure 20:
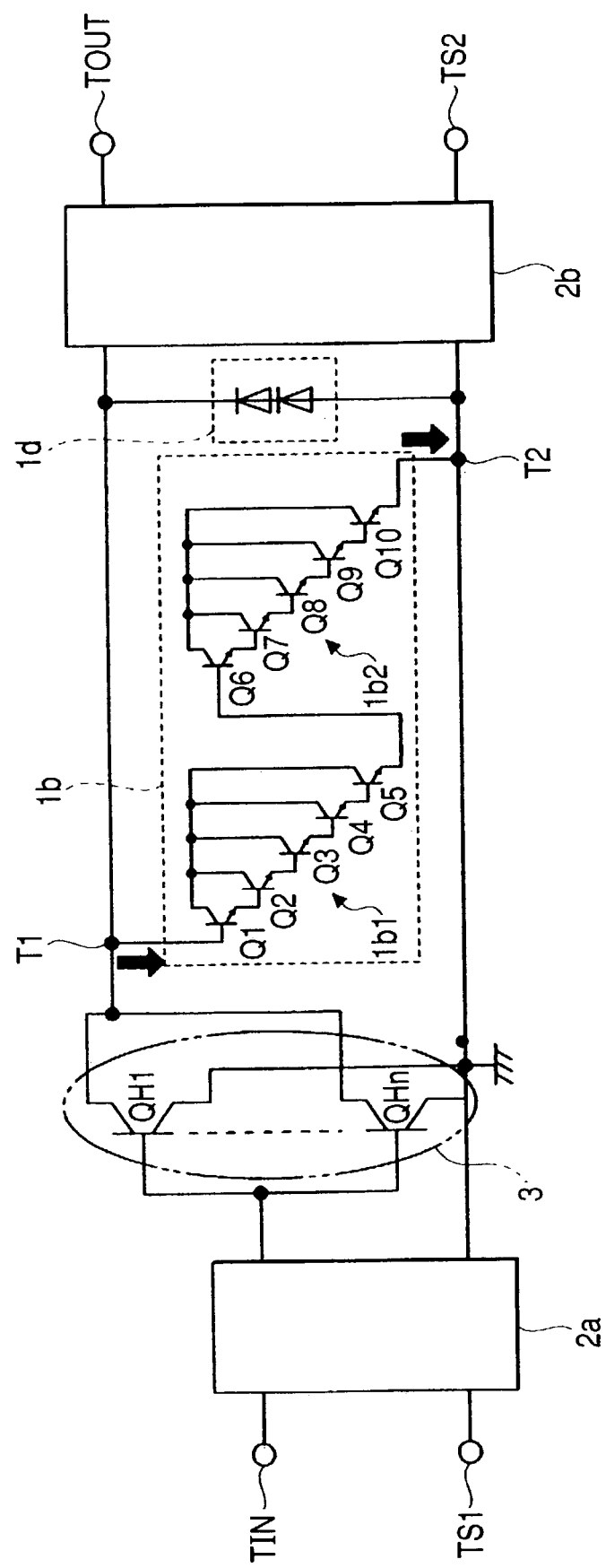
FIG. 20 is a circuit diagram showing an example of a semiconductor device as another embodiment of the invention.

In a sixth embodiment, a modification of the structure in which protection circuits provided in the opposite directions are connected to the output of the amplification circuit will be described. FIG. 20 shows an example of a circuit diagram of a semiconductor device in the sixth embodiment. Between the collector terminal and the emitter terminal of the amplification circuit 3, the protection circuit 1b is connected in parallel in a manner similar to the second and third embodiments and, in addition, a protection circuit 1d is connected in the opposite direction in parallel in the post stage of the protection circuit 1b. As also described in the fifth embodiment, the clamp voltage in the protection circuit connected in the opposite direction may be low. In the sixth embodiment, therefore, the protection circuit 1d connected in the opposite direction is constructed by connecting, for example, about two to five pieces of normal diodes such as emitter-base junction diodes or collector-base junction diodes. The anode of the diode in the protection circuit 1d is electrically connected to the emitter of the amplification circuit 3, and the cathode of the diode in the protection circuit 1d is electrically connected to the collector of the amplification circuit 3. The number of diodes connected in the protection circuit 1d is set according to the allowable voltage applied across the collector and emitter of the amplification circuit 3 in a manner similar to the first and second embodiments. By constructing the protection circuit 1d connected in the opposite direction by diodes, the occupation area of the protection circuit can be reduced. Therefore, the cost of the semiconductor device can be decreased. Since stability in an output power in a steady operation of a semiconductor device can be improved, reliability in operation of the semiconductor device can be improved.

Seventh Embodiment

Figure 21:
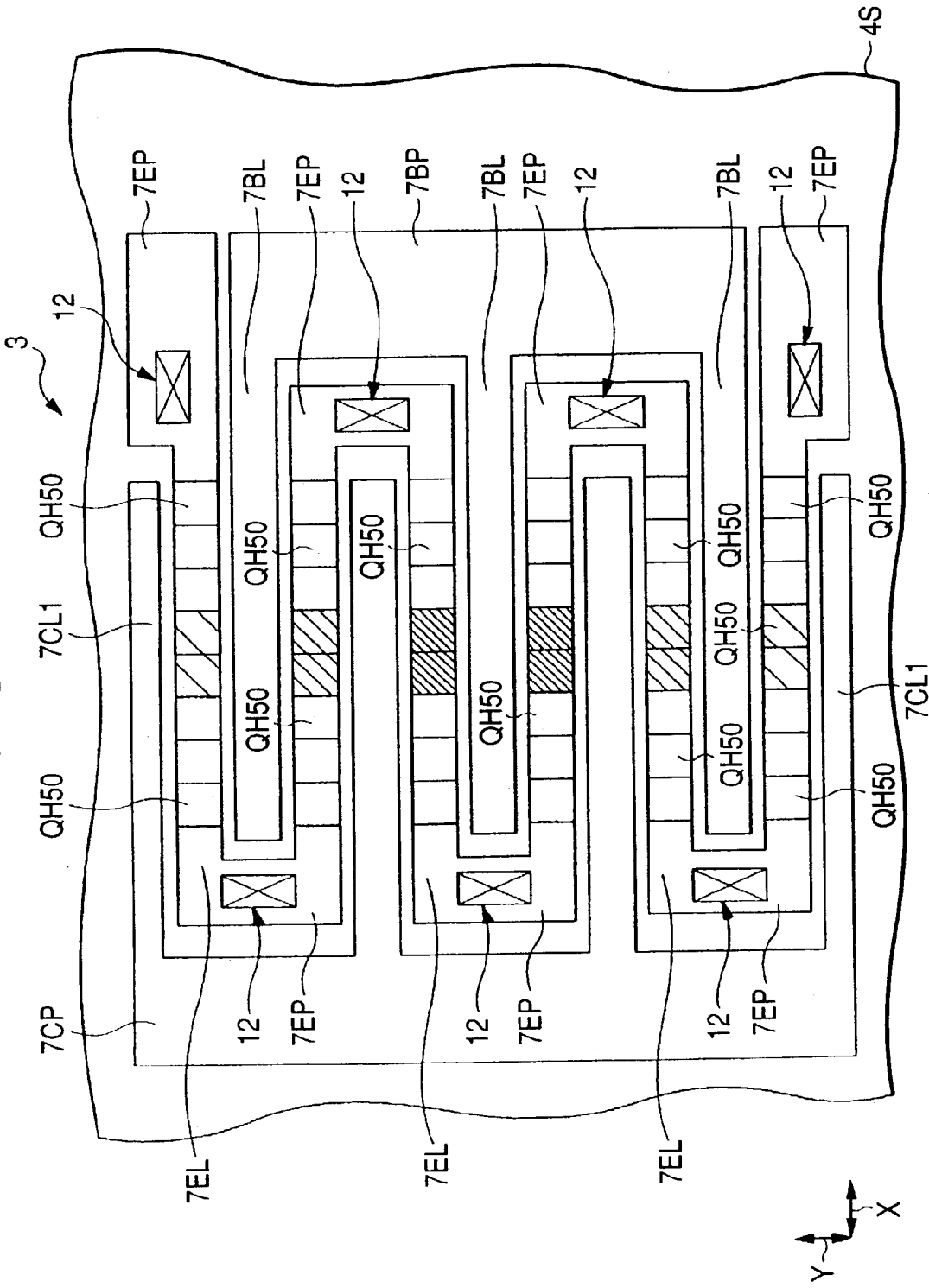
FIG. 21 is a partial plan view of the main surface of a semiconductor substrate of a semiconductor device examined by the inventors herein.

FIG. 21 shows an example of a plan view of a device layout of an HBT examined by the inventors herein. In a rectangular region of a compound semiconductor substrate made of gallium arsenide or the like, 6 lines×8 pieces (total 48 pieces) of unit HBTs QH50 are regularly arranged. The emitter size of each unit HBT QH50 is about 3×20 µm. The unit HBTs QH50 arranged in the horizontal direction (X direction) of FIG. 21 are arranged in a straight line without being shifted in the vertical direction (Y direction) of FIG. 21. The unit HBTs QH50 arranged in the vertical direction (Y direction) of FIG. 21 are also arranged on a straight line without being shifted in the X direction of FIG. 21. The unit HBTs QH50 of which temperature is the highest in each line are hatched. The fineness of hatching indicates variations in temperature. The finer the hatching is, the higher the temperature is (this rule similarly applies to hatching of a unit HBT of high temperature below). In the arrangement, a group (the second line) of the unit HBTs QH50 of which temperature is the highest is also disposed on the straight line in the Y direction of FIG. 21 without being shifted in the X direction of FIG. 21.

In the GaAs HBT or the like, heat conductivity of a gallium arsenide substrate is about ⅓ of that of a silicon substrate and power density is high, so that a measure to decrease thermal resistance is necessary. Under present circumstances, the problems are dealt with by processing the gallium arsenide substrate to be as extremely thin as about 28 μm or widening the interval between neighboring unit HBTs. However, when the substrate is thinned, problems such as breakage or warping of the substrate occur and the yield of the semiconductor device deteriorates. When the internal between neighboring unit HBTs is widened, a problem of a chip size occurs and the cost of the semiconductor device increases.

Figure 22:
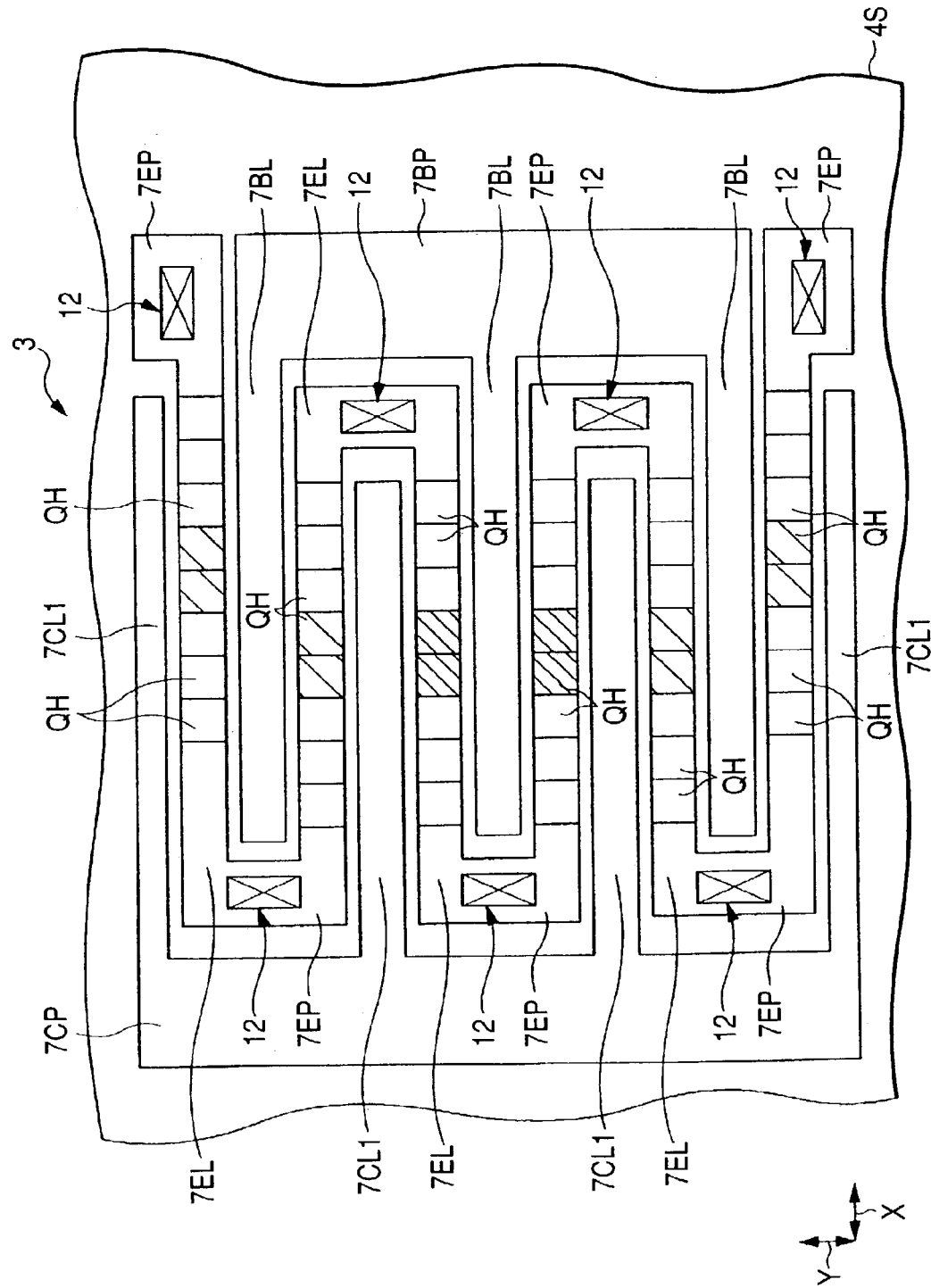
FIG. 22 is a plan view of a main part showing an example of the main face of a semiconductor substrate of a semiconductor device as another embodiment of the invention.
Figure 23:
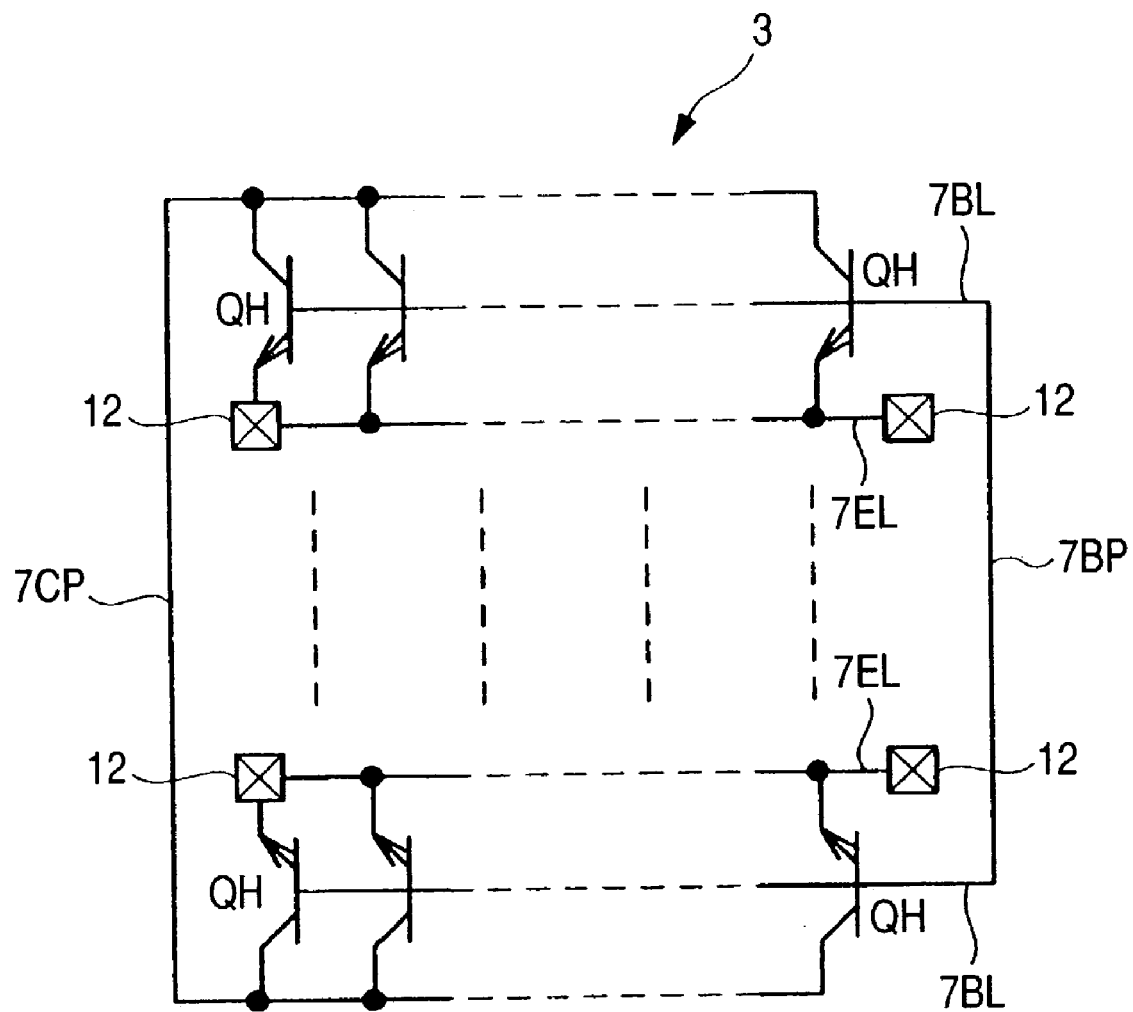
FIG. 23 is an equivalent circuit diagram of FIG. 22.
Figure 23:
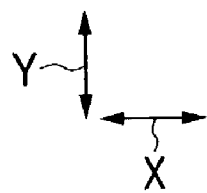

In the seventh embodiment, therefore, a layout in which a heat generation part of a group of unit HBTs is deviated is employed. FIG. 22 is a plan view of a main portion of a main face of the substrate 4S of the semiconductor device of the seventh embodiment. FIG. 23 is an equivalent circuit diagram of FIG. 22.

In FIG. 22, in a rectangular region of the substrate 4S made of a compound semiconductor such as gallium arsenide (GaAs), unit HBTs QH in 6 lines each consisting of 8 unit HBTs QH (total 48 pieces) are arranged regularly. The unit HBTs QH are the same as the unit HBTs QH1 to QHn of the amplification circuit described in the first to sixth embodiments and the emitter size of each of them is about 3×20 μm. The plurality of unit HBTs QH are connected in parallel in a state where their collectors, emitters, and bases are commonly connected (refer to FIG. 23). A group of the plurality of unit HBTs QH arranged in the horizontal direction (X direction) of FIG. 22 will be called a unit HBT cell line (first region). Unit HBTs QH having the highest temperature in the unit HBT cell line are hatched. The collector pad 7CP and the collector lines 7CL1 patterned in a toothed comb and the base pad 7BP and the base lines 7BL patterned in a toothed comb are disposed so that the collector lines 7CL1 and the base lines 7BL corresponding to the teeth are alternately arranged. Between the collector line 7CL1 and the base line 7BL which are neighboring each other in the Y direction, the unit HBT cell line is interposed. The emitter pads 7EP are disposed in both ends in the X direction of the unit HBT cell line. The emitter pad 7EP is electrically connected to the emitter electrode of the unit HBTs QH and is also electrically connected to a common emitter back face electrode on the back face of the substrate 4S through a via hole 12.

In the seventh embodiment, the uppermost and lowest unit HBT cell lines in FIG. 22 (predetermined first region) are disposed so as to be deviated from the unit HBT cell lines (other first region) between the uppermost and lowest lines to the right side of FIG. 21 only by an amount of two unit HBTs QH. With the configuration, out of the unit HBTs QH in the uppermost and lowest unit HBT cell lines, the unit HBTs QH in the center in which the temperature is the highest can be located away from the unit HBTs QH in the center in which the temperature is the highest in the intermediate unit HBT cell lines. Consequently, the temperature (heat resistance) when the unit HBTs QH in the center of which temperature becomes the highest in the unit HBT cell lines in the intermediate portion neighboring the uppermost and lowest unit HBT cell lines and, moreover, the temperature (heat resistance) at the time when the unit HBTs QH in the center portion in the unit HBT region in which the temperature becomes the highest can be decreased. As a result, operation reliability of a semiconductor device can be improved. Particularly, for example, the thickness of a wafer (substrate) can be increased by an amount corresponding to reduction in the heat resistance, so that rate of a defect such as a breakage or warp of a wafer can be reduced. Moreover, the interval between neighboring unit HBTs QH can be narrowed, so that the cost of the semiconductor device can be reduced. Although the case where the unit HBTs are deviated only by two unit HBTs QH has been described, by deviating the line only by at least one unit HBT QH, an effect of decreasing the heat resistance is produced.

Eighth Embodiment

Figure 24:
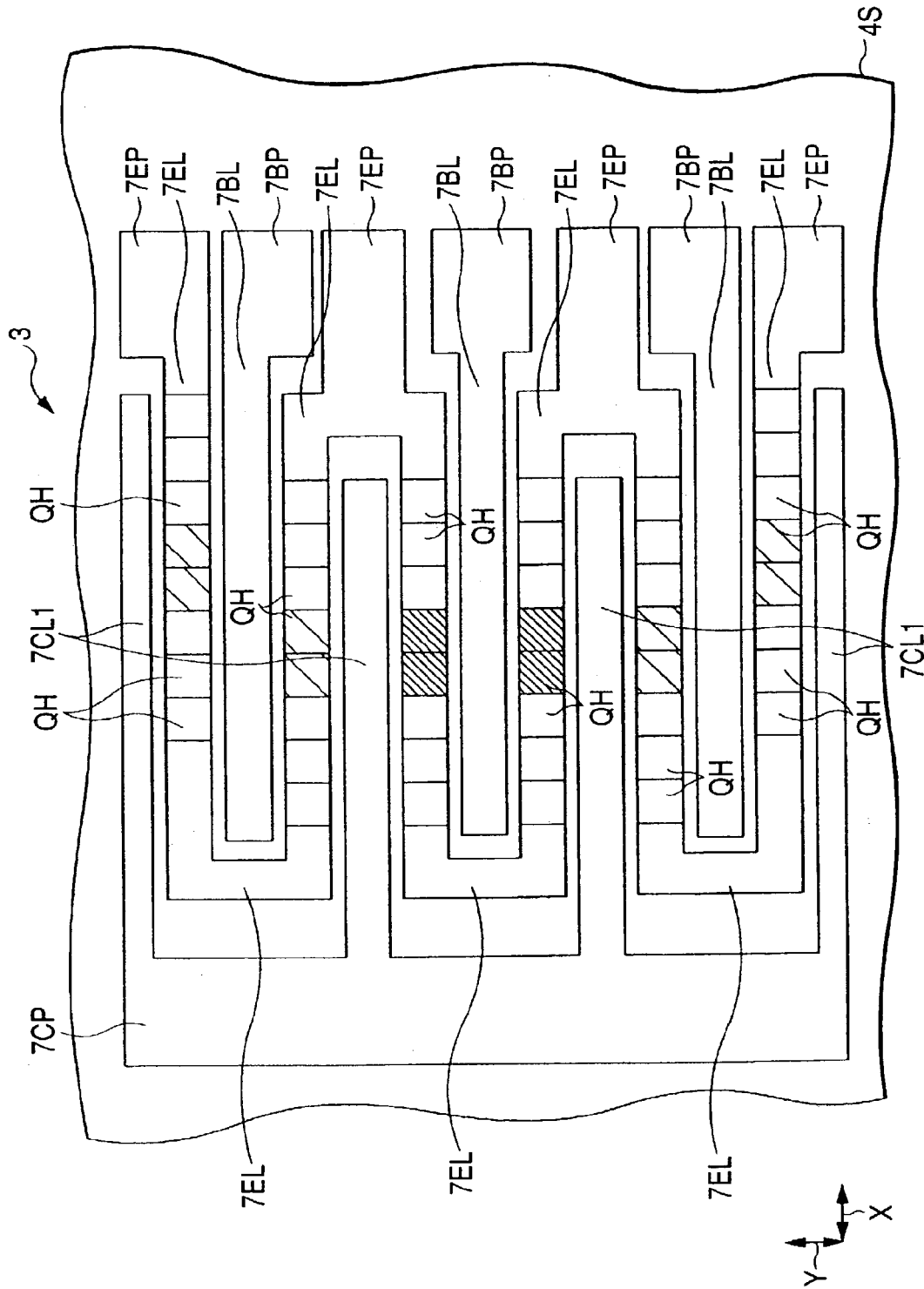
FIG. 24 is a plan view of a main part of an example of the main face of a semiconductor substrate of a semiconductor device as another embodiment of the invention.

FIG. 24 is a plan view of a main portion of a main face of the substrate 4S of a semiconductor device of an eighth embodiment. In a manner similar to the seventh embodiment, the unit HBTs QH of the highest temperature in the unit HBT cell line are hatched. A different point from the seventh embodiment of FIG. 22 is that the via hole for connecting the emitter line 7EL and the emitter back-face electrode on the back face of the substrate 4S is eliminated. Consequently, the process for manufacturing the semiconductor device can be simplified. In this case, the emitter pad 7EP is necessary at an end of the emitter line 7EL, the base line 7BL is individually patterned without being integrated, and the base pad 7BP is formed at an end of the base line 7BL. The emitter pads 7EP and base pads 7BP are disposed alternately in the Y direction of FIG. 24. The emitter pads 7EP and base pads 7BP are disposed on a straight line in the Y direction without being shifted in the X direction of FIG. 24. It makes bonding wires to be easily bonded to the emitter pads 7EP and base pads 7BP.

Ninth Embodiment

Figure 25:
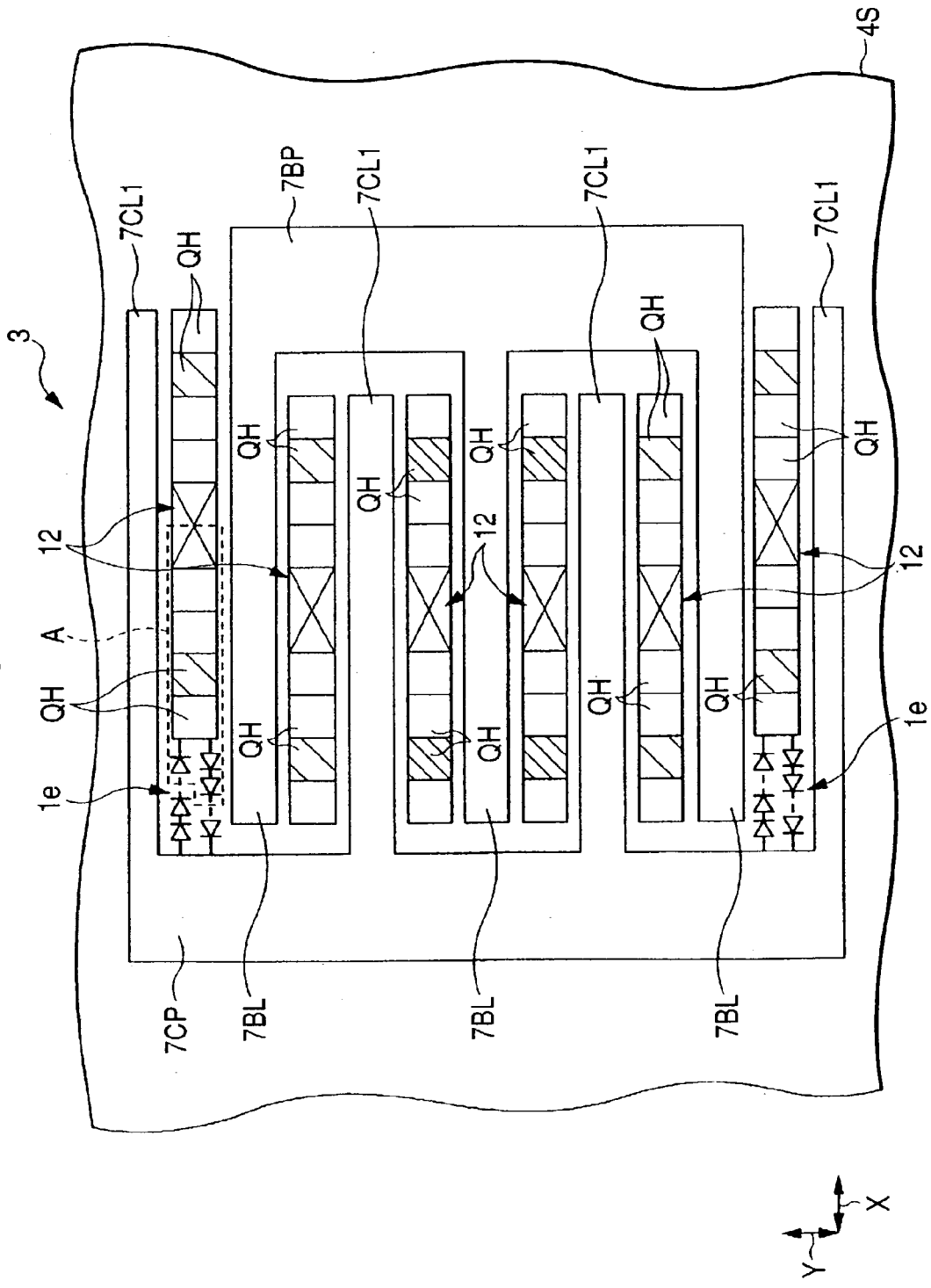
FIG. 25 is a plan view of a main part of an example of the main face of a semiconductor substrate of a semiconductor device as another embodiment of the invention.
Figure 26:
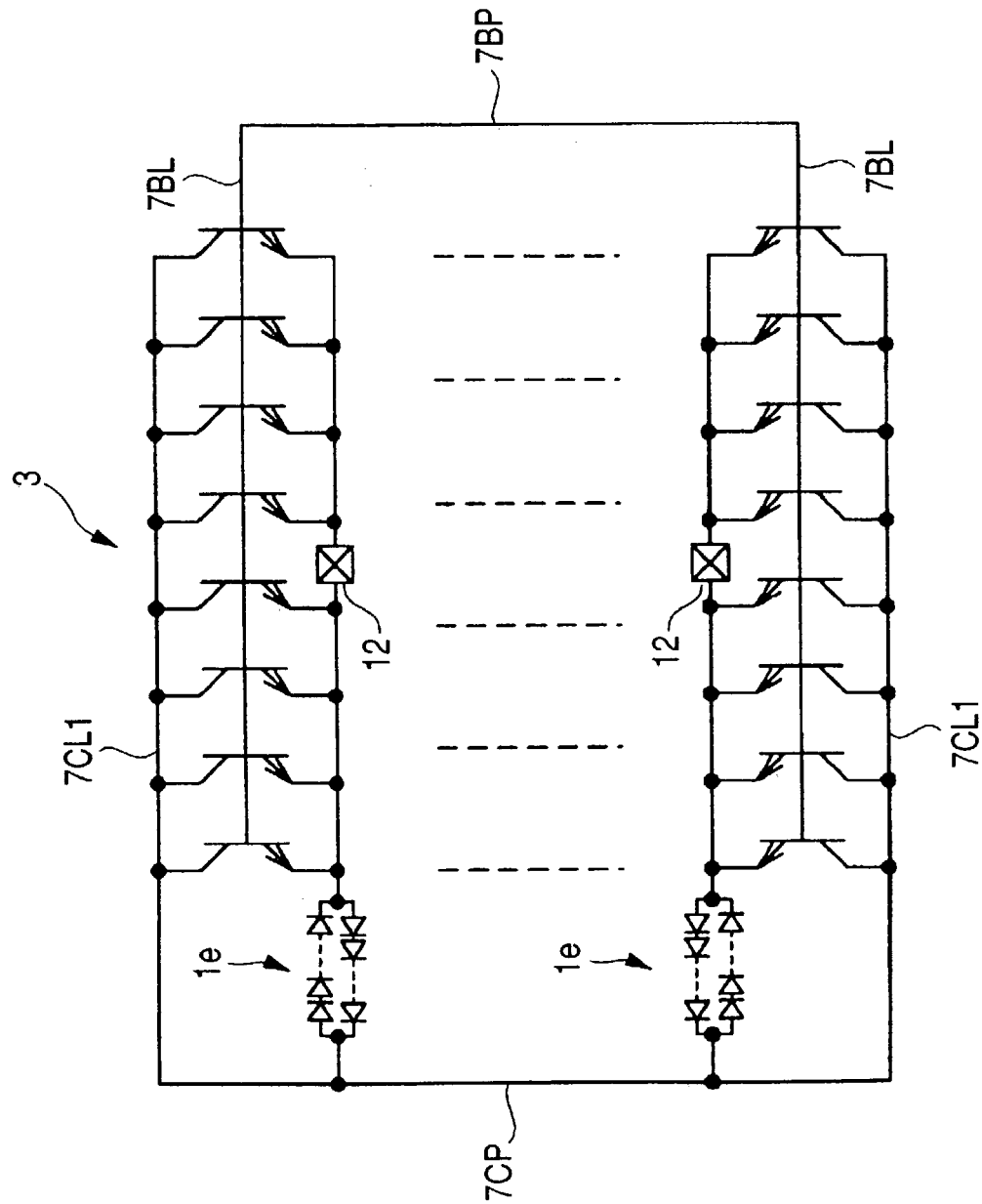
FIG. 26 is an equivalent circuit diagram of FIG. 25.

FIG. 25 is a plan view of a main portion of a main face of the substrate 4S of a semiconductor device of a ninth embodiment. In a manner similar to the seventh embodiment, the unit HBTs QH of the highest temperature in the unit HBT cell line are hatched. FIG. 26 is an equivalent circuit of FIG. 25.

A first different point from FIG. 22 of the seventh embodiment is that the via hole 12 for connecting the emitter line (which is not shown in FIG. 25) on the main face side of the substrate 4S and the emitter back-face electrode on the back face of the substrate 4S is disposed in the center position in each unit HBT cell line. With the configuration, the highest temperature in each unit HBT cell line can be decreased, so that heat resistance can be further reduced. The case where the dimension in the X direction of the via hole 12 corresponding to that of two unit HBTs QH is illustrated.

As described above, the uppermost and lowest unit HBT cell lines out of the plurality of unit HBT cell lines are deviated in the X direction of FIG. 25 from the unit HBT cell lines between the uppermost and lowest unit HBT cell lines, so that the position of the via hole 12 in the center of each of the uppermost and lowest unit HBT cell lines is also deviated in the X direction of FIG. 25 from the position of the via hole 12 in the center of each of the intermediate unit HBT cell lines. Consequently, the unit HBT QH whose temperature becomes high at the time of operation in each of the uppermost and lowest unit HBT cell lines and that in the intermediate unit HBT cell line neighboring the line are deviated from each other, and the via hole 12 is disposed near the unit HBT QH of which temperature becomes high at the time of operation in the Y direction of the unit HBT QH, so that the heat resistance reducing effect can be further increased. Therefore, according to the ninth embodiment, by the amount of reduction in the heat resistance, for example, the thickness of the wafer (substrate) can be increased. Thus, rate of a defect such as breakage or warp of a wafer can be further reduced. Moreover, the interval between neighboring unit HBTs QH can be reduced, so that the cost of the semiconductor device can be further reduced.

A second different point is that the protection circuit 1e similar to those of the first to sixth embodiments is disposed in a free area in a main surface portion of the substrate 4S near the left end of the uppermost and lowest unit HBT cell lines, which is created by shifting the uppermost and lowest unit HBT cell lines to the right in FIG. 25 with respect to the unit HBT cell lines positioned between the uppermost and lowest unit HBT cell lines. Thus, the free area can be effectively used and the chip size can be reduced. Therefore, the cost of the semiconductor device can be further reduced. The protection circuit 1e has a configuration in which a plurality of diodes which are connected in series in the forward direction and a plurality of diodes which are connected in series in the opposite direction are connected between the collector and the emitter of the unit HBT QH for the amplification circuit 3. The anode of the diode in the forward direction is electrically connected to the collector of the unit HBT QH for the amplification circuit 3 and the cathode is electrically connected to the emitter of the unit HBT QH for the amplification circuit 3. The anode of the diode in the opposite direction is electrically connected to the emitter of the unit HBT QH for the amplification circuit 3, and the cathode is electrically connected to the collector of the unit HBT QH for the amplification circuit 3. With the configuration, effects similar to those of the fifth and sixth embodiments can be obtained. The protection circuit 1e is disposed close to the collector pad 7CP. Consequently, parasitic resistance, parasitic capacitance, and the like can be reduced, so that an amount of current flowing in the protection circuit 1e can be increased.

The number of diodes for the protection circuit is set according to an allowable voltage value between the collector and emitter of the amplification circuit 3, and the clamp voltage by the diodes is set to be lower than the allowable voltage value between the collector and emitter of the amplification circuit 3. Specifically, the number "n" of diodes of the protection circuit in the forward direction is set so as to satisfy the equation of (Vcc/Vf) $\leq$ n $\leq$ (BVceo/Vf). Vcc denotes a power supply voltage which is, for example, 2.7V to 4.2V and is about 3.5V in this case. Vf indicates an ON-state voltage (about 1V) in the forward direction of a single pn junction diode, and VBVceo indicates a breakdown voltage between the collector and emitter with the base open. In the case where an overvoltage is applied to the amplification circuit 3, a voltage applied to the output (collector of the HBT) of the amplification circuit 3 is clamped to n×Vf. The clamp voltage is smaller than the allowable voltage (breakdown voltage BVceo) of the HBT in the amplification circuit 3, so that the HBT in the amplification circuit 3 can be protected from deterioration and destruction. In the case of using a diode using a pn junction by the base and emitter as the diode, the area can be reduced to about 20×20 µm². The details of the protection circuit constructed by the diodes are described in PCT application (International Application Nos. PCT/JP99/04819 filed on Sep. 6, 1999, International Publication No. WO 01/18865 A1).

Figure 27:
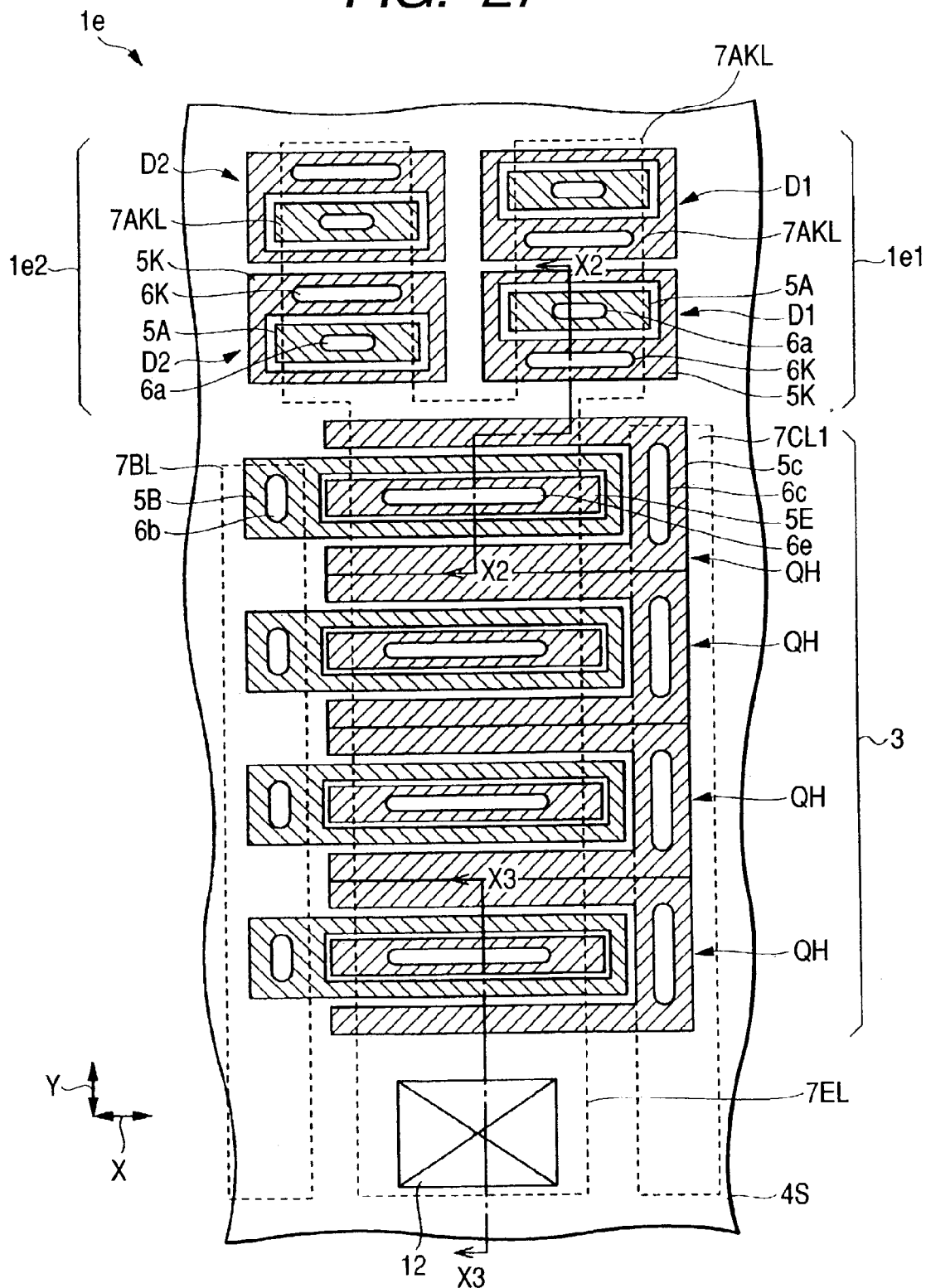
FIG. 27 is an enlarged plan view of a region A in FIG. 25.
Figure 28:
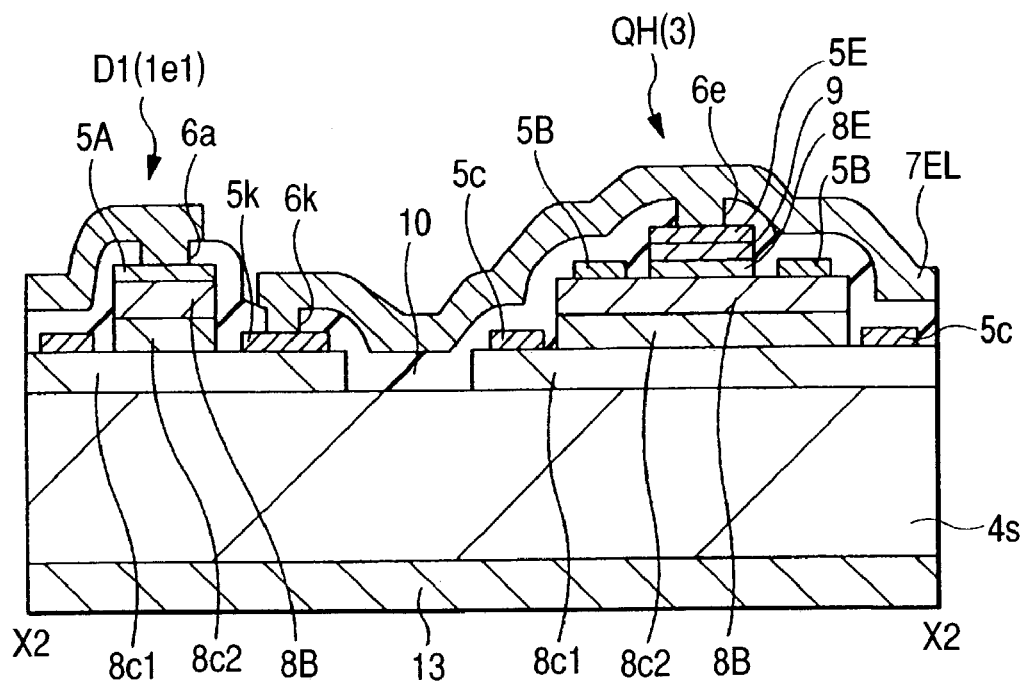
FIG. 28 is a cross section taken along line X2—X2 of FIG. 27.
Figure 29:
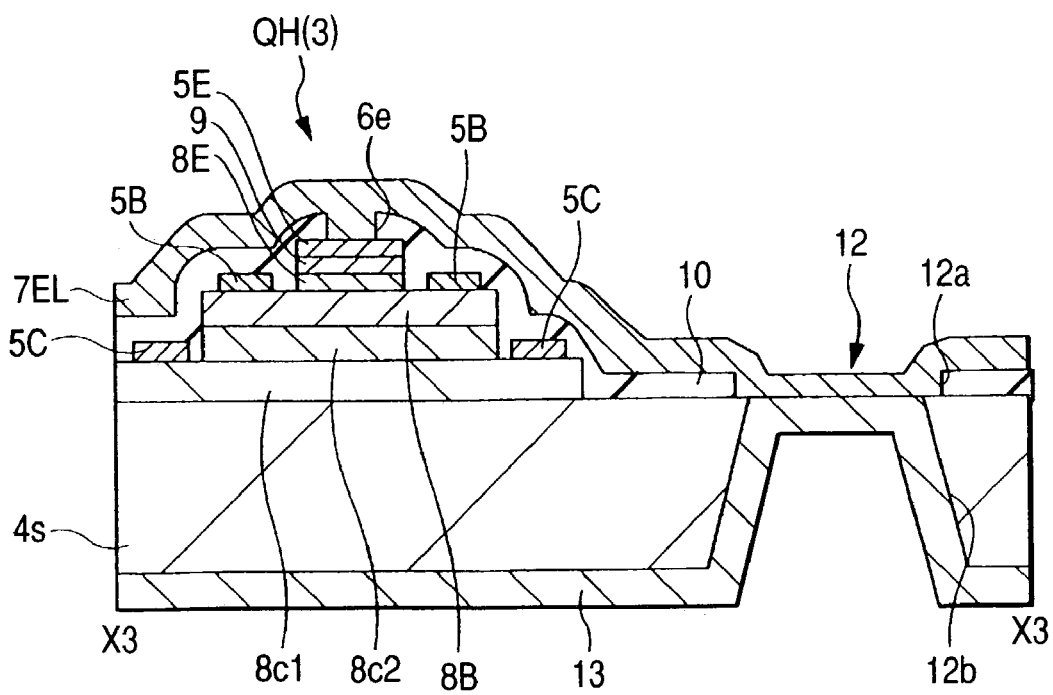
FIG. 29 is a cross section taken along line X3—X3 of FIG. 27.

FIG. 27 is an enlarged plan view of an area A in FIG. 25. FIG. 28 is a cross section taken along line X2—X2 of FIG. 27. FIG. 29 is a cross section taken along line X3—X3 of FIG. 27. FIG. 27 shows an example of the layout in plan view of a main portion. In the diagram, a protection circuit 1e1 in an upper right portion of FIG. 27 is a circuit having a plurality of diodes D1 in the forward direction between the collector and emitter of the group of the unit HBTs QH of the amplification circuit 3. A protection circuit 1e2 in an upper left portion of FIG. 27 is a circuit having a plurality of diodes D2 in the opposite direction between the collector and emitter of the group of unit HBTs QH of the amplification circuit 3. The diodes D1 and D2 are formed by using a pn junction of the p-type base layer (anode) 8B and the n-type collector 8C2 and sub collector layer (cathode) 8C1, and has an anode electrode 5A and a cathode electrode 5K. The anode electrode 5A in the center is made of the same material as that of the base electrode 5B of the unit HBT QH in the same process and is formed in a rectangular shape in plan view extending in the Y direction of FIG. 27. A round-corner rectangle extending in the Y direction in the center of the anode electrode 5A denotes a contact hole 6a for connecting the anode electrode 5A and a line in an upper layer of the anode electrode 5A. The cathode electrode 5K is made of the same material as that of the collector electrode 5C of the unit HBT QH in the same process and is formed in a frame shape in plan view so as to surround the anode electrode 5A. A round-corner rectangle extending in the Y direction of FIG. 27 in the cathode electrode 5K indicates a contact hole 6k for connecting the cathode electrode 5K and a line in an upper layer of the cathode electrode 5K. The cathode electrode 5K of the diode D1 at one of ends (the lowest diode in FIG. 27) out of the plurality of diodes D1 in the forward direction is electrically connected to the emitter line 7EL via the contact hole 6k. The anode electrode 5A is electrically connected to the cathode electrode 5K of the diode D1 neighboring the diode D1 in the X direction via the contact hole 6a and a line 7AKL. The anode electrode 5A of the diode D1 at the other end out of the plurality of diodes D1 in the forward direction is electrically connected to the collector line 7CL1. The anode electrode 5A of the diode D2 at one of ends (the lowest diode in FIG. 27) out of the plurality of diodes D2 in the opposite direction is electrically connected to the emitter line 7EL via the contact hole 6a. The cathode electrode 5K is electrically connected to the anode electrode 5A of the diode D2 adjacent to the diode D2 in the X direction via the contact hole 6k and the line 7AKL. The cathode electrode 5K of the diode D2 at the other end out of the plurality of diodes D2 in the opposite direction is electrically connected to the collector line 7CL1. In FIG. 27, below the protection circuit 1e, the unit HBTs QH as a part of the amplification circuit 3 are shown. Since the configuration and the like of the unit HBT QH are the same as those in the foregoing first to sixth embodiments, the description will not be repeated here. The via hole 12 has a hole 12a formed in an insulating film 10 and a hole 12b penetrating the main face and the back face in the depth direction of the substrate 4S. The holes 12a and 12b each having an almost rectangle shape in plan view of which corners are rounded are formed in positions which are in the same position in plan view. A part of the emitter line 7EL is buried in the hole 12a. A part of a common emitter back-face electrode 13 formed on the back face of the substrate 4S is buried in the hole 12b. The emitter line 7EL on the main face side of the substrate 4S and the emitter back-face electrode 13 on the back face side of the substrate 4S are in contact with each other and electrically connected to each other via the via hole 12. The emitter back-face electrode 12 is made of, for example, gold (Au).

A method of manufacturing the semiconductor device is almost the same as that described in the third embodiment. In this case, an etch stopper layer is formed between a sub collector layer 8C1 and a collector layer 8C2, and the base layer 8B and the collector layer 8C2 may be overlapped and patterned by using the same mask. The etch stopper layer is a semiconductor layer made of, for example, n-type aluminum gallium arsenide (AlGaAs) and functions as an etching stopper at the time of etching both the base layer 8B and the collector layer 8C2. It makes the manufacturing process simplified. The unit HBTs QH for the amplification circuit 3 and the diodes D1 and D2 for the protection circuit 1e are formed simultaneously. In the diodes D1 and D2, the base layer 8B corresponds to an anode layer and the collector layer 8C2 corresponds to a cathode layer. Therefore, at the time of patterning the base layer 8B and the collector layer 8C2 of the unit HBT QH, the anode layers and cathode layers of the diodes D1 and D2 are also patterned.

Figure 30:
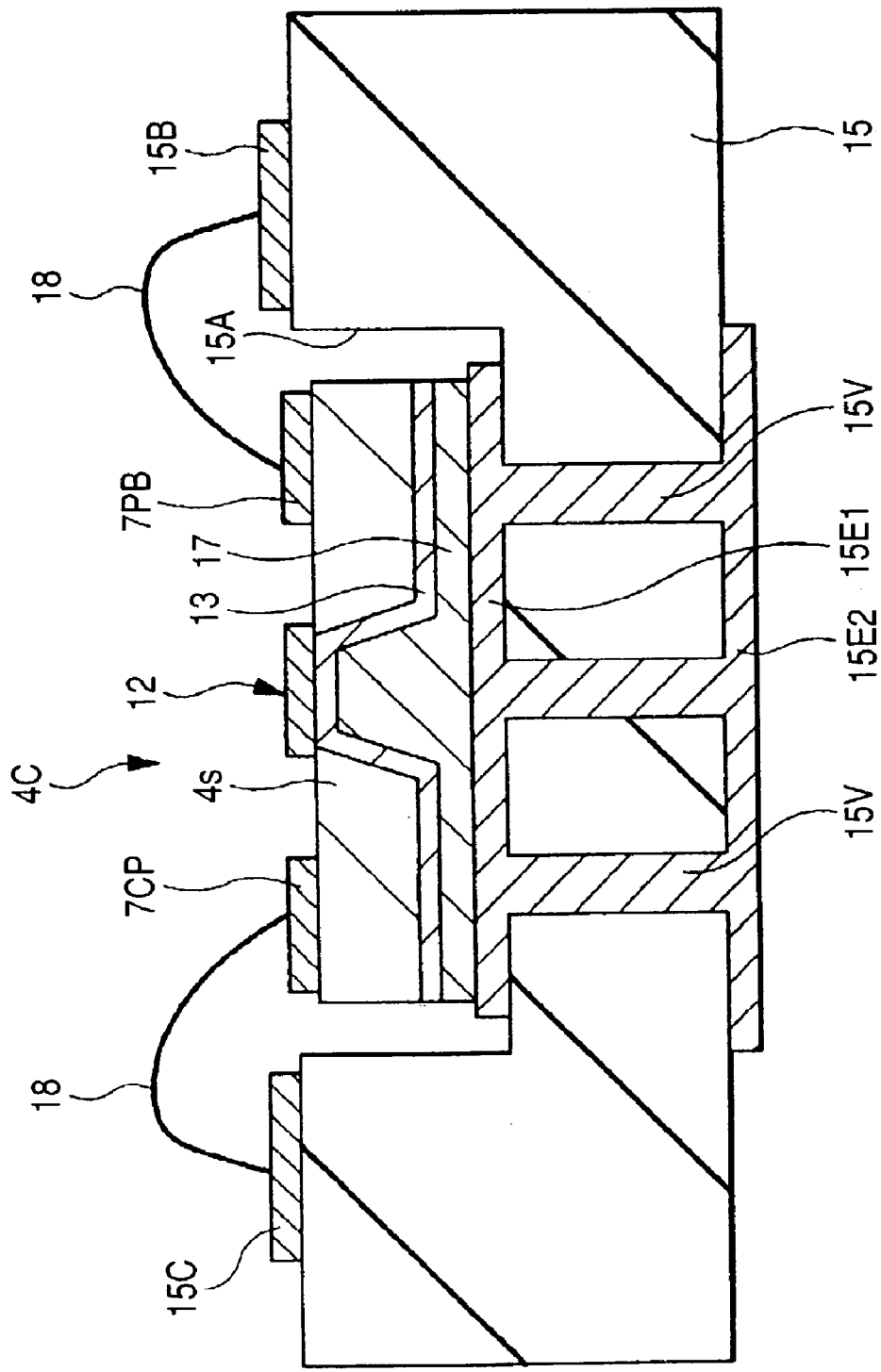
FIG. 30 is a cross section of a semiconductor device having a via hole as another embodiment of the invention.

FIG. 30 shows an example of a cross section showing a state where a GaAs HBT having the via hole 12 is mounted. A module substrate 15 is made of, for example, ceramics. In a recess ISA formed in a part of the module substrate 15, a semiconductor chip (hereinbelow, simply called chip) 4C is housed in a state where its emitter back-face electrode 13 is bonded to an electrode 15E1 on the bottom face of the recess 15A. The chip 4C is a main component of a semiconductor device having the GaAs HBT on its substrate 4S. The collector pad 7CP and the base pad 7BP on the main face of the chip 4C are electrically connected to collector electrodes 15C and 15B formed on the surface of the module substrate 15 via bonding wires 18. The bonding wires 18 are made of, for example, gold (Au). To the collector pad 7CP, a plurality of, for example, five bonding wires 18 are connected. With the arrangement, the device can deal with a heavy current. The collector electrodes 15C and 15B are made of, for example, copper and their surfaces are metal plated.

The electrode 15E1 is electrically and thermally connected to an emitter electrode 15E2 formed on the surface of the module substrate 15 via a thermal via 15V formed in the module substrate 15. The thermal via 15V is formed by filling a through hole with a conductor. With such a structure, the emitter back-face electrode 13 of the chip 4C can be set to a desired potential via the emitter electrode 15E2. Heat generated at the time of circuit operation of the chip 4C is allowed to escape to the emitter electrode 15E2 via the thermal via 15V. With the configuration, stable operation of the chip 4C is achieved. The electrode 15E1 and the thermal via 15V (conductor on the inside) are made of a material having low electric resistance and having a property of high thermal conductivity such as copper (Cu), silver (Ag), or tungsten (W). The emitter electrode 15E2 is made of, for example, copper and its surface is metal-plated. By selecting such a material, the performance of dissipating heat generated at the time of circuit operation of the chip 4C can be improved. A bonding material 17 is also charged in the hole 12b in the via hole 12 in the chip 4C, thereby enabling heat resistance between the emitter line 7EL and the electrode 15E1 in the via hole 12 to be reduced. Thus, the performance of dissipating heat from the via hole 12 to the emitter electrode 15E2 can be improved.

Tenth Embodiment

Figure 31:
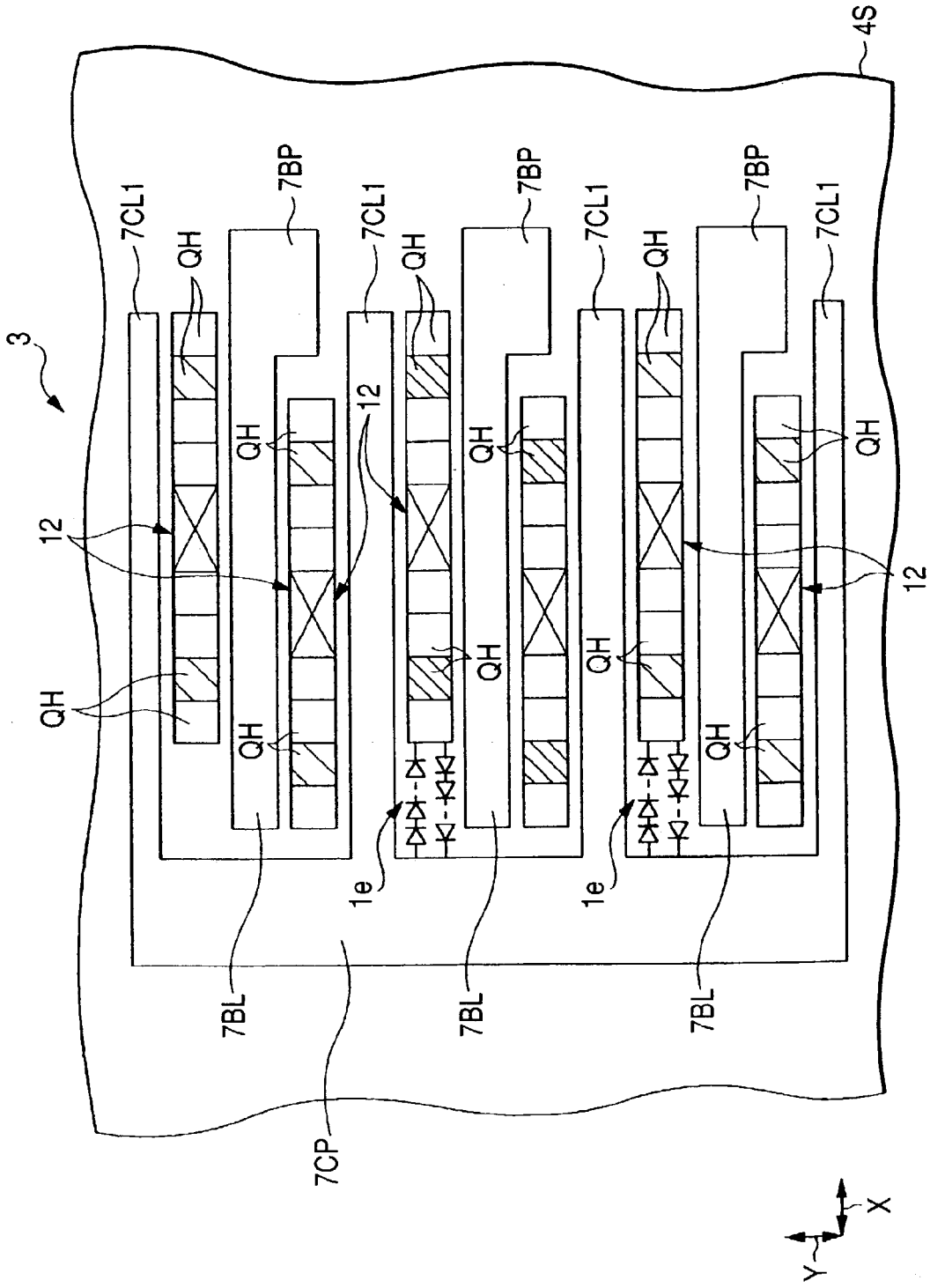
FIG. 31 is a plan view of a main part of an example of the main face of a semiconductor substrate of a semiconductor device as another embodiment of the invention.

FIG. 31 shows an example of a plan view of a main portion of a main face of the substrate 4S in a semiconductor device of a tenth embodiment. In a manner similar to the seventh to ninth embodiments, unit HBTs QH of the highest temperature are hatched. The emitter lines on the main face side of the substrate 4S are not shown to simplify the drawing.

A point different from FIG. 25 of the ninth embodiment is that the unit HBT cell lines neighboring in the Y direction of FIG. 31 are displaced in the X direction of FIG. 31. Since the via hole 12 is located in the center of each unit HBT cell line, the positions of the via holes 12 in the unit HBT cell lines neighboring in the Y direction are deviated from each other in the X direction. In other words, the via holes 12 are arranged in a staggered manner. With such arrangement, the positions of the unit HBTs QH of the highest temperature in the unit HBT cell lines can be made deviated from each other. That is, the unit HBTs QH of the highest temperature in each of the unit HBT cell lines neighboring in the Y direction can be located away in the X direction. Therefore, the temperature at the time of operation of the unit HBTs QH in the center of the unit HBT area of the highest temperature can be decreased further, so that heat resistance can be further reduced.

The displacement amount in the X direction of each of the unit HBT cell lines neighboring in the Y direction is a predetermined value. In this case, for example, the odd-numbered unit HBT cell lines are displaced to the right with respect to the even-numbered unit HBT cell lines only by, for example, an amount of two unit HBTs QH. That is, displacement is made with regularity. Consequently, easy of arrangement of the unit HBT cell lines can be assured. Therefore, designing of the semiconductor device can be facilitated.

Eleventh Embodiment

Figure 32:
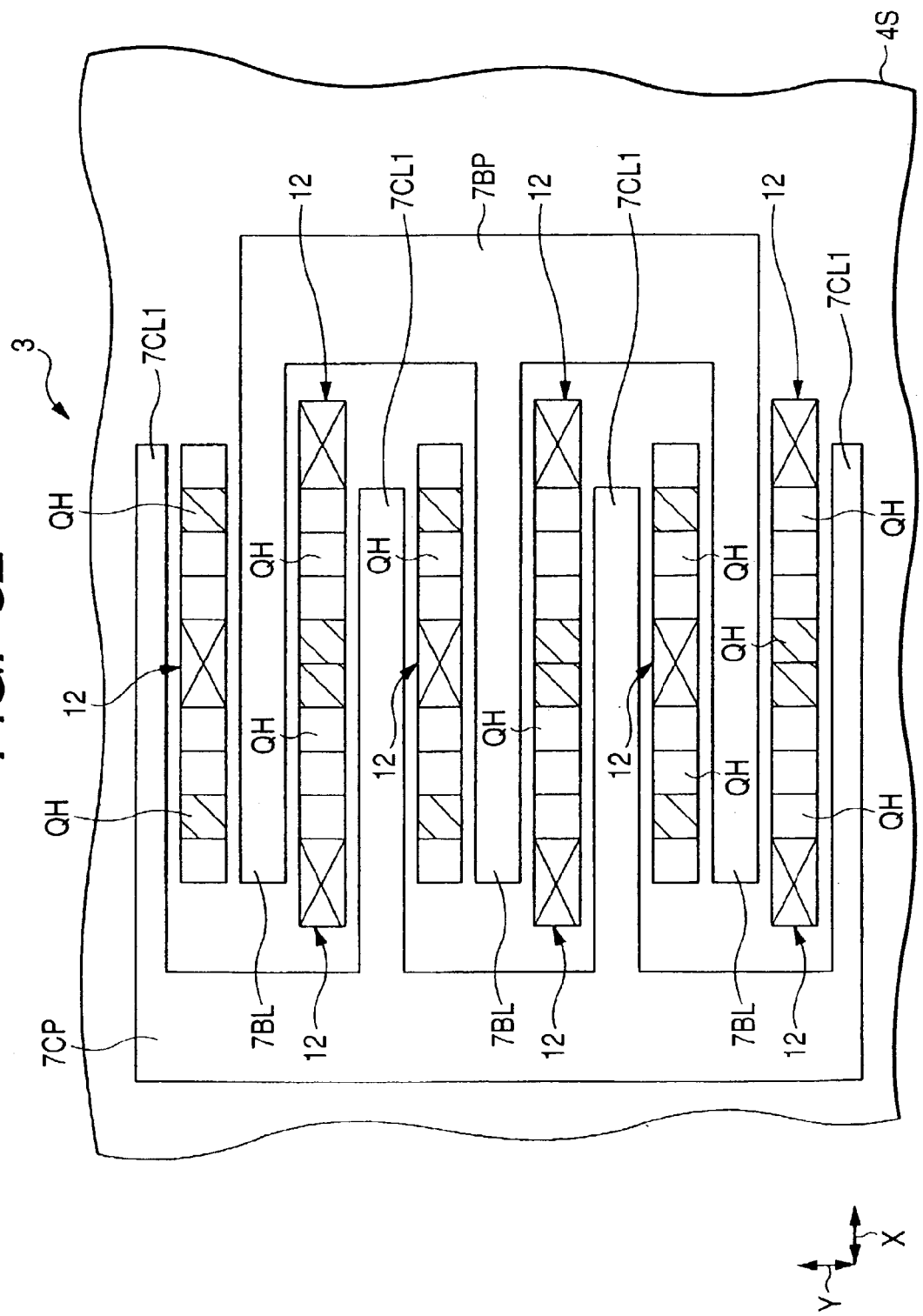
FIG. 32 is a plan view of a main part of an example of the main face of a semiconductor substrate of a semiconductor device as another embodiment of the invention.

FIG. 32 is a plan view of a main part of the main face of the substrate 4S of a semiconductor device of an eleventh embodiment. In a manner similar to the foregoing seventh to tenth embodiments, unit HBTs QH of the highest temperature in each unit HBT cell line are hatched. An emitter line on the main face side of the substrate 4S is not shown for convenient reference to the drawing.

A point different from FIG. 25 of the ninth embodiment is that, in a position adjacent to the unit HBT QH of the highest temperature of a unit HBT cell line, the via hole 12 of another unit HBT cell line neighboring the line is disposed. In other words, by making the position of the via holes 12 in unit HBT cell lines neighboring in the Y direction different from each other, the positions of the unit HBTs QH of the highest temperature of the unit cell lines neighboring in the Y direction are deviated from each other. In this example, the via hole 12 is disposed in the center of each of odd-numbered unit HBT cell lines in the unit HBT cell lines neighboring in the Y direction of FIG. 32. Specifically, in the odd-numbered unit HBT cell lines in the Y direction, the via hole 12 is formed in the position next to the unit HBT QH of the highest temperature in the center of each of the even-numbered unit HBT cell lines in the Y direction. With the arrangement, the temperature of the unit HBT QH of the highest temperature can be further decreased, so that heat resistance can be further decreased. The via holes 12 are provided at both ends in the X direction of the even-numbered unit HBT cell lines in the Y direction. The temperature of the even-numbered and neighboring odd-numbered unit HBTs QH of the highest temperature can be decreased. That is, since the via holes 12 having dissipating action are disposed so as to be dispersed in the areas where the unit HBTs QH are disposed, the unit HBTs QH of the highest temperature are also dispersed. Consequently, the performance of dissipating heat of the whole area in which the unit HBTs QH can be improved, so that the heat resistance as a whole can be further reduced.

The number of the unit HBTs QH in each of the unit, HBT cell lines is the same. The dimension in the X direction of the via hole 12 corresponds to the dimension in the X direction of, for example, two unit HBTs QH. In the layout, therefore, the overall length in the X direction including the via hole 12 of the odd-numbered unit HBT cell line in the Y direction is shorter than that in the X direction including the via hole 12 of the even-numbered unit HBT cell line. Therefore, in a free area created in the substrate 4S due to the fact that the odd-numbered unit HBT cell line is shorter than the even-numbered unit HBT cell line, any of the protection circuits 1, 1$c$, 1$d$, and 1$e$ similar to those in the first to sixth embodiments and the ninth and tenth embodiments.

By arranging the via holes 12 with regularity, ease of the layout of the unit HBT cell lines can be assured. Stability, predictability, and reproducibility of electric characteristics can be assured. Therefore, designing of the semiconductor device can be facilitated.

Twelfth Embodiment

Figure 33:
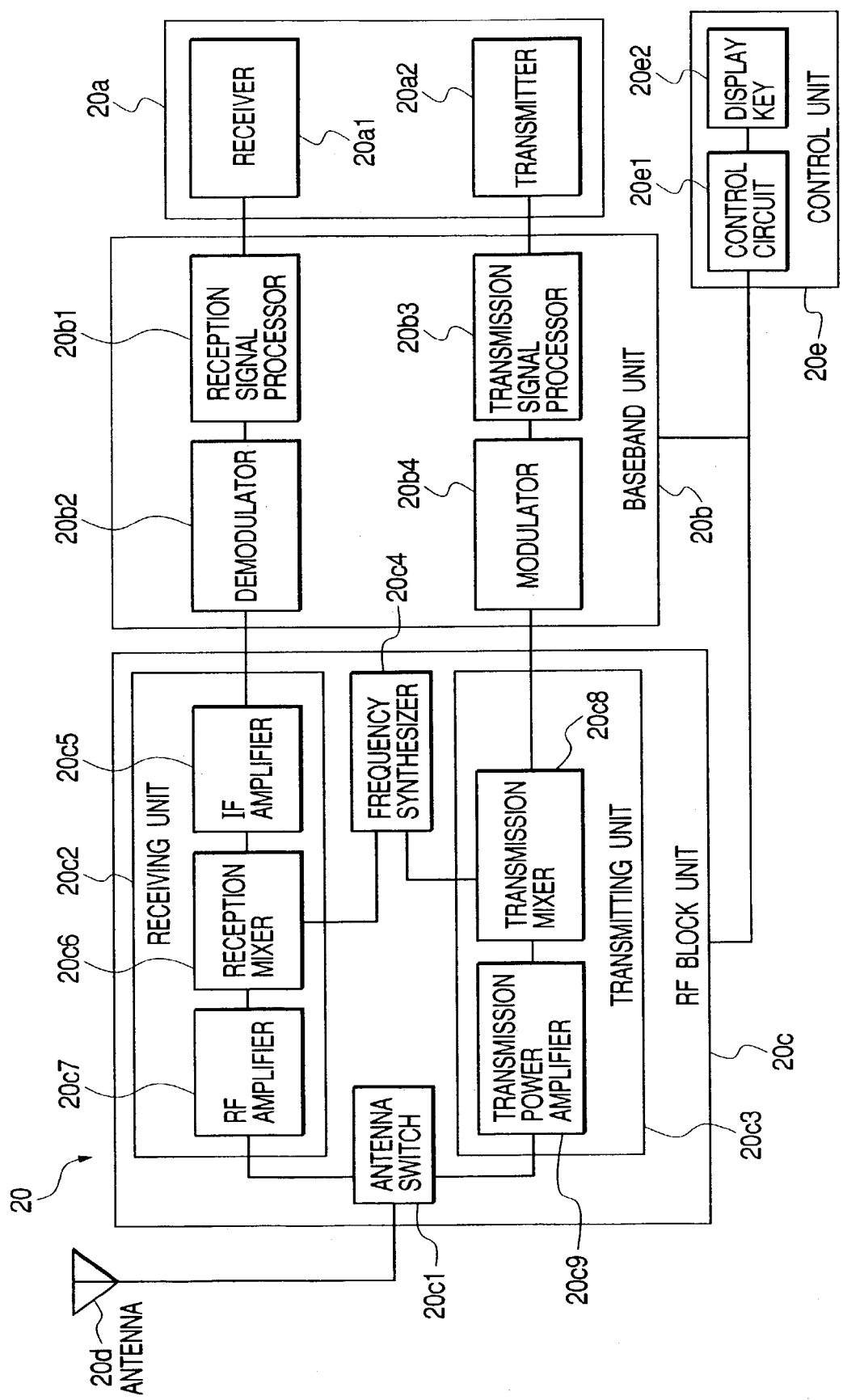
FIG. 33 is a diagram for explaining the configuration of a wireless communication device using the semiconductor device as another embodiment of the invention.

In a twelfth embodiment, a case of applying the technique to a portable telephone as a concrete example of a wireless communication device (mobile communication device) will be described. FIG. 33 shows the system configuration of a portable telephone 20 has a transmitter/receiver 20$a$, a baseband unit 20$b$, an RF block unit 20$c$, an antenna 20$d$, and a control unit 20$e$. The transmitter/receiver 20$a$ has a receiver 20$a$1 and a transmitter 20$a$2. The baseband unit 20$b$ has a reception signal processor 20$b$1 and a demodulator 20$b$2 sequentially connected to the receiver 20$a$1, and a transmission signal processor 20$b$3 and a modulator 20$b$4 sequentially connected to the transmitter 20$a$2. The RF block unit 20$c$ electrically connected to the baseband unit 20$b$ has an antenna switch 20$c$1, a receiving unit 20$c$2, a transmitting unit 20$c$3, and a frequency synthesizer 20$c$4. The receiving unit 20$c$2 has an IF amplifier 20$c$5, a reception mixer 20$c$6, and an RF amplifier 20$c$7. The transmitting unit 20$c$3 has a transmission mixer 20$c$8 and a transmission power amplifier (RF power amplification module) 20$c$9. The antenna switch 20$c$1 is electrically connected to the RF amplifier 20$c$7 of the receiving unit 20$c$2, the transmission power amplifier 20$c$9 of the transmitting unit 20$c$3, and the antenna 20$d$. The reception mixer 20$c$6 and transmission mixer 20$c$8 are electrically connected to the frequency synthesizer 20$c$4. The IF amplifier 20$c$5 is electrically connected to the demodulator 20$b$2. The transmission mixer 20$c$8 is electrically connected to the modulator 20$b$4. The transmission power amplifier 20$c$9 has, for example, a transmission frequency of about 0.8 to 2 GHz, a power supply voltage of about 2.7 to 4.2V, an output of about 35 dBm at the maximum, and an efficiency of about 50 to 60%. The control unit 20$e$ has a control circuit 20$e$1 and a display key 20$e$2. The control circuit 20$e$1 and the display key 20$e$2 are electrically connected to the baseband unit 20$b$ and the RF block 20$c$.

A transmission process is performed, for example, as follows. Voice (sound signal) uttered to the transmitter 20$a$2 is converted by the transmitter 20$a$2 to an electric signal. The electric signal is converted by the transmission signal processor 20$b$3 to a transmission signal which is further converted from an analog signal to a digital signal by the modulator 20$b$4. After that, the transmission signal converted to the digital signal is converted to a target frequency by the transmission mixer 20$c$8 of the transmitting unit 20$c$3 and the frequency synthesizer 20$c$4. The target frequency is amplified by the transmission power amplifier 20$c$9 as a main component of the twelfth embodiment. By switching of the antenna switch 20$c$1, the amplified frequency is transmitted as a radio wave from the antenna 20$d$. On the other hand, a reception process is performed, for example, as follows. A reception signal captured by the antenna 20$d$ is amplified by the RF amplifier 20$c$7 of the receiving unit 20$c$2 by the switching of the antenna switch 20$d$ and is converted to a target frequency by the reception mixer 20$c$6 and the frequency synthesizer 20$c$4. After that, the reception signal is amplified by the IF amplifier 20$c$5 and is converted from a digital signal to an analog signal by the demodulator 20$b$2 of the baseband unit 20$b$. The analog signal is processed by the reception signal processor 20$b$1 and the processed signal is converted to a sound signal by the receiver 20$a$1. In the portable telephone 20, the transmission power amplifier 20$c$9 has HBTs, thereby achieving high efficiency. Thus, the portable telephone 20 can be used for long time by a single charging.

Figure 34:
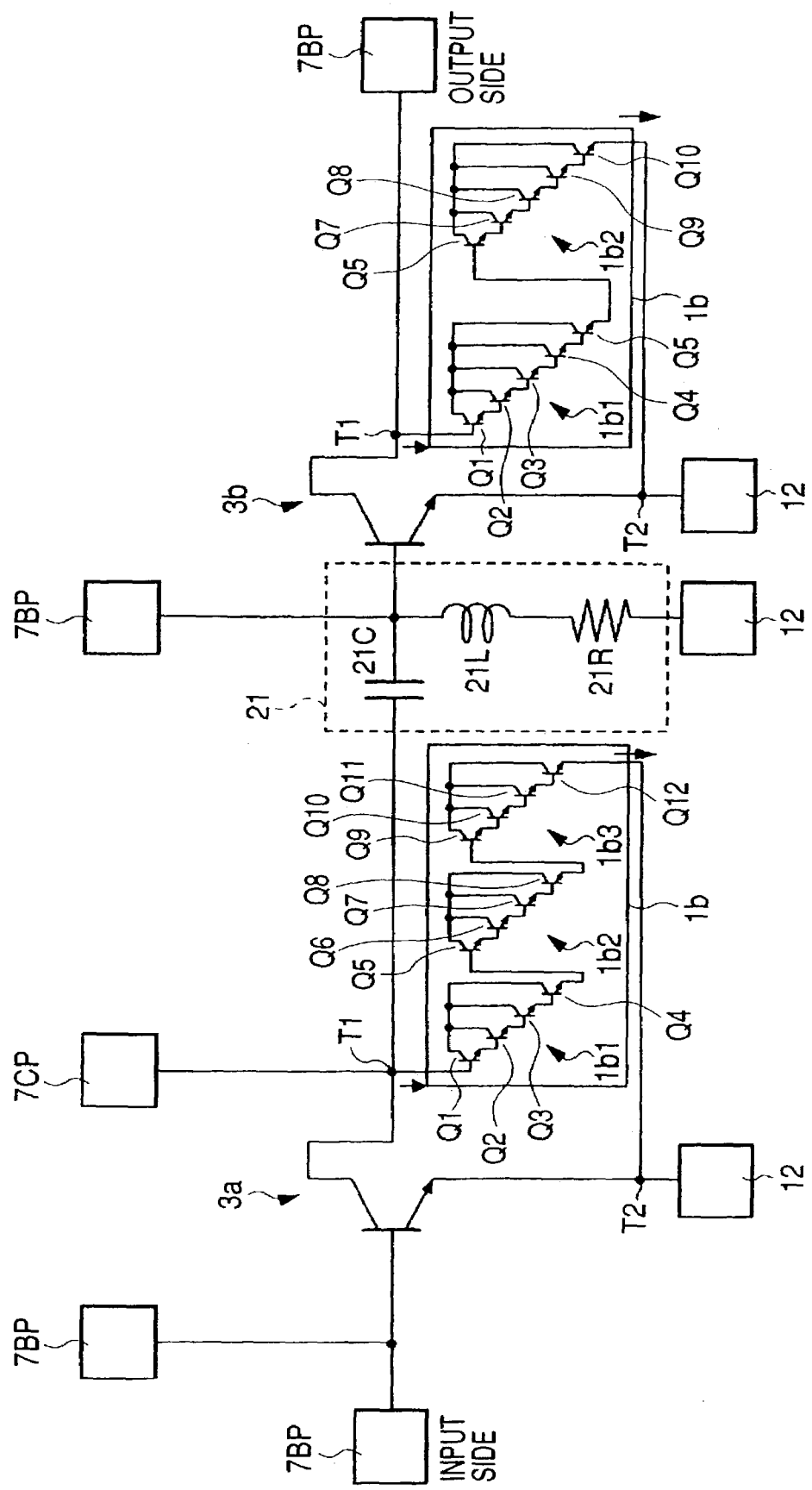
FIG. 34 is a circuit diagram showing an example of a circuit configuration of an amplifier in FIG. 33.

An amplification circuit with a protection circuit used in the transmission power amplifier 20$c$9 of the twelfth embodiment will now be described. FIG. 34 shows an example of an MMIC (Microwave Monolithic Integrated Circuit) as an amplification circuit with a protection circuit. The MMIC has two amplification circuits (semiconductor circuits) 3$a$ and 3$b$. Each of the amplification circuits 3$a$ and 3$b$ has a plurality of unit HBTs like the amplification circuit 3. The base pad 7BP on the left part of FIG. 34 is electrically connected to the base of the amplification circuit 3$a$ in the ante stage. An output, that is, the collector of the amplification circuit 3$a$ in the ante stage is electrically connected to the base of the amplification circuit 3$b$ in the post stage. An output, that is, collector of the amplification circuit 3$b$ in the post stage is electrically connected to the collector pad 7CP. An RF signal input to the base pad 7BP on the left side in FIG. 34 is amplified by the amplification circuits 3$a$ and 3$b$ in two stages and the amplified signal is transmitted to the collector pad 7CP on the right side in FIG. 34. To the collector pad 7CP, the amplified RF signal is output. The collector pad 7CP of the amplification circuit 3$b$ in the post stage is electrically connected to the antenna 20$d$ via the antenna switch 20$c$1 (refer to FIG. 33). Between the amplification circuits 3$a$ and 3$b$, a matching circuit 21 is electrically connected. The matching circuit 21 has a capacitor 21C, an inductance 21L, and a resistor 21R. By connecting the matching circuit 21, the amplifying function can be performed efficiently.

Between the collector and emitter of the amplification circuit 3$a$ in the ante stage, the protection circuit 1$b$ described in the second and third embodiments is connected in parallel. The protection circuit 1$b$ is, for example, divided into three blocks of the protection circuits 1$b$1, 1$b$2, and 1$b$3 each including four bipolar transistors and has total 12 bipolar transistors Q1 to Q12. The terminal T1 as an input of the protection circuit 1$b$ is electrically connected to the collector (collector pad 7CP) of the amplification circuit 3$a$, and the terminal T2 as an output of the protection circuit 1$b$ is electrically connected to the emitter (via hole 12) of the amplification circuit 3$a$. By the protection circuit 1$b$, when a positive overvoltage is applied to the collector pad 7CP of the protection circuit 3$a$ in the ante stage, deterioration and destruction of the unit HBT in the amplification circuit 3a in the ante stage can be avoided.

On the other hand, the protection circuit 1b described in the second and third embodiments is also connected in parallel between the collector and emitter of the amplification circuit 3b in the post stage. The protection circuit 1b is, for example, divided into two blocks of the protection circuits 1b1 and 1b2 each including five bipolar transistors and, therefore, has total ten bipolar transistors Q1 to Q10. The terminal T1 as an input of the protection circuit 1b is electrically connected to the collector (collector pad 7CP) of the amplification circuit 3b, and the terminal T2 as an output of the protection circuit 1b is electrically connected to the emitter (via hole 12) of the amplification circuit 3b. By the protection circuit 1b, when a positive overvoltage is applied to the collector pad 7CP of the protection circuit 3b in the post stage, deterioration and destruction of the unit HBT in the amplification circuit 3b in the post stage can be avoided. Particularly, the amplification circuit 3b is an amplification circuit closest to the antenna 20d (the electricity path length is short), it is preferable to electrically connect the protection circuit 1b as described above. When the user touches the antenna of the portable telephone, the load impedance matching conditions of the portable telephone fluctuate, so that standing waves occur, an overvoltage is applied to the output of the transmission power amplifier 20c9 (an output (collector) of the amplification circuit 3a closet to the antenna), and there is a case that the HBTs constructing the transmission power amplifier 20c9 deteriorates or is destroyed. In contrast, in the twelfth embodiment, even when an overvoltage is applied to the output of the transmission power amplifier 2c9, a voltage applied to the output of the transmission power amplifier 20c9 (between the collector and emitter of the amplification circuits 3a and 3b) can be decreased to be smaller than the allowable voltage value by the protection circuit 1b. Thus, deterioration or destruction of the HBTs in the transmission power amplifier 20c9 (particularly, the amplification circuit 3b in the post stage) can be avoided. There is a case such that when an assembly worker touches a portable telephone being assembled by mistake during assembling operation of the portable telephone, an overvoltage is applied to the output of the transmission power amplifier 20c9 and the HBTs constructing the transmission power amplifier 20c9 deteriorate or are destroyed. By a similar operation, the deterioration or destruction of the HBTs in the transmission power amplifier 20c9 (amplification circuits 3a and 3b) can be avoided. Although the transmission power amplifier 20c9 having the configuration of the amplification circuits in two stages has been described, the invention is not limited to the configuration. Between the amplification circuits in the front and rear stage, one or a plurality of amplification circuits in intermediate stage(s) may be electrically connected. In this case as well, any of the protection circuits 1a, 1b, 1c, 1d, and 1e is connected to the amplification circuit in the intermediate stage in a manner similar to the first to sixth embodiments and ninth to eleventh embodiments. With the configuration, destruction and deterioration in the HBTs constructing the amplification circuit in the intermediate stage due to the overvoltage can be avoided.

Figure 35:
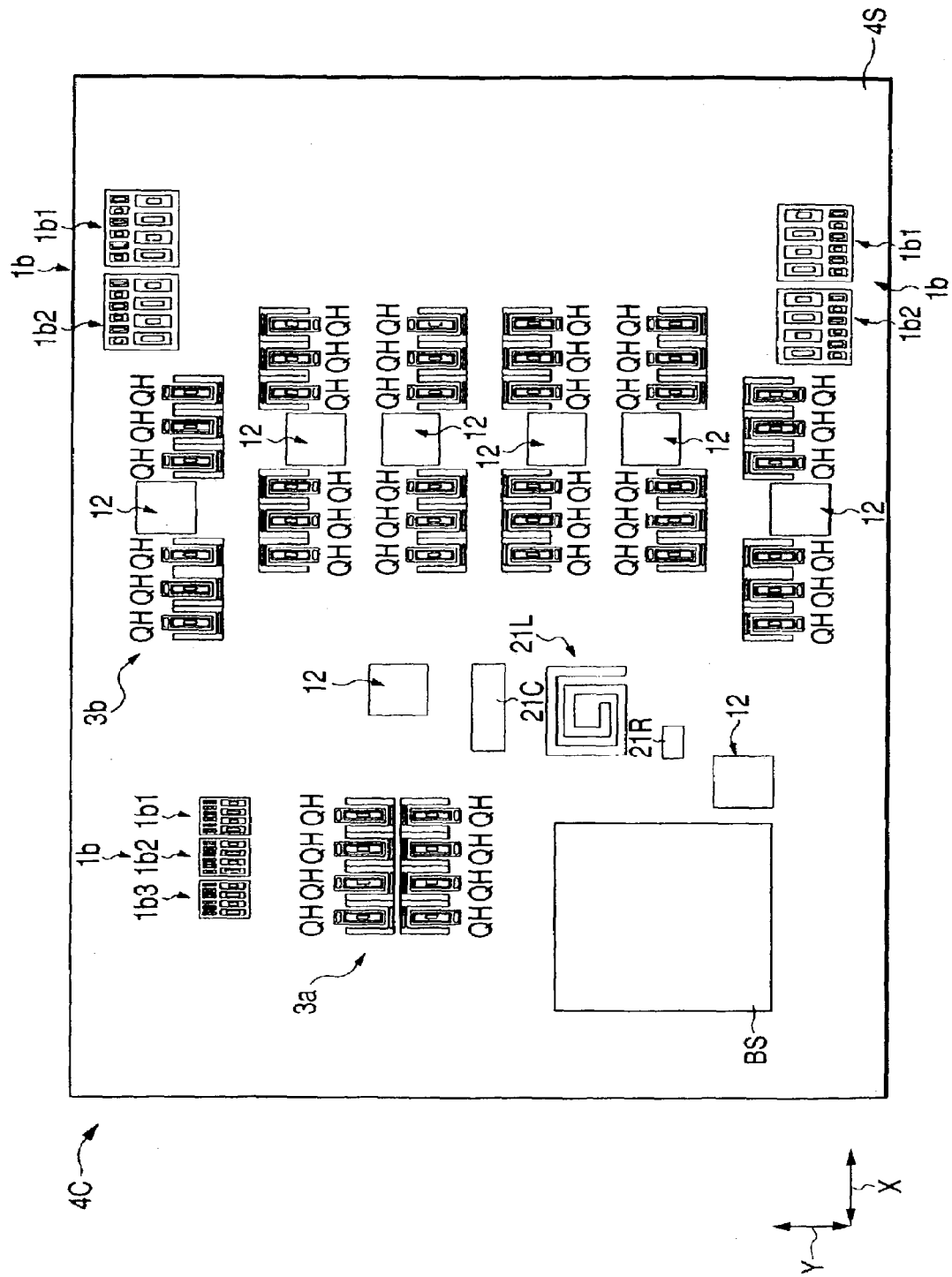
FIG. 35 is a plan view of a semiconductor substrate showing an example of the layout of a device constructing the amplifier of FIG. 34.
Figure 36:
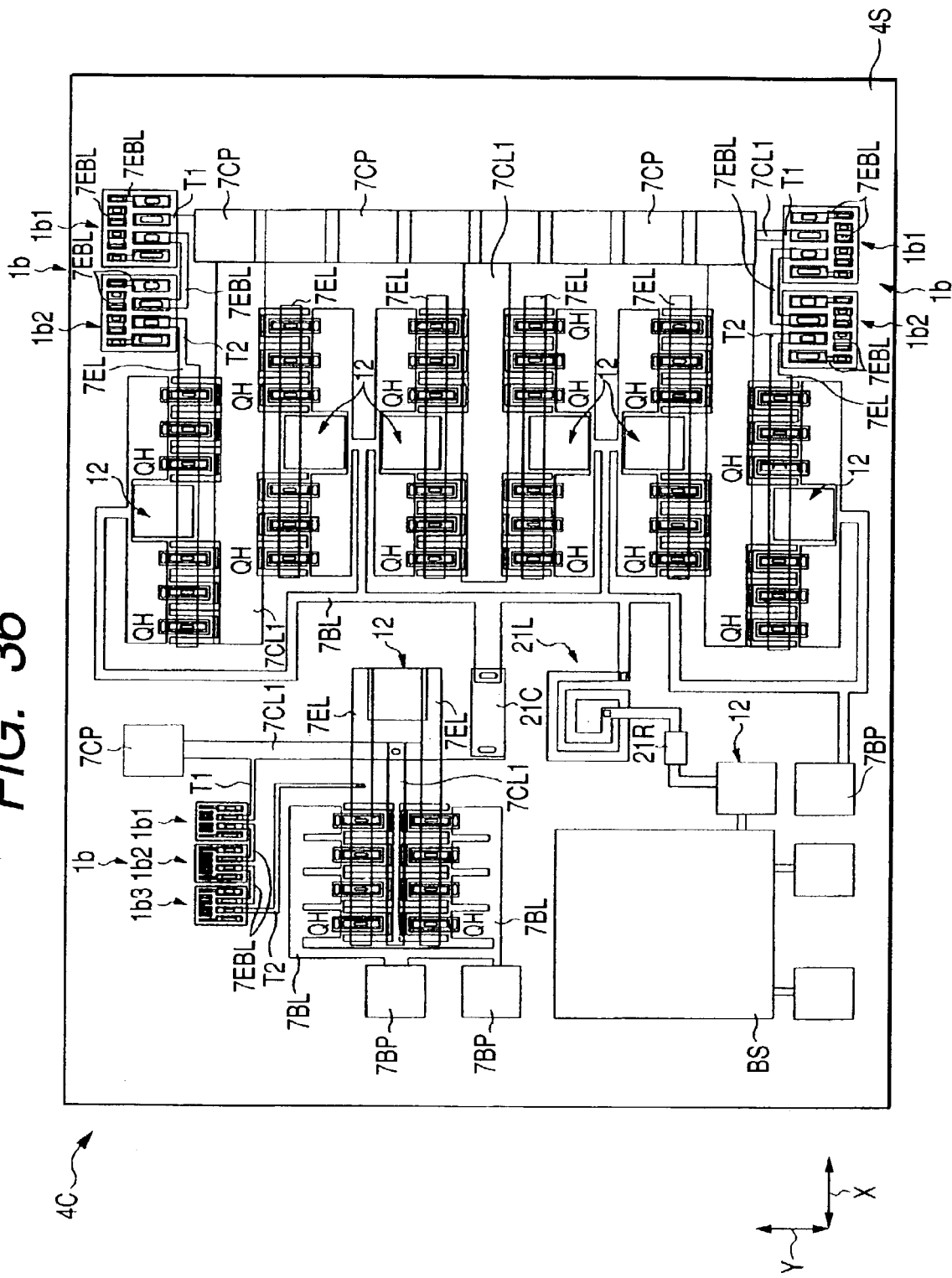
FIG. 36 is a plan view of the semiconductor substrate, in which an example of the layout of wiring of the amplifier of FIG. 34 is superimposed on FIG. 35.

FIG. 35 is a plan view of the main face of the substrate 4S showing an example of the device layout of the circuit of FIG. 34. FIG. 36 is a plan view of the main face of the substrate 4S in which an example of a wiring layout,for constructing the circuit of FIG. 34 is superimposed on FIG. 35.

The amplification circuit 3a in the first stage (in an upper portion of the left half of FIGS. 35 and 26) is constructed by connecting, for example, eight unit HBTs QH in parallel via lines (base line 7BL, collector line 7CL1 and emitter line 7EL on the amplification circuit 3a side). The protection circuit 1b for the amplification circuit 3a in the first stage is disposed on the upper side of the amplification circuit 3a of FIGS. 35 and 36 and is relatively close to the collector pad 7CP. The terminal T1 of the protection circuit 1b is electrically connected to the collector electrode of the group of unit HBTs QH in the first stage vi the collector line 7CL1. The terminal T2 is electrically connected to the emitter electrode of the group of unit HBTs QH of the amplification circuit 3a in the first stage via the emitter line 7EL. The area of the plurality of bipolar transistors constructing the protection circuit 1b for the amplification circuit 3a in the first stage (particularly, the area of the largest base electrode and emitter electrode) can be made smaller than the area of the bipolar transistors constructing the protection circuit 1b for the amplification circuit 3b in the post stage (particularly, the area of the largest base electrode and emitter electrode). This is because an influence of the overvoltage on the amplification circuit 3a in the front stage at the time of load impedance fluctuations is smaller than that on the amplification circuit 3b in the post stage or hardly exists. Since the protection circuit 1b for the amplification circuit 3a in the first stage effectively functions to protect the amplification circuit 3a in the first stage from a surge voltage from the outside, although the area of the protection circuit 1b for the amplification circuit 3a in the first stage is smaller than that of the protection circuit 1b for the amplification circuit 3b in the latter stage, it is preferable to add the protection circuit 1b for the amplification circuit 3a. With the configuration, the yield and reliability of the semiconductor device can be improved. The detailed configuration of the amplification circuit 3a and the HBT in the protection circuit 1b are the same as that in the third embodiment, so that its description will not be repeated.

The amplification circuit 3b (in the right half of each of FIGS. 35 and 26) is constructed, for example, by connecting 36 unit HBTs QH in parallel via lines (base line 7BL, collector line 7CL1, and emitter line 7EL on the amplification circuit 3b side). The area of the unit HBTs QH of the amplification circuit 3b in the latter stage (area of the emitter electrode, base electrode, and collector electrode) is equal to that of the unit HBTs QH of the amplification circuit 3a in the first stage (the area of the emitter electrode, base electrode, and collector electrode). As the arrangement of the unit HBTs, the device layout described in the ninth embodiment is illustrated. Specifically, the via hole 12 is disposed in the center of each of the plurality of unit HBT cell lines which are neighboring in the Y direction of FIGS. 35 and 36. The plurality of unit HBT cell lines are disposed so that the center position of upper and lower to unit HBT cell lines in FIGS. 35 and 36 is displaced to the left side in FIGS. 35 and 36 from the center position of a plurality of unit HBT cell lines in the intermediate portion. In a free area formed in the main surface of the substrate 4S by the deviation between the upper and lower two unit HBT cell lines of FIGS. 35 and 36, the protection circuit 1b for the amplification circuit 3b in the post stage is disposed. Thus, the protection circuit 1b can be disposed without increasing the chip size. By disposing the protection circuit 1b near each of the upper and lower corners on the right side of the chip 4C of FIGS. 35 and 36, without disturbing the other device layout, the protection circuit 1b can be disposed well. In the twelfth embodiment, the protection circuits 1b of the amplification circuit 3b are disposed in the upper and lower parts of each of FIGS. 35 and 36, and the two protection circuits 1b are connected in parallel between the collector and emitter of the amplification circuit 3b. With the configuration, the allowable current amount which can be made to pass to the protection circuit 1b for the amplification circuit 3b in the first stage can be increased. Thus, the protection ability of the protection circuit 1b can be improved. The protection circuit 1b for the amplification circuit 3a in the first stage is also disposed close to the collector pad 7CP. With the arrangement, parasitic resistance, parasitic capacitance, and the like can be decreased. Thus, the amount of current flowing in the protection circuit 1b can be increased. Further, the protection circuits 1b for the amplification circuit 3b in the latter stage are disposed so as to be symmetrical with respect to the X axis of FIGS. 35 and 36. In a circuit handling an RF signal, there is a case such that when a phase shift occurs, it becomes invalid to combine powers. By disposing the two protection circuits 1b symmetrically, a phase shift can be prevented and the operation reliability of the semiconductor device can be improved. The area of the collector pad 7CP of the amplification circuit 3b in the latter stage is larger than that of the collector pad 7CP of the amplification circuit 3a in the first stage. To the collector pad 7CP of the amplification circuit 3a in the latter stage, a plurality of, for example, five or more bonding wires are connected. The arrangement can deal with a heavy current. The detailed configuration of the amplification circuit 3b and the HBTs of the protection circuit 1b is the same as that described in the third embodiment, so that its description will not be repeated. Each of the capacitor 21C and the resistor 21R of a chip type is used. An electrode in each of the capacitor 21C and the resistor 21R is connected to a line via a conductive bonding member such as solder. Reference characters BS in the lower left side in FIGS. 35 and 36 denote a bias circuit.

Although the invention achieved by the inventors herein has been concretely described above, obviously, the invention is not limited to the foregoing embodiments but can be variously changed without departing from the gist.

For example, also in the case of the protection circuits of the first and second embodiments, the collector region (sub collector layer and collector layer) of each of the plurality of bipolar transistors which are Darlington connected may be commonly used. With the structure, the occupation area of the protection circuit can be reduced.

The technique can be also applied to power amplifiers which require thermal resistance designing such as an MIS FET (Metal Insulator Semiconductor Field Effect Transistor) formed on a silicon substrate, a bipolar transistor formed on a silicon substrate, a silicon germanium (SiGe)-HBT, SiGe strain-MIS FET, and the like.

Although the case of applying the invention achieved by the inventors herein mainly to a semiconductor device for use in an amplification circuit in a communication circuit part of a vehicle telephone, a portable telephone, or the like in the field of utilization as the background of the invention has been described above, the invention is not limited to the case but can be also applied to, for example, a semiconductor device for use in an amplification circuit of a communication circuit part in a wireless personal computer, a wireless LAN (Local Area Network), or the like.

Effects obtained by representative inventions out of the inventions disclosed by the application will be briefly described as follows.

By connecting a plurality of transistors which are Darlington connected to an output terminal of a semiconductor circuit, resistance to destruction of a semiconductor device can be improved.

By disposing the center position of a transistor cell line as a part of a plurality of transistor cell lines so as to be deviated from the center position of another transistor cell line in the plurality of transistor cell lines, heat resistance of a semiconductor device can be reduced.

What is claimed is:

1. A semiconductor device, wherein a device having a plurality of bipolar transistors which are Darlington connected is connected in parallel between output terminals of a semiconductor circuit, wherein said semiconductor circuit is an amplification circuit, and wherein an area of a bipolar transistor in a final stage in said plurality of bipolar transistors which are Darlington connected is larger than that of a bipolar transistor in a stage before the final stage.

2. The semiconductor device according to claim 1, wherein the device having said plurality of bipolar transistors which are Darlington connected is a protection device.

3. The semiconductor device according to claim 1, wherein the number of said bipolar transistors which are Darlington connected is set according to a breakdown voltage between the output terminals of said semiconductor circuit.

4. The semiconductor device according to claim 1, wherein the number of said bipolar transistors which are Darlington connected is set so that no breakdown occurs between a collector and an emitter of a bipolar transistor in the final stage in said plurality of bipolar transistors.

5. The semiconductor device according to claim 1, wherein said plurality of bipolar transistors which are Darlington connected are divided into a plurality of blocks and the plurality of blocks are connected in series.

6. The semiconductor device according to claim 1, wherein a collector region of said plurality of bipolar transistors which are Darlington connected is shared.

7. The semiconductor device according to claim 1, wherein a base and a collector of the bipolar transistor in a first stage of said plurality of bipolar transistors which are Darlington connected are open in a normal state.

8. The semiconductor device according to claim 1, wherein a base and a collector of the bipolar transistor in a first stage of said plurality of bipolar transistors which are Darlington connected are short-circuited.

9. The semiconductor device according to claim 1, wherein a distance between a base of the bipolar transistor in a first stage of said plurality of bipolar transistors which are Darlington connected and an emitter of the bipolar transistor in the final stage is shorter than a distance between the base of said bipolar transistor in the first stage and an emitter of the bipolar transistor in a stage before the final stage.

10. The semiconductor device according to claim 1, wherein a base of the bipolar transistor in a first stage in said plurality of bipolar transistors which are Darlington connected and an emitter of the bipolar transistor in the final stage are adjacent to each other in a state where long sides thereof face each other.

11. The semiconductor device according to claim 1, wherein the device having said plurality of bipolar transistors which are Darlington connected is either a device connected in a forward direction or a device connected in a reverse direction.

12. The semiconductor device according to claim 1, including a plurality of said devices each having a respective said plurality of bipolar transistors which are Darlington connected, wherein one of said devices is connected in a forward direction and another of said devices is connected in a reverse direction.

13. The semiconductor device according to claim 12, wherein the number of bipolar transistors of said device connected in the reverse direction is smaller than the number of bipolar transistors of said device connected in the forward direction.

14. The semiconductor device according to claim 1, wherein said semiconductor circuit is an amplification circuit having a heterojunction bipolar transistor.

15. The semiconductor device according to claim 1, wherein said semiconductor circuit and said device having the plurality of bipolar transistors which are Darlington connected are provided on the same compound semiconductor substrate.

16. The semiconductor device according to claim 1, and which is employed in a mobile communication device.

17. The semiconductor device according to claim 1, wherein the bipolar transistors include hetero-junction bipolar transistors.

18. The semiconductor device according to claim 17, wherein the bipolar transistors are formed over a GaAs substrate.

* * * * *